United States Patent [19]
Yamashita et al.

[11] Patent Number: 5,554,871
[45] Date of Patent: Sep. 10, 1996

[54] SEMICONDUCTOR DEVICE HAVING MOS TRANSISTOR WITH NITROGEN DOPING

[75] Inventors: Tomohiro Yamashita; Satoshi Shimizu, both of Hyogo, Japan

[73] Assignee: Mitsubishi Denki Kabushiki Kaisha, Tokyo, Japan

[21] Appl. No.: 483,036

[22] Filed: Jun. 7, 1995

[30] Foreign Application Priority Data

Nov. 9, 1994 [JP] Japan .................................. 6-275095

[51] Int. Cl.$^6$ .................................................. H01L 27/088
[52] U.S. Cl. .......................... 257/336; 257/344; 257/408; 257/410; 257/411; 257/900
[58] Field of Search ..................... 257/408, 900, 257/336, 344, 410, 411

[56] References Cited

U.S. PATENT DOCUMENTS 5,369,297  11/1994  Kusunoki et al. .................. 257/408 X

FOREIGN PATENT DOCUMENTS

| | | |
|---|---|---|
| 2-197135 | 8/1990 | Japan . |
| 2-270335 | 11/1990 | Japan . |
| 3-44077 | 2/1991 | Japan . |
| 3-87060 | 4/1991 | Japan . |
| 4-74440 | 3/1992 | Japan . |
| 5-190451 | 7/1993 | Japan . |
| 6037106 | 2/1994 | Japan . |
| 6077474 | 3/1994 | Japan . |

OTHER PUBLICATIONS

"Novel NICE (Nitrogen Implantation into CMOS Gate Electrode and Source–Drain) . . . ", Kuroi et al, 1993 IEEE, pp. 325–328.

Primary Examiner—William Mintel
Attorney, Agent, or Firm—Lowe, Price, LeBlanc & Becker

[57] ABSTRACT

An MOS transistor capable of improving hot carrier resistance and a method of manufacturing thereof are provided. In the MOS transistor, nitrogen is introduced in a sidewall oxide film, so that a concentration distribution of nitrogen in a section perpendicular to the main surface of a semiconductor substrate in the sidewall oxide film has a peak at the interface between the semiconductor substrate and the sidewall oxide film. As a result, an interface state at the interface between the sidewall oxide film and the main surface of the semiconductor substrate is suppressed, resulting in decrease of the probability at which hot carriers are trapped in the interface state. Accordingly, the hot carrier resistance is improved.

14 Claims, 32 Drawing Sheets

SEMICONDUCTOR DEVICE HAVING MOS TRANSISTOR WITH NITROGEN DOPING

BACKGROUND OF THE INVENTION

1. Field of the Invention

The present invention relates to semiconductor devices and a method of manufacturing the same, and more particularly, to a semiconductor device having an MOS transistor and a method of manufacturing the same.

2. Description of the Background Art

As an N channel type MOS transistor mounted on a semiconductor device, such a structure as shown in FIG. 67 is conventionally known. Referring to FIG. 67, in this conventional semiconductor device, on the main surface of a semiconductor substrate 1 formed of a P type silicon substrate, formed is an element isolation oxide film 2 so as to surround an N channel type MOS transistor forming region. Element isolation oxide film 2 is for electrically insulating the N channel type MOS transistor forming region from an element formed adjacent thereto. A channel stopper region 3 formed of a $P^+$ type impurity region is provided under element isolation oxide film 2. A pair of source/drain regions 4 and 5 are formed on the main surface of the N channel type MOS transistor forming region so as to sandwich a channel region 6. A gate electrode 8 is formed on channel region 6 with a gate insulating film 7 interposed therebetween. The pair of source/drain regions 4 and 5 and gate electrode 8 configure an N channel type MOS transistor.

Such a conventional N channel type MOS transistor as structured above has suffered from the following problems as miniaturization progresses. More specifically, when the N channel type MOS transistor is rendered non-conductive, hot carriers are generated by the high electric field occurring at an end portion of one source/drain region (hereinafter uniquely defined as drain region 4, with the other source/drain region uniquely defined as source region 5) functioning as a drain of the pair of source/drain regions 4 and 5 in contact with channel region 6. The generated hot carriers are implanted into gate insulating film 7. The hot carriers implanted and caught in gate insulating film 7 cause degradation in accordance with time of transistor characteristics such as change in the threshold voltage of the transistor, reduction of drain current, or the like, that is, so-called hot carrier degradation. Now, detailed description of the hot carrier degradation will be given. The hot carrier degradation is a phenomenon that a channel hot electron (CHE) implantation or drain avalanche hot carrier (DAHC) implantation causes degradation of transistor characteristics such as change in the threshold voltage and reduction of drain current. The channel hot electron implantation is a phenomenon that electrons in channel region 6 get hot with energy from the electric field in the direction along the channel, and that hot electrons which are finally supplied with energy larger than the height of an energy barrier of the interface between the semiconductor substrate and gate insulating film 7 are implanted into gate insulating film 7 over the energy barrier. This phenomenon is called channel hot electron implantation.

The drain avalanche hot carrier implantation is a phenomenon that electrons in channel region 6 supplied with high energy due to the large electric field in the vicinity of drain region 4 generate electron-hole pairs by ionization impact with photons or an avalanche phenomenon. These electrons or holes, or both, get hot and are implanted into gate insulating film 7. This phenomenon is called drain avalanche hot carrier implantation.

Such channel hot electron implantation or drain avalanche hot carrier implantation causes electrons or holes to be caught in the interface between semiconductor substrate 1 in the vicinity of drain region 4 and gate insulating film 7, and to be trapped in the interface state in gate insulating film 7 in the vicinity of the interface. The channel hot electron implantation or drain avalanche hot carrier implantation causes electrons or holes to generate the interface state. As a result of electrons and holes being trapped in the interface state, or generation of the interface state, degradation of transistor characteristics such as change in the threshold voltage and reduction of drain current is observed. This phenomenon is called hot carrier degradation.

As one method of alleviating such problems as described above, an MOS transistor having a so-called LDD (Lightly Doped Drain) structure shown in FIG. 68 is known. Referring to FIG. 68, in the MOS transistor having the LDD structure, the source/drain regions are configured of low impurity concentration diffusion regions 4a and 5a in contact with channel region 6 at their end portions, and high impurity concentration diffusion regions 4b and 5b positioned outside of channel region 6 and integrally formed with low impurity concentration diffusion regions 4a and 5a. A sidewall oxide film 9 is further formed so as to be in contact with the side surface of gate electrode 8, the side surface of gate insulating film 7 and the main surface of semiconductor substrate 1. The pair of source/drain regions 4 and 5, gate electrode 8, and sidewall oxide film 9 configure the N channel type MOS transistor.

Such an N channel type MOS transistor structured as described above is manufactured as follows. First, gate insulating film 7 and gate electrode 8 are formed on the main surface of semiconductor substrate 1. With gate electrode 8 used as part of a mask, N type impurities are implanted into the main surface of semiconductor substrate 1 to form a pair of low impurity concentration diffusion regions 4a and 5a.

Then, an oxide film (not shown) is formed on the main surface of gate electrode 8 and the pair of low impurity concentration diffusion regions 4a and 5a with a CVD method. After that, the oxide film is anisotropically etched. As a result, sidewall oxide film 9 is formed in contact with the side surface of gate electrode 8, the side surface of gate insulating film 7, and the pair of low impurity concentration diffusion regions 4a and 5a. With gate electrode 8 and sidewall oxide film 9 used as part of a mask, N type impurities are implanted into the main surface of semiconductor substrate 1 to form high impurity concentration diffusion regions 4b and 5b. As described above, sidewall oxide film 9 functions as a mask for forming high impurity concentration diffusion regions 4b and 5b of the pair of source/drain regions 4 and 5 in a self-alignment manner.

Since the end portion of drain region 4 in contact with channel region 6 is low impurity concentration diffusion region 4a in such an N channel type MOS transistor structured as described above, the electric field of the end portion of drain region 4a is alleviated. As a result, implantation of hot carriers into gate insulating film 7 is advantageously suppressed, so that the reliability is increased.

As miniaturization further progresses, however, hot carriers are implanted into sidewall oxide film 9 provided in order to form the LDD structure. The hot carriers caught in sidewall oxide film 9 inconveniently cause the interface state to be generated at the interface between sidewall oxide film 9 and semiconductor substrate 1. This results in reduction of the mobility, which in turn decreases drain current.

SUMMARY OF THE INVENTION

One object of the present invention is to provide a semiconductor device having improved hot carrier resistance.

Another object of the present invention is to provide a semiconductor device capable of suppressing generation of an interface state at the interface between a sidewall oxide film and a semiconductor substrate even when miniaturized.

Still another object of the present invention is to provide a semiconductor device capable of decreasing the probability at which hot carriers are trapped in the interface state.

A further object of the present invention is to provide a method of manufacturing a semiconductor device with which a semiconductor device having improved hot carrier resistance is readily manufactured.

An MOS transistor according to one aspect of the present invention includes a pair of source/drain regions, a gate electrode, and a sidewall oxide film. The source/drain regions are formed on the main surface of a semiconductor substrate so as to sandwich a channel region. The gate electrode is formed on the main surface of the semiconductor substrate positioned between the pair of source/drain regions with a gate insulating film interposed therebetween. The sidewall oxide film is formed in contact with the side surface of the gate electrode, the side surface of the gate insulating film, and the main surface of the semiconductor substrate, with nitrogen introduced therein. The nitrogen concentration distribution in a section of the sidewall oxide film in the direction perpendicular to the main surface of the semiconductor substrate has a first peak at the interface between the main surface of the semiconductor substrate and the sidewall oxide film. As a result, even when the MOS transistor is miniaturized, the nitrogen introduced in the sidewall oxide film suppresses an interface state at the interface between the sidewall oxide film and the semiconductor substrate. This results in decrease of the probability at which generated hot carriers are trapped in the interface state.

An MOS transistor according to another aspect of the present invention includes a pair of source/drain regions, a gate electrode, and a sidewall. The sidewall includes an oxide film and a polysilicon film. The oxide film is formed with its longitudinal section approximately shaped in an L letter, and has a perpendicular portion in contact with the side surface of the gate electrode and the side surface of a gate insulating film, and a bottom portion in contact with the main surface of a semiconductor substrate. The polysilicon film is formed in contact with the perpendicular portion and the bottom portion of the oxide film, with nitrogen introduced therein. As a result, even when the MOS transistor is miniaturized, generation of an interface state at the interface between the sidewall and the semiconductor substrate is suppressed by nitrogen introduced in the polysilicon film. This results in decrease of the probability at which hot carriers are trapped in the interface state.

An MOS transistor according to still another aspect of the present invention includes a pair of source/drain regions, a gate electrode, and a sidewall oxide film. Nitrogen is introduced in the gate electrode. The sidewall oxide film is formed in contact with the side surface of the gate electrode, the side surface of a gate insulating film, and the main surface of a semiconductor substrate, with nitrogen introduced therein. As a result, nitrogen introduced in the gate electrode suppresses diffusion of impurities introduced in the gate electrode in order to reduce resistance. Further, nitrogen introduced in the sidewall suppresses an interface state at the interface between the sidewall and the semiconductor substrate even when the MOS transistor is miniaturized, resulting in decrease of the probability at which hot carriers are trapped in the interface state.

A semiconductor device according to a further aspect of the present invention includes an N channel type MOS transistor and a P channel type MOS transistor. The N channel type MOS transistor includes a pair of first source/drain regions, a first gate electrode, and a first sidewall oxide film. Nitrogen is introduced in the first sidewall oxide film. The P channel type MOS transistor includes a pair of second source/drain regions, a second gate electrode, and a second sidewall oxide film. Nitrogen is introduced in the second sidewall oxide film. Nitrogen introduced in the first and second sidewall oxide films suppresses an interface state at the interface between the sidewall oxide films and a semiconductor substrate. As a result, the probability at which hot carriers are trapped in the interface state is decreased. If the above semiconductor device is applied to a structure in which a metal silicide layer is formed on the first and second gate electrodes and the first and second source/drain regions, growth of the metal silicide layer in the lateral direction towards the first and second sidewall oxide films is suppressed by nitrogen introduced in the first and second sidewall oxide films. As a result, the gate electrodes and the source/drain regions are prevented from being short-circuited by the metal silicide layer.

In a method of manufacturing an MOS transistor according to a further aspect of the present invention, a gate insulating film and a gate electrode are formed on the main surface of a semiconductor substrate. An oxide film is formed on the surface of the gate electrode and the exposed surface of the semiconductor substrate with a CVD method. Nitrogen ions are implanted into the oxide film through the surface thereof. By etching the oxide film into which nitrogen is implanted, a sidewall oxide film is formed in contact with the side surface of the gate electrode, the side surface of the gate insulating film, and the main surface of the semiconductor substrate. As a result, the sidewall oxide film in which nitrogen is introduced is easily formed.

In a method of manufacturing an MOS transistor according to a further aspect of the present invention, a gate insulating film and a gate electrode are formed on the main surface of a semiconductor substrate. An oxide film is formed on the surface of the gate electrode and the exposed surface of the semiconductor substrate with a CVD method. A polysilicon layer is formed on the surface of the oxide film. Nitrogen ions are implanted through the surface of the polysilicon layer. Nitrogen implanted into the polysilicon layer is diffused into the oxide film. By etching the oxide film into which nitrogen is implanted after removing the polysilicon layer, a sidewall oxide film is formed in contact with the side surface of the gate electrode, the side surface of the gate insulating film, and the main surface of the semiconductor substrate. As a result, the sidewall oxide film in which nitrogen is introduced is easily formed.

In a method of manufacturing an MOS transistor according to a further aspect of the present invention, a gate insulating film and a gate electrode are formed on the main surface of a semiconductor substrate. Then, an oxide film is formed on the surface of the gate electrode and the exposed surface of the semiconductor substrate with a CVD method. A polysilicon layer is formed on the surface of the oxide film. Nitrogen ions are implanted into the polysilicon layer through the surface thereof. By etching the polysilicon layer into which nitrogen ions are implanted and the oxide film, a sidewall is formed which includes an oxide film having an approximately L-letter shaped longitudinal section, and a polysilicon layer in contact with a perpendicular portion and a bottom portion of the oxide film and having nitrogen introduced therein. As a result, the sidewall into which nitrogen is introduced is easily formed.

In a method of manufacturing an MOS transistor according to a further aspect of the present invention, a gate insulating film and a gate electrode are formed on the main surface of a semiconductor substrate. Then, an oxide film is formed on the surface of the gate electrode and the exposed surface of the semiconductor substrate with a CVD method. Through the surface of the oxide film, nitrogen ions are implanted into at least an internal region of the oxide film in contact with the side surface of the gate electrode and the side surface of the gate insulating film, the gate electrode, and the exposed surface of the semiconductor substrate. By etching the oxide film, a sidewall oxide film in which nitrogen is introduced is formed in contact with the side surface of the gate electrode, the side surface of the gate insulating film, and the main surface of the semiconductor substrate. As a result, the sidewall oxide film in which nitrogen is introduced is easily formed.

In a method of manufacturing an N channel type MOS transistor according to a further aspect of the present invention, a gate insulating film and a gate electrode are formed on the main surface of a semiconductor substrate. With the gate electrode used as part of a mask, N type impurities are implanted into the main surface of the semiconductor substrate to form low impurity concentration diffusion regions of a pair of source/drain regions. An oxide film is formed on the surface of the gate electrode and the low impurity concentration diffusion regions of the pair of source/drain regions with a CVD method. Nitrogen ions are implanted into the oxide film through the surface thereof. By etching the oxide film into which nitrogen is implanted, a gate oxide film in contact with the side surface of the gate electrode, the side surface of the gate insulating film, and the low impurity concentration diffusion regions of the pair of source/drain regions. With the gate electrode and a sidewall oxide film used as part of a mask, N type impurities are implanted into the main surface of the semiconductor substrate to form high impurity concentration diffusion regions of the pair of source/drain regions. As a result, in this method of manufacturing an N channel type MOS transistor, after forming an oxide film with a CVD method and implanting nitrogen ions into the oxide film, a sidewall oxide film is formed by etching the oxide film. Therefore, the N channel type MOS transistor having the sidewall oxide film in which nitrogen is introduced is easily manufactured.

In a method of manufacturing an N channel type MOS transistor according to a further aspect of the present invention, a gate insulating film and a gate electrode are formed on the main surface of a semiconductor substrate. With the gate electrode used as part of a mask, N type impurities are implanted into the main surface of the semiconductor substrate to form low impurity concentration diffusion regions of a pair of source/drain regions. An oxide film is formed on the surface of the gate electrode and the low impurity concentration diffusion regions of the pair of source/drain regions with a CVD method. A polysilicon layer is formed on the surface of the oxide film. Nitrogen ions are implanted into the polysilicon layer through the surface thereof. Nitrogen implanted into the polysilicon layer is diffused into the oxide film. By etching the oxide film into which nitrogen is implanted after removing the polysilicon layer, a sidewall oxide film is formed in contact with the side surface of the gate electrode, the side surface of the gate insulating film, and the low impurity concentration diffusion regions of the pair of source/drain regions. With the gate electrode and the sidewall oxide film used as part of a mask, N type impurities are implanted into the main surface of the semiconductor substrate to form high impurity concentration diffusion regions of the pair of source/drain regions. As described above, in this method of manufacturing an N channel type MOS transistor, after implanting nitrogen ions into a polysilicon layer formed on an oxide film, nitrogen in the polysilicon layer is diffused into the oxide film, and then the oxide film is etched to form a sidewall oxide film. Therefore, nitrogen is easily introduced into the sidewall oxide film.

In a method of manufacturing an N channel type MOS transistor according to a further aspect of the present invention, a gate insulating film and a gate electrode are formed on the main surface of a semiconductor substrate. With the gate electrode used as part of a mask, N type impurities are implanted into the main surface of the semiconductor substrate to form low impurity concentration diffusion regions of a pair of source/drain regions. An oxide film is formed on the surface of the gate electrode and on the low impurity concentration diffusion regions of the pair of source/drain regions with a CVD method. A polysilicon layer is formed on the surface of the oxide film. Nitrogen ions are implanted into the polysilicon layer through the surface thereof. By etching the polysilicon layer into which nitrogen is implanted and the above oxide film, a sidewall is formed including an oxide film having an approximately L-letter shaped longitudinal section, and a polysilicon layer in which nitrogen is introduced and in contact with a perpendicular portion and a bottom portion of the oxide film. With the gate electrode and the sidewall used as part of a mask, N type impurities are implanted into the main surface of the semiconductor substrate to form high impurity concentration diffusion regions of the pair of source/drain regions. As a result, an N channel type MOS transistor in which nitrogen is introduced is easily manufactured.

In a method of manufacturing an N channel type MOS transistor according to a further aspect of the present invention, a gate insulating film and a gate electrode are formed on the main surface of a semiconductor substrate. With the gate electrode used as part of a mask, N type impurities are implanted into the main surface of the semiconductor substrate to form low impurity concentration diffusion regions of a pair of source/drain regions. An oxide film is formed on the surface of the gate electrode and on the low impurity concentration diffusion regions of the pair of source/drain regions with a CVD method. Through the surface of the oxide film, nitrogen ions are implanted into at least an internal region of the oxide film in contact with the side surface of the gate electrode and the side surface of the gate insulating film, the gate electrode, and the low impurity concentration diffusion regions of the pair of source/drain regions. By etching the oxide film, a sidewall oxide film in which nitrogen is introduced is formed in contact with the side surface of the gate electrode, the side surface of the gate insulating film, and the low impurity concentration diffusion regions of the pair of source/drain regions. With the gate electrode and the sidewall oxide film used as part of a mask, N type impurities are implanted into the main surface of the semiconductor substrate to form high impurity concentration diffusion regions of the pair of source/drain regions. As a result, an N channel type MOS transistor having a sidewall oxide film in which nitrogen is introduced is easily manufactured.

In a method of manufacturing a semiconductor device according to a further aspect of the present invention, a first gate insulating film and a first gate electrode are formed on an N channel type MOS transistor forming region of a semiconductor substrate, and a second gate insulating film and a second gate electrode are formed on a P channel type MOS transistor forming region of the semiconductor substrate. An oxide film is formed on the surface of the first and second gate electrodes and the exposed surface of the semiconductor substrate. The surface of the oxide film positioned on the P channel type MOS transistor forming region of the semiconductor substrate is covered with resist, and nitrogen ions are implanted through the surface of the oxide film positioned on the N channel type MOS transistor forming region of the semiconductor substrate. By etching the oxide film, a sidewall oxide film is formed in contact with the side surface of the first gate electrode, the side surface of the first gate insulating film, and the main surface of the semiconductor substrate. As a result, nitrogen is easily implanted into the sidewall of the N channel type MOS transistor.

In a method of manufacturing a semiconductor device according to a further aspect of the present invention, a first gate insulating film and a first gate electrode configuring an N channel type MOS transistor are formed on the main surface of a semiconductor substrate, and a second gate insulating film and a second gate electrode configuring a P channel type MOS transistor is formed on the main surface of the semiconductor substrate. An oxide film is formed on the surfaces of the first and second gate electrodes and on the exposed surface of the semiconductor substrate with a CVD method. Nitrogen ions are implanted through the surface of the oxide film. By etching the oxide film into which nitrogen is implanted, a first sidewall oxide film in contact with the side surface of the first gate electrode, the side surface of the first gate insulating film, and the main surface of the semiconductor substrate is formed, and a second sidewall oxide film in contact with the side surface of the second gate electrode, the side surface of the second gate insulating film, and the main surface of the semiconductor substrate is formed. As a result, nitrogen is easily introduced in the first sidewall oxide film of the N channel type MOS transistor and in the second sidewall oxide film of the P channel type MOS transistor.

In a method of manufacturing a semiconductor device according to a further aspect of the present invention, a first gate insulating film and a first gate electrode are formed on an N channel type MOS transistor forming region of a semiconductor substrate, and a second gate insulating film and a second gate electrode are formed on a P channel type MOS transistor forming region of the semiconductor substrate. After covering the P channel type MOS transistor forming region of the semiconductor substrate with first resist, with the first gate electrode used as part of a mask, N type impurities are implanted into the N channel type MOS transistor forming region of the semiconductor substrate to form low impurity concentration diffusion regions of a pair of first source/drain regions. An oxide film is formed on the surfaces of the first and second gate electrodes and on the exposed surface of the semiconductor substrate with a CVD method. After covering the surface of the oxide film positioned on the P channel type MOS transistor forming region of the semiconductor substrate with second resist, nitrogen ions are implanted into the oxide film positioned on the N channel type MOS transistor forming region of the semiconductor substrate through the surface thereof. By etching the oxide film positioned on the N channel type MOS transistor forming region, a first sidewall oxide film in contact with the side surface of the first gate electrode, the side surface of the first gate insulating film, and the low impurity concentration diffusion regions of the first source/drain regions is formed, and by etching the oxide film positioned on the P channel type MOS transistor forming region, a second sidewall oxide film is formed in contact with the side surface of the second gate electrode, the side surface of the second gate insulating film, and the exposed surface of the semiconductor substrate. After covering the P channel type MOS transistor forming region with third resist, with the first gate electrode and the first sidewall oxide film used as part of a mask, N type impurities are implanted into the main surface of the semiconductor substrate to form high impurity concentration diffusion regions of the pair of first source/drain regions. After covering the N channel type MOS transistor forming region with fourth resist, with the second gate electrode and the second sidewall oxide film used as part of a mask, P type impurities are introduced in the main surface of the semiconductor substrate to form a pair of second source/drain regions. According to this method of manufacturing a semiconductor device, nitrogen is introduced in the sidewall of the N channel type MOS transistor easily.

In a method of manufacturing a semiconductor device according to a further aspect of the present invention, a first gate insulating film and a first gate electrode are formed on an N channel type MOS transistor forming region, and a second gate insulating film and a second gate electrode are formed on a P channel type MOS transistor forming region. After covering the P channel type MOS transistor forming region with first resist, with the first gate electrode used as part of a mask, N type impurities are implanted into the N channel type MOS transistor forming region to form low impurity concentration diffusion regions of a pair of first source/drain regions. An oxide film is formed on the surfaces of the first and second gate electrodes and on the exposed surface of the semiconductor substrate with a CVD method. Nitrogen ions are implanted into the oxide film through the surface thereof. By etching the oxide film into which nitrogen is implanted, formed are a first sidewall oxide film in contact with the side surface of the first gate electrode, the side surface of the first gate insulating film, and the low impurity concentration diffusion regions of the pair of first source/drain regions, and a second sidewall oxide film in contact with the side surface of the second gate electrode, the side surface of the second gate insulating film, and the main surface of the semiconductor substrate. After covering the P channel type MOS transistor forming region with second resist, with the first gate electrode and the first sidewall oxide film used as part of a mask, N type impurities are implanted into the main surface of the semiconductor substrate to form high impurity concentration diffusion regions of the pair of first source/drain regions. After covering the N channel type MOS transistor forming region with third resist, with the second gate electrode and the second sidewall oxide film used as part of a mask, P type impurities are implanted into the main surface of the semiconductor substrate to form a pair of second source/drain regions for configuring a P channel type MOS transistor. As a result, nitrogen is introduced easily in the first sidewall oxide film of the N channel type MOS transistor and the second sidewall oxide film of the P channel type MOS transistor. Note that, if a metal silicide layer is formed in the surface of the first gate electrode of the N channel type MOS transistor, the surface of the second gate electrode of the P channel type MOS transistor, the surface of the first source/drain regions of the N channel type MOS transistor, and the surface of the second source/drain regions of the P channel type MOS transistor, growth of the metal silicide layer in the surfaces of the first and second sidewall oxide films is suppressed by nitrogen introduced in the first and second sidewall oxide films.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
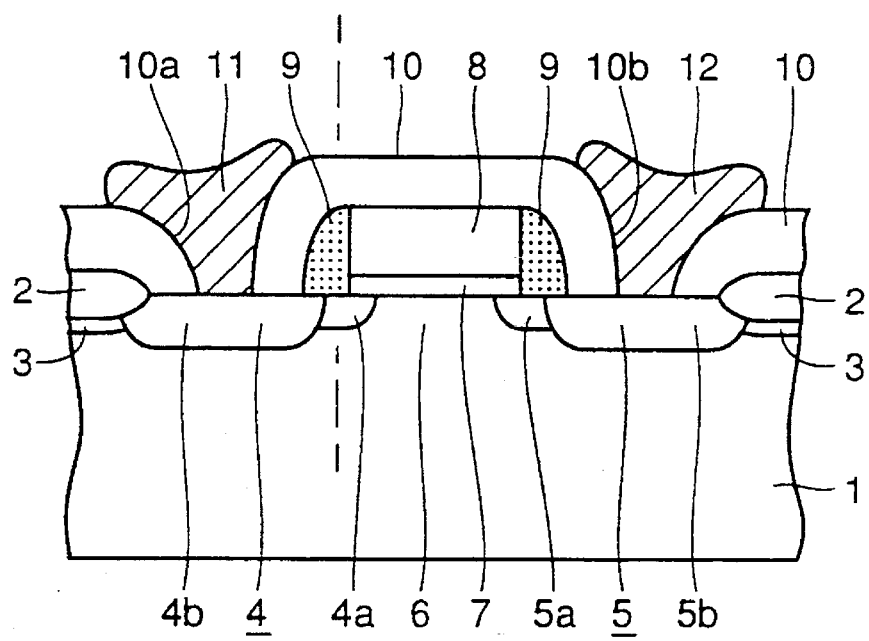
FIG. 1 is a sectional view showing a semiconductor device according to a first embodiment of the present invention.

Embodiments of the present invention will be described hereinafter with reference to the drawings. The first embodiment will be described with reference to FIGS. 1 to 12. Referring to FIG. 1, in a semiconductor device of the first embodiment, an element isolation oxide film 2 is formed on the main surface of a semiconductor substrate 1 formed of a P type silicon substrate so as to surround an N channel type MOS transistor forming region. A channel stopper region 3 of a P$^+$ type impurity region is formed under element isolation oxide film 2. A pair of source/drain regions 4 and 5 are formed on the main surface of semiconductor substrate 1 surrounded by element isolation oxide film 2 so as to sandwich a channel region 6. Source/drain region 4 is formed of a low impurity concentration diffusion region 4a in contact with channel region 6 at its end portion and a high impurity concentration diffusion region 4b integrally formed with low impurity concentration diffusion region 4a. Source/drain region 5 is formed of a low impurity concentration diffusion region 5a in contact with channel region 6 at its end portion, and a high impurity concentration diffusion region 5b integrally formed with low impurity concentration diffusion region 5a.

A gate electrode 8 is formed on channel region 6 with a gate insulating film 7 interposed therebetween. A sidewall oxide film 9 is formed on the side surface of gate insulating film 7 and the side surface of gate electrode 8. An interlayer insulating film 10 is formed so as to cover the entire surface, and contact holes 10a and 10b are formed in regions of interlayer insulating film 10 positioned on high impurity concentration diffusion regions 4b and 5b. An interconnection layer 11 is formed in contact hole 10a so as to be electrically connected to high impurity concentration diffusion region 4b, and an interconnection layer 12 is formed in contact hole 10b so as to be electrically connected to high impurity concentration diffusion region 5b.

Figure 2:
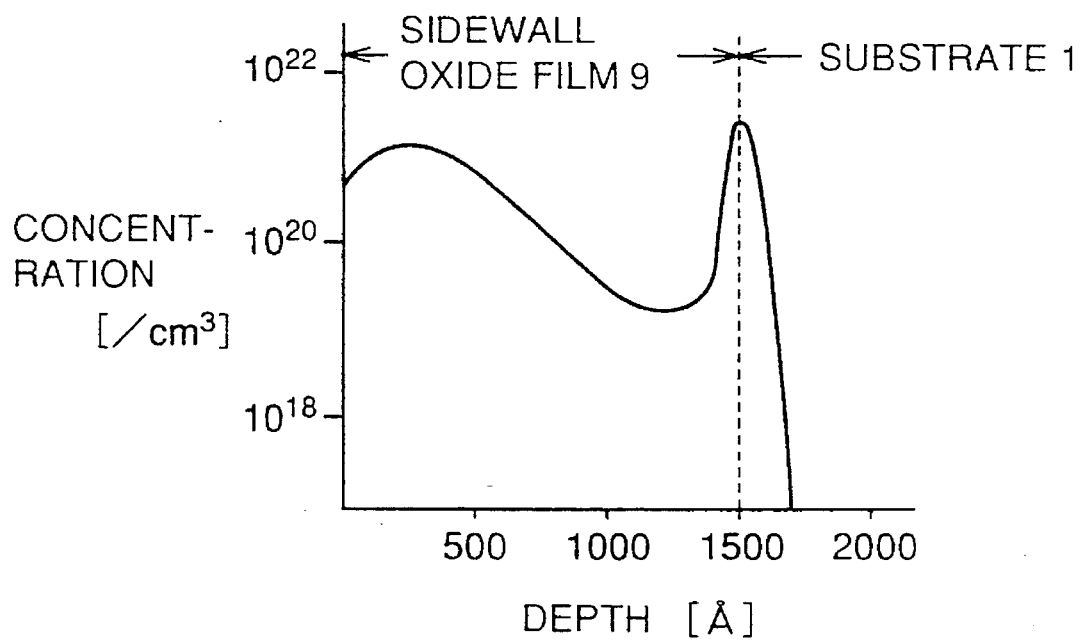
FIG. 2 is a graph showing nitrogen concentration distribution along the line I—I of FIG. 1.

In the first embodiment, nitrogen is introduced in a sidewall oxide film 9. The concentration distribution of nitrogen in the section along the line I—I of sidewall oxide film 9 has a peak at the interface between semiconductor substrate 1 and sidewall oxide film 9, as shown in FIG. 2. The concentration distribution has also a peak of nitrogen in the vicinity of the upper portion of sidewall oxide film 9. It is preferable to set the peak nitrogen concentration positioned at the interface between sidewall oxide film 9 and the main surface of semiconductor substrate 1 within the range of $1\times10^{19}$ atoms/cm$^3$~$1\times10^{21}$ atoms/cm$^3$. If the peak nitrogen concentration is set lower than $1\times10^{19}$ atoms/cm$^3$, an interface state at the interface between sidewall oxide film 9 and the main surface of semiconductor substrate 1 is not so much suppressed. As a result, hot carrier degradation is likely to occur. If the peak nitrogen concentration is higher than $1\times10^{21}$ atoms/cm$^3$, the mobility of electrons is degraded, or the activation rate of impurities in source/drain regions 4 and 5 is decreased to increase the resistance of source/drain regions 4 and 5. As a result, transistor characteristics are degraded. Because of the above reasons, the peak nitrogen concentration is preferably set within the range of $1\times10^{19}$ atoms/cm$^3$~$1\times10^{21}$ atoms/cm$^3$.

An N channel MOS transistor is configured of the pair of source/drain regions 4 and 5, gate electrode 8, and sidewall oxide film 9. Interconnection layers 11 and 12 are formed of aluminum, polysilicon, or the like.

Referring to FIGS. 3 to 12, the manufacturing process of the semiconductor device according to the first embodiment shown in FIG. 1 will now be described.

Figure 3:
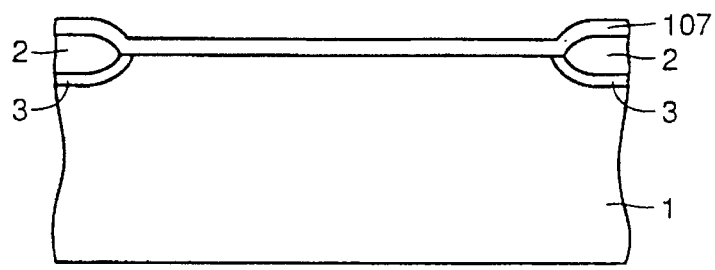
FIGS. 3 to 7 are sectional views for explaining the manufacturing process of the semiconductor device according to the first embodiment shown in FIG. 1.

As shown in FIG. 3, element isolation oxide film 2 is formed with an ordinary technique so as to surround the N channel type MOS transistor forming region in the main surface of semiconductor substrate 1. By implanting impurity ions under element isolation oxide film 2, channel stopper layer 3 of a P$^+$ impurity region is formed. Then, an oxide film 107 having a thickness of approximately 100 Å is formed so as to cover the main surface of semiconductor substrate 1.

Figure 4:
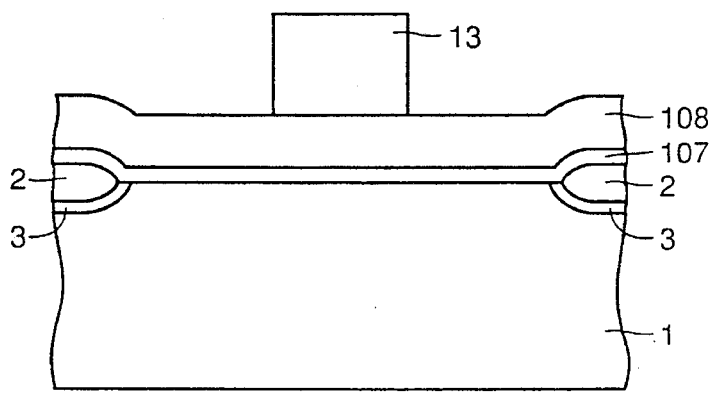
Figure 5:
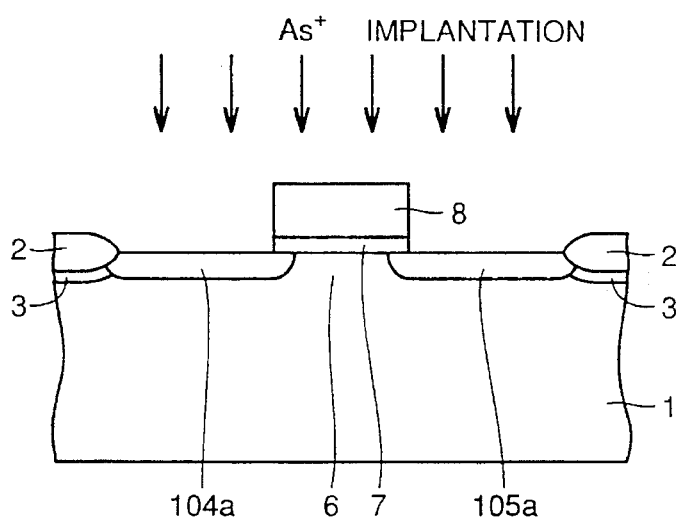

As shown in FIG. 4, a polysilicon layer 108 is formed approximately 1000 Å in thickness on the upper surface of oxide film 107. A resist pattern 13 of photoresist is formed on polysilicon layer 108. By anisotropically etching polysilicon layer 108 and oxide film 107 with resist pattern 13 used as a mask, gate insulating film 7 and gate electrode 8 shown in FIG. 5 are formed. Then, resist pattern 13 is removed. With gate electrode 8 used as part of a mask, N type impurities, for example, arsenic ions are implanted into the main surface of semiconductor substrate 1 under the conditions of 50 keV and $5\times10^{13}$ atoms/cm$^2$. As a result, a pair of low impurity concentration diffusion regions 104a and 105a are formed.

Figure 6:
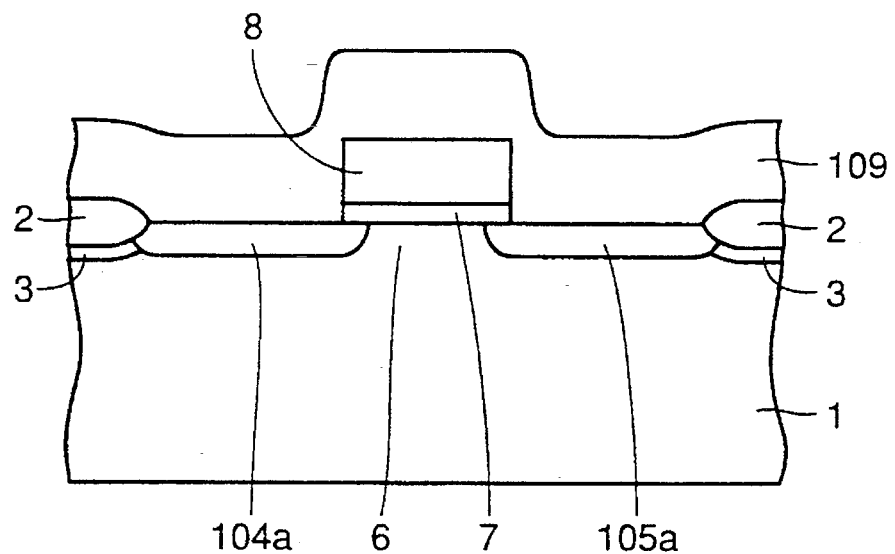
Figure 7:
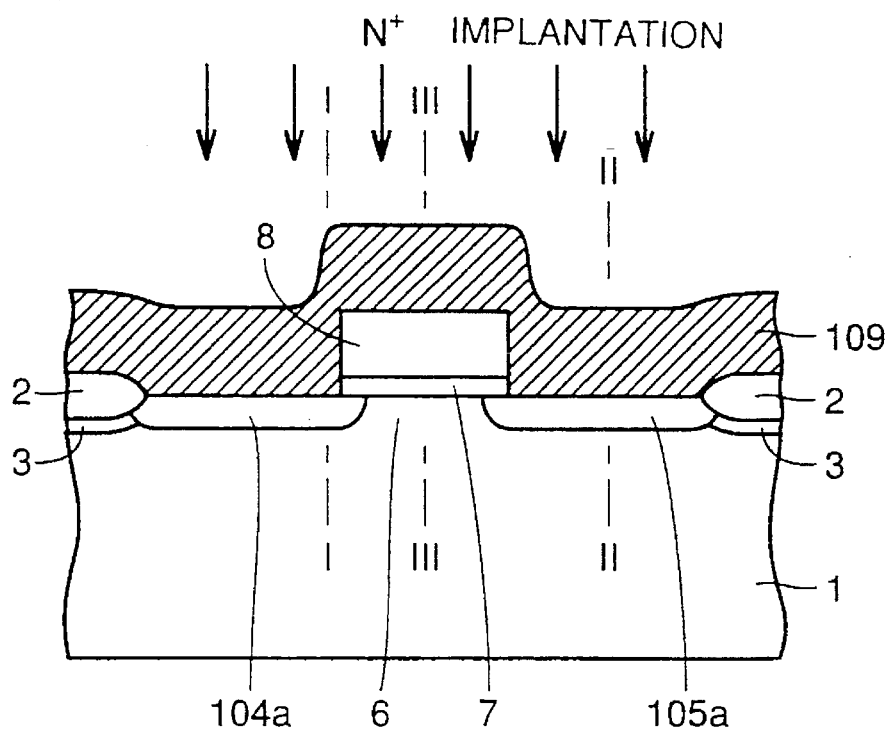
Figure 8:
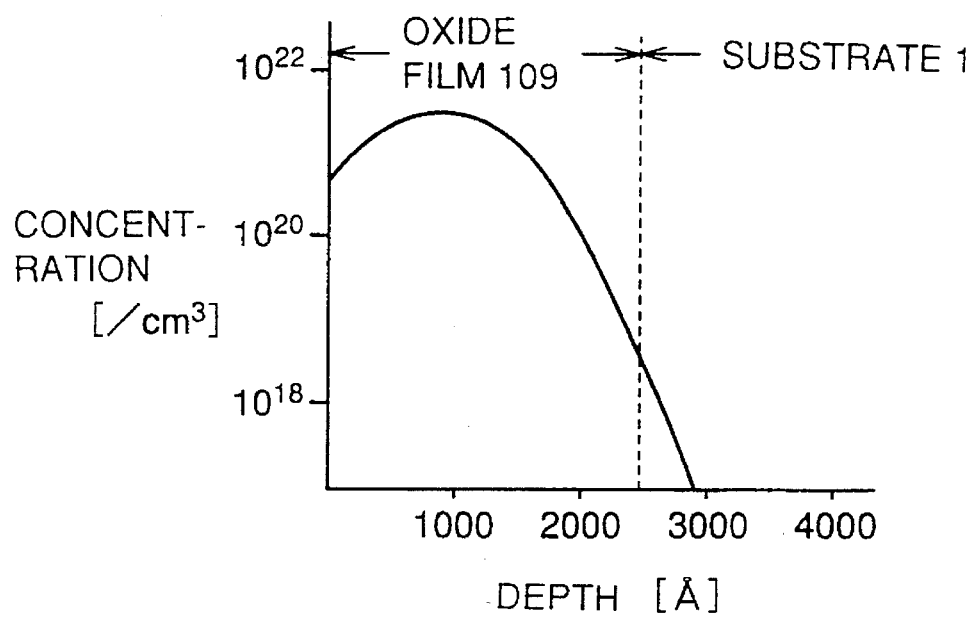
FIG. 8 is a graph showing nitrogen concentration distribution along the line I—I of the step shown in FIG. 7.
Figure 9:
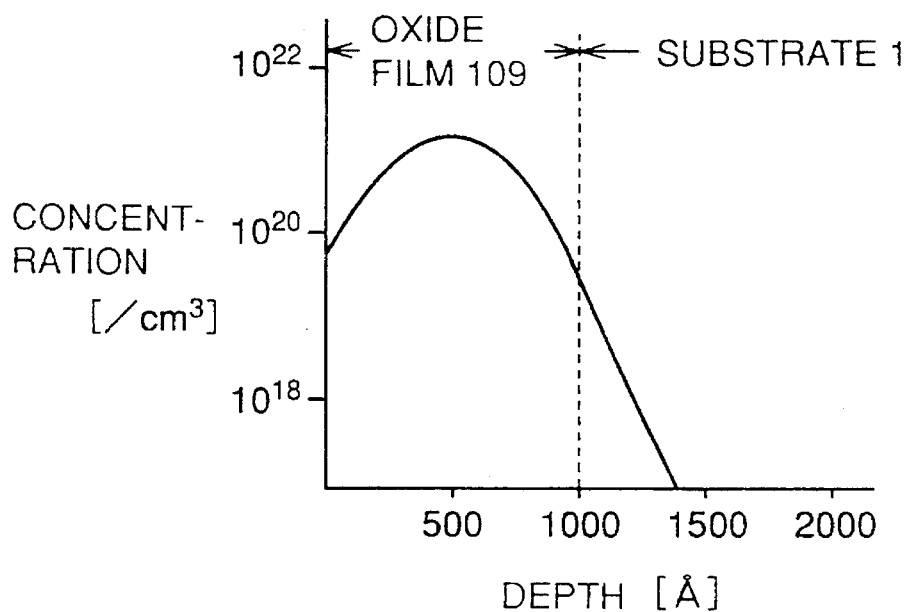
FIG. 9 is a graph showing nitrogen concentration distribution along the line II—II of the step shown in FIG. 7.
Figure 10:
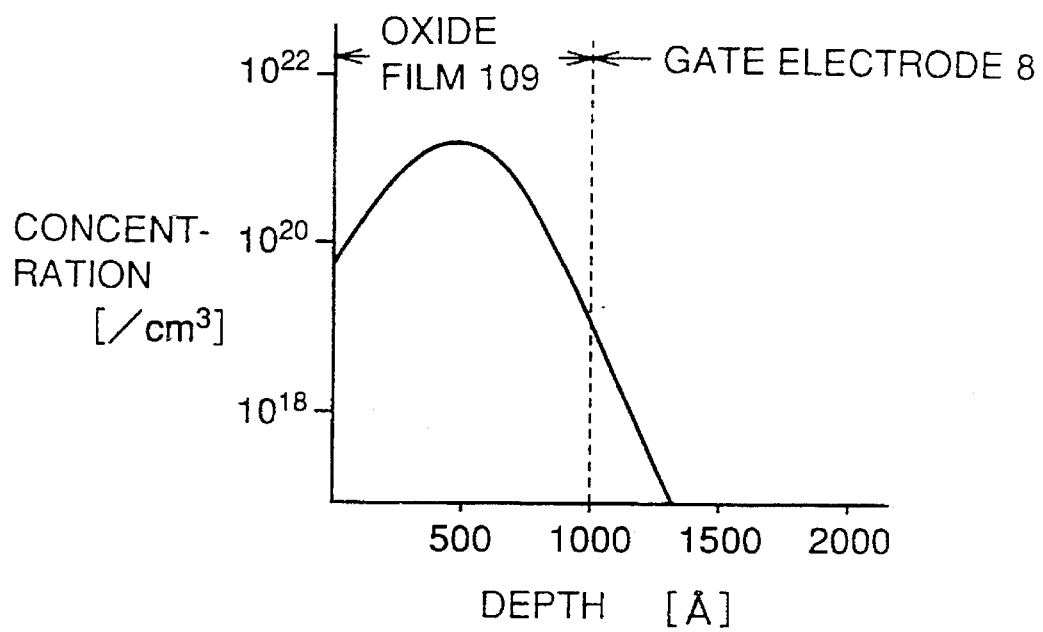
FIG. 10 is a graph showing nitrogen concentration distribution along the line III—III of the step shown in FIG. 7.

As shown in FIG. 6, an oxide film 109 having a thickness of approximately 1000 Å is formed on the surface of gate electrode 8 and on the pair of low impurity concentration diffusion regions 104a and 105a with a CVD method. Then, as shown in FIG. 7, nitrogen ions (N$^+$) are implanted into oxide film 109 through the surface thereof under the conditions of 30 keV and $4\times10^{15}$ atoms/cm$^2$ so that the center of projection range is positioned approximately at the center in oxide film 109. The nitrogen concentration distributions in oxide film 109 at the time are shown in FIGS. 8 to 10. The peak shown in FIG. 8 results in the peak positioned on the surface side of sidewall oxide film 9 shown in FIG. 2.

Figure 11:
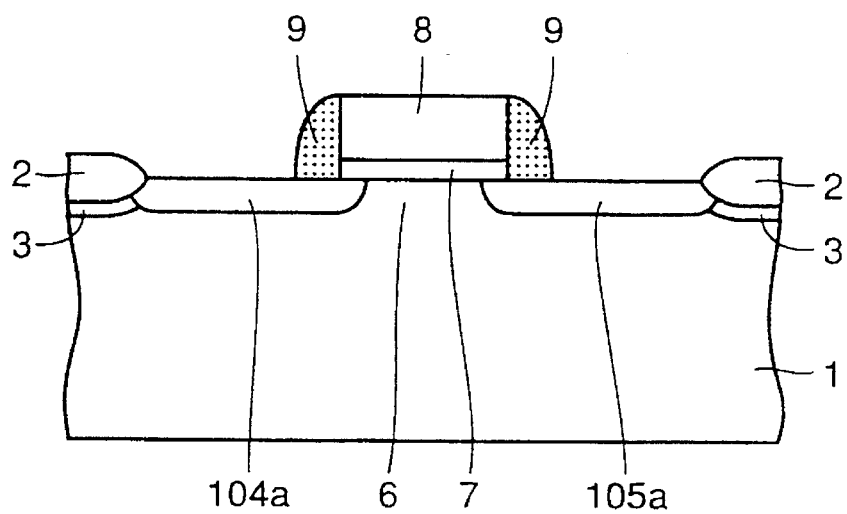
FIGS. 11 and 12 are sectional views for explaining the manufacturing process of the semiconductor device according to the first embodiment shown in FIG. 1.

After the step shown in FIG. 7, anisotropic reactive ion etching is implemented on oxide film 109 into which nitrogen is implanted, so that sidewall oxide film 9 is formed in contact with the side surface of gate electrode 8, the side surface of gate insulating film 7, and the pair of low impurity concentration diffusion regions 104a and 105a, as shown in FIG. 11.

Figure 12:
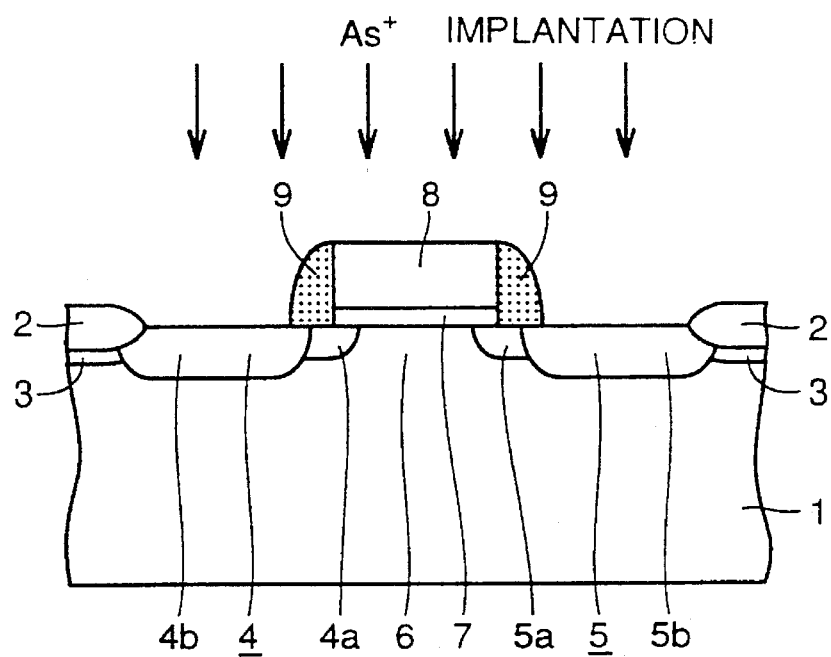

Then, as shown in FIG. 12, with gate electrode 8 and sidewall oxide film 9 used as part of a mask, N type impurities, for example, arsenic (As) ions are implanted into the main surface of semiconductor substrate 1 under the conditions of 50 keV and $4\times10^{15}$ atoms/cm$^2$ to form high impurity concentration diffusion regions 104b and 105b. By conducting heat treatment at a temperature of 850° C. for approximately 20 minutes, the arsenic ions are electrically activated. As a result, the pair of source/drain regions 4 and 5 of low impurity concentration diffusion regions 104a and 105a in contact with channel region 6 at their end portions, and high impurity concentration diffusion regions 104b and 104b positioned outside of channel region 6 and formed integrally with low impurity concentration diffusion regions 104a and 105a are formed.

The heat treatment at this time diffuses nitrogen in sidewall oxide film 9, causing nitrogen to segregate at the interface between sidewall oxide film 9 and the main surface of semiconductor substrate 1. As a result, the nitrogen concentration distribution is obtained having a peak at the interface between sidewall oxide film 9 and the main surface of semiconductor substrate 1, as shown in FIG. 2. An N channel type MOS transistor is thus formed including the pair of source/drain regions 4 and 5, gate insulating film 7, gate electrode 8, and sidewall oxide film 9 into which nitrogen is implanted.

Then, as shown in FIG. 1, after forming interlayer insulating film 10 on the entire main surface of semiconductor substrate 1, contact holes 10a and 10b are formed in interlayer insulating film 10. Interconnection layer 11 is formed so as to be electrically connected to source/drain region 4 through contact hole 10a and to be along the surface of interlayer insulating film 10. Interconnection layer 12 is formed so as to be electrically connected to source/drain region 5 through contact hole 10b and to be along the surface of interlayer insulating film 10.

In the semiconductor device having such an N channel type MOS transistor as structured above, the nitrogen concentration is arranged to be at a peak at the interface between sidewall oxide film 9 and the main surface of semiconductor substrate 1. Therefore, when the N channel type MOS transistor is rendered non-conductive, generation of an interface state in gate insulating film 7 positioned in the vicinity of the interface between semiconductor substrate 1 in the vicinity of drain region 4 and gate insulating film 7 can be suppressed. As a result, it is possible to prevent hot carriers generated by the high electric field from being caught in gate insulating film 7, thereby improving the hot carrier resistance.

Further, in the first embodiment, nitrogen is implanted into sidewall oxide film 9 by ion implantation. Therefore, as compared to a method of implanting nitrogen by annealing in the nitrogen atmosphere (atmosphere containing nitrogen such as $N_2O$ and $NH_3$), the depth or concentration of nitrogen doping in sidewall oxide film 9 can be easily optimized. In addition, the ion implantation method has advantages that the selectivity of nitrogen to a region to be doped is high, and that no additional heat treatment is required.

Figure 13:
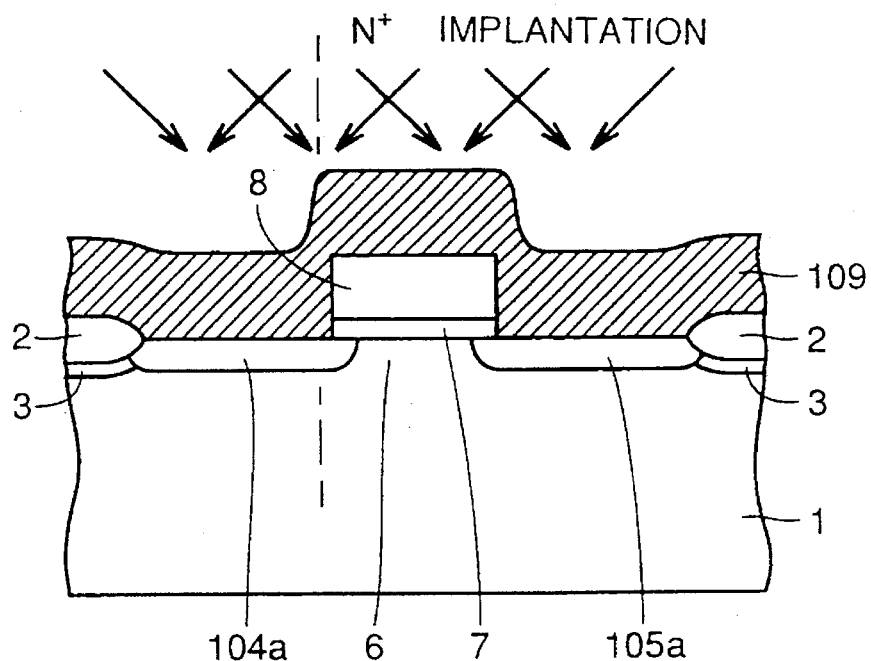
FIG. 13 is a sectional view for explaining the manufacturing process of a semiconductor device according to a second embodiment of the present invention.
Figure 14:
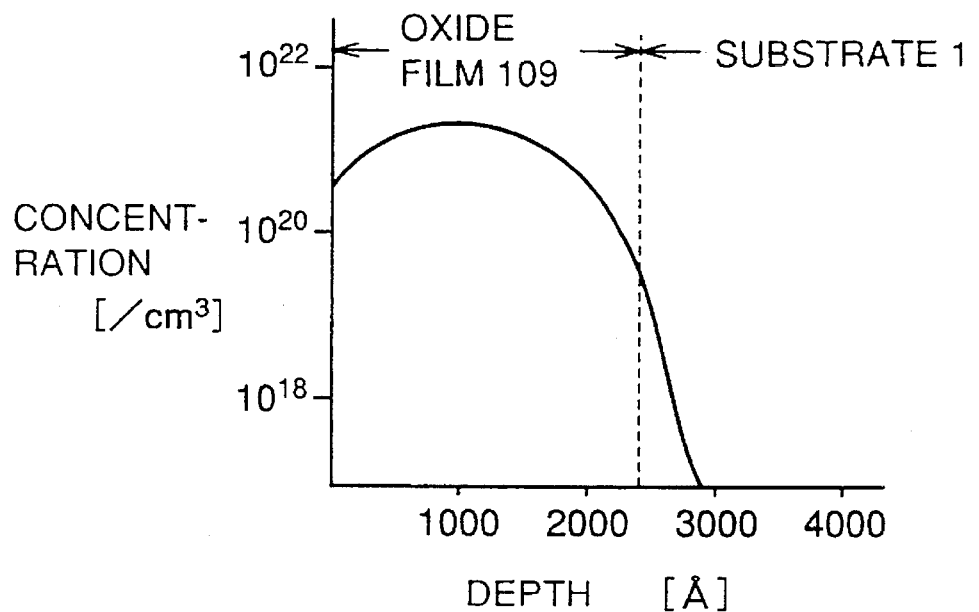
FIG. 14 is a graph showing nitrogen concentration distribution along the line I—I of the step shown in FIG. 13.

Referring to FIGS. 13 and 14, the second embodiment of the present invention will be described. The second embodiment is different from the first embodiment in a method of implanting nitrogen into sidewall oxide film 9. More specifically, in the second embodiment, nitrogen is implanted into oxide film 109 with a rotational oblique ion implantation method, as shown in FIG. 13. Other than that, the second embodiment is similar to the first embodiment. The manufacturing process of a semiconductor device of the second embodiment will be described hereinafter in detail. With the same process as the manufacturing process of the first embodiment shown in FIGS. 3 to 6, oxide film 109 is finally formed. Then, as shown in FIG. 13, nitrogen ions ($N^+$) are implanted into oxide film 109 through the surface thereof with a 45° rotational oblique ion implantation method under the conditions of 40 keV and $5.6 \times 10^{15}$ atoms/$cm^2$, so that the center of projection range is positioned approximately at the center in oxide film 109.

The nitrogen concentration distribution in the section along the line I—I in oxide film 109 at the time is shown in FIG. 14. The step of the second embodiment shown in FIG. 13 corresponds to the step of the first embodiment shown in FIG. 7. The nitrogen concentration distributions of the step shown in FIG. 13 corresponding to the sections along the lines II—II and III—III in the step of the first embodiment shown in FIG. 7 are the same as those of the first embodiment shown in FIGS. 9 and 10.

By comparing the nitrogen concentration distribution of the second embodiment shown in FIG. 14 and the nitrogen concentration distribution of the first embodiment shown in FIG. 8, it is found that, in the second embodiment, the nitrogen concentration is higher in the vicinity of the interface between oxide film 109 and the main surface of semiconductor substrate 1, that is, in the vicinity of the end portion of gate insulating film 7, than in the first embodiment.

In the subsequent process, as in the manufacturing process of the first embodiment shown in FIGS. 11 and 12, by implementing anisotropic reactive ion etching on oxide film 109 into which nitrogen is implanted, sidewall oxide film 9 is formed in contact with the side surface of gate electrode 8, the side surface of gate insulating film 7, and the pair of low impurity concentration diffusion regions 104a and 105a. With gate electrode 8 and sidewall oxide film 9 used as part of a mask, N type impurity ions are implanted to form high impurity concentration diffusion regions 104b and 105b. After that, by conducting heat treatment, the pair of source/drain regions 4 and 5 of low impurity concentration diffusion regions 4a and 5a in contact with channel region 6 at their end portions, and high impurity concentration diffusion regions 4b and 5b positioned outside of channel region 6 and formed integrally with low impurity concentration diffusion regions 4a and 5a are formed. By diffusing nitrogen in sidewall oxide film 9 with the heat treatment, nitrogen concentration is arranged to be at a peak at the interface between sidewall oxide film 9 and the main surface of semiconductor substrate 1. Then, by forming interlayer insulating film 10 and interconnection layers 11 and 12, the semiconductor device of the second embodiment is completed.

The semiconductor device of the second embodiment structured as described above can obtain the following effect in addition to the similar effects to those of the above described first embodiment. More specifically, by implanting nitrogen into oxide film 109 with a rotational oblique ion implantation method, the nitrogen concentration can be set high in oxide film 109 positioned in the vicinity of the end portion of gate insulating film 7. As a result, the nitrogen concentration peak at the interface formed by the subsequent heat treatment between sidewall oxide film 9 and the main surface of semiconductor substrate 1 is higher than the concentration peak of the first embodiment. As a result, the hot carrier resistance can be further improved than in the first embodiment.

Referring to FIGS. 15 to 27, the third embodiment of the present invention will now be described. The third embodiment is different from the first embodiment in a method of implanting nitrogen into sidewall oxide film 9. As a result, the nitrogen concentration distribution in sidewall oxide film 9 is also different from that of the first embodiment. Other than that, the third embodiment is similar to the first embodiment.

Figure 15:
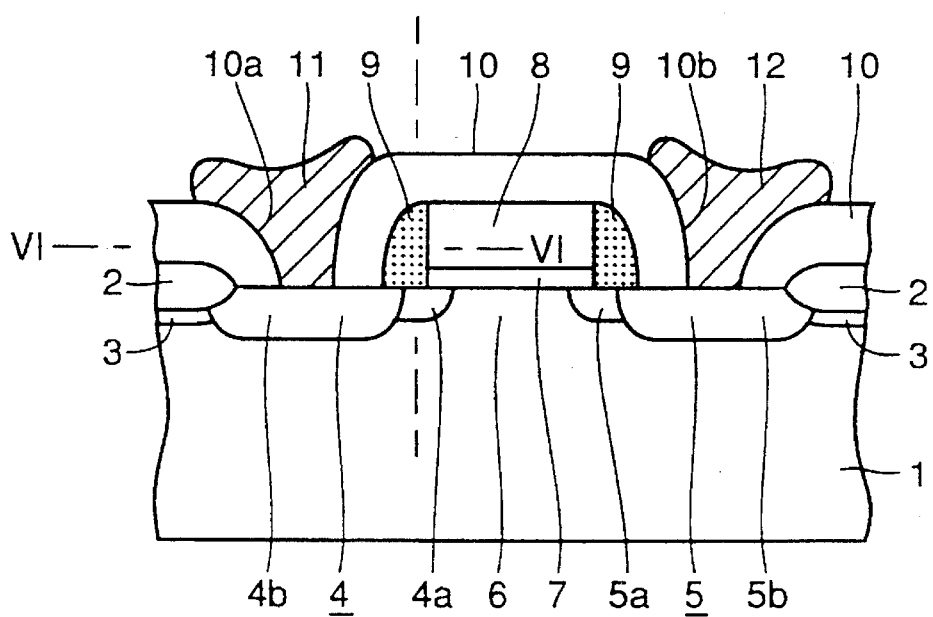
FIG. 15 is a sectional view showing a semiconductor device according to a third embodiment of the present invention.
Figure 16:
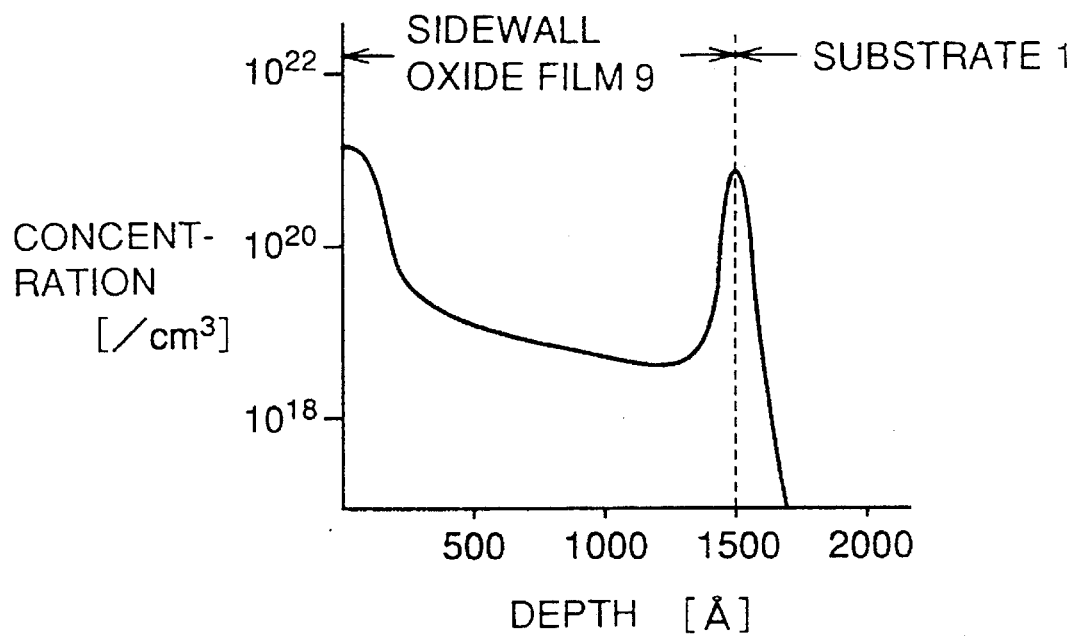
FIG. 16 is a graph showing nitrogen concentration distribution along the line I—I of the semiconductor device shown in FIG. 15.
Figure 17:
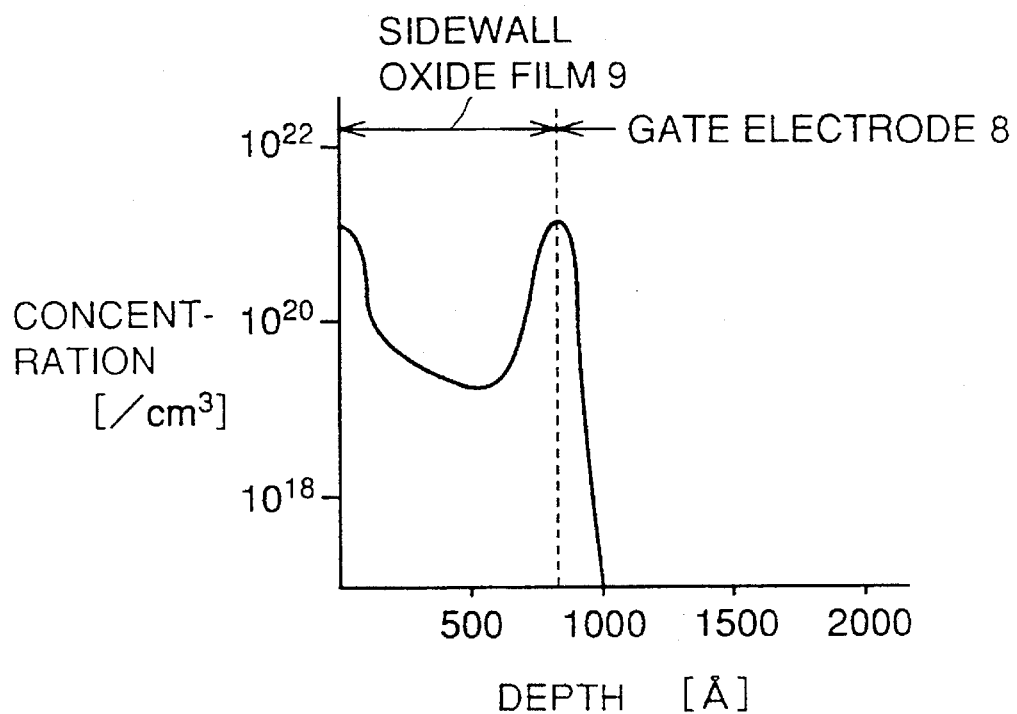
FIG. 17 is a graph showing nitrogen concentration distribution along the line IV—IV of the semiconductor device shown in FIG. 15.

The nitrogen concentration distribution in the section along the line I—I shown in FIG. 15 has a peak at the interface between the main surface of semiconductor substrate 1 and sidewall oxide film 9, and a peak also in the vicinity of the upper surface of sidewall oxide film 9, as shown in FIG. 16. Further, the nitrogen concentration distribution in the section along the line IV—IV shown in FIG. 15 has a peak at the interface between the side surface of gate electrode 8 and the side surface of sidewall oxide film 9, and a peak also in the side surface of sidewall oxide film 9 on the interlayer insulating film 10 side, as shown in FIG. 17.

As in the first embodiment, it is desired to set the nitrogen concentration peak positioned at the interface between sidewall oxide film 9 and the main surface of semiconductor substrate 1 within the range of $1\times10^{19}$ atoms/cm$^3$~$1\times10^{21}$ atoms/cm$^3$.

Referring to FIGS. 18 to 27, description will now be given of the manufacturing process of a semiconductor device of the third embodiment.

Figure 18:
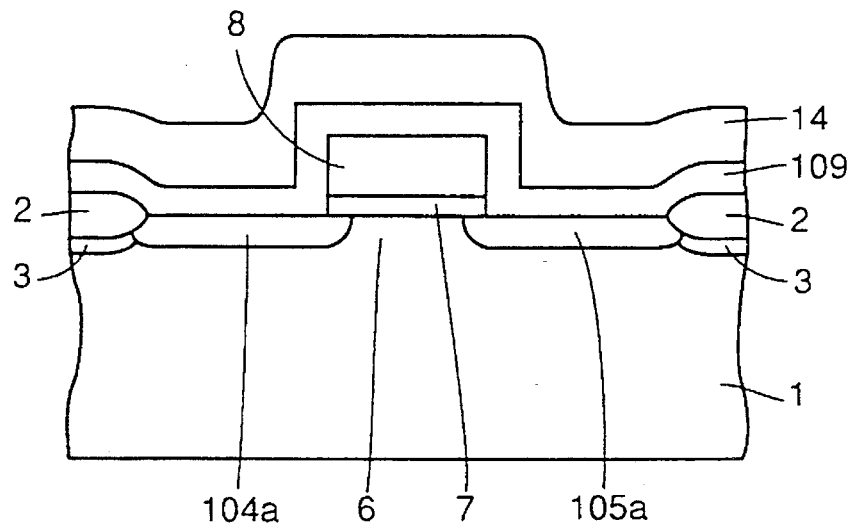
FIGS. 18, 19, 22, 26, and 27 are sectional views for explaining the manufacturing process of the semiconductor device of the third embodiment shown in FIG. 15.

With the similar process to the manufacturing process of the first embodiment shown in FIGS. 3 to 5, gate electrode and the pair of low impurity concentration diffusion regions 104a and 105a are formed. Then, as shown in FIG. 18, oxide film 109 having a thickness of approximately 800 Å is formed on the surface of gate electrode 8 and on the pair of low impurity concentration diffusion regions 104a and 105a with a CVD method. A polysilicon layer 14 having a thickness of approximately 1000 Å is formed on the entire surface of oxide film 109 with a CVD method.

Figure 19:
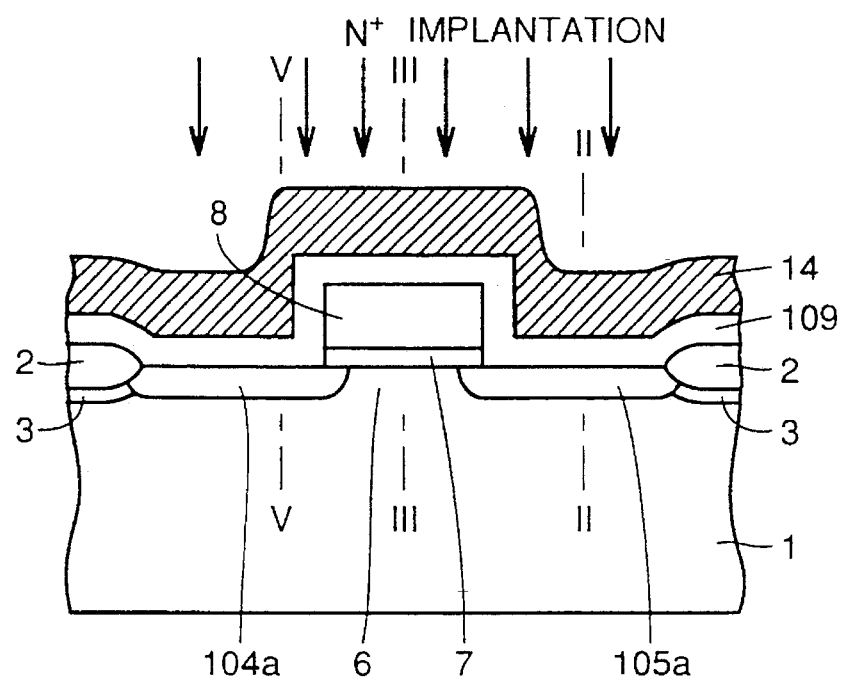
Figure 20:
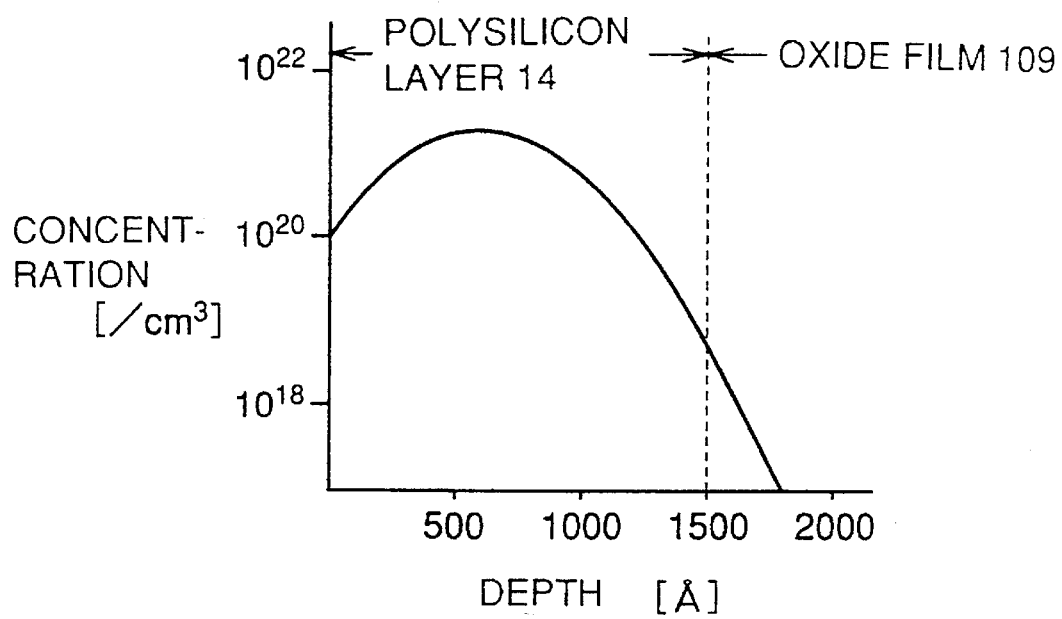
FIG. 20 is a graph showing nitrogen concentration distribution)along the line V—V of the step shown in FIG. 19.
Figure 21:
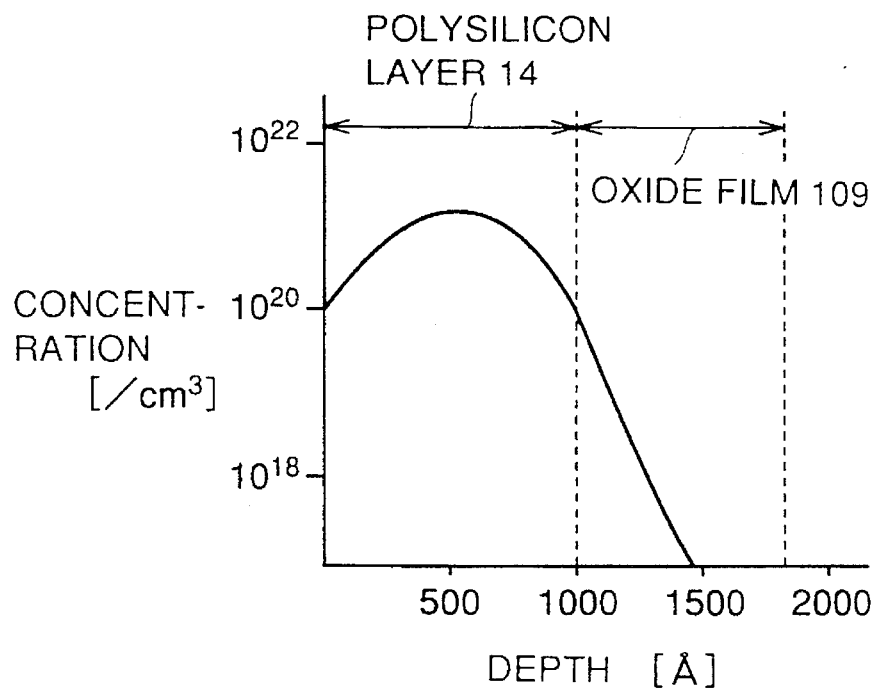
FIG. 21 is a graph showing nitrogen concentration distribution along the lines II—II and III—III of the step shown in FIG. 19.

Then, as shown in FIG. 19, nitrogen ions (N$^+$) are implanted into polysilicon layer 14 through the surface thereof under the conditions of 30 keV and $4\times10^{15}$ atoms/cm$^2$ so that the center of projection range is positioned approximately at the center in polysilicon layer 14. The nitrogen concentration distributions in polysilicon layer 14 at the time are shown in FIGS. 20 and 21. More specifically, the nitrogen concentration distribution in the section along the line V—V shown in FIG. 19 is shown in FIG. 20, and the nitrogen concentration distributions in the sections along the lines II—II and III—III shown in FIG. 19 are shown in FIG. 21.

Figure 22:
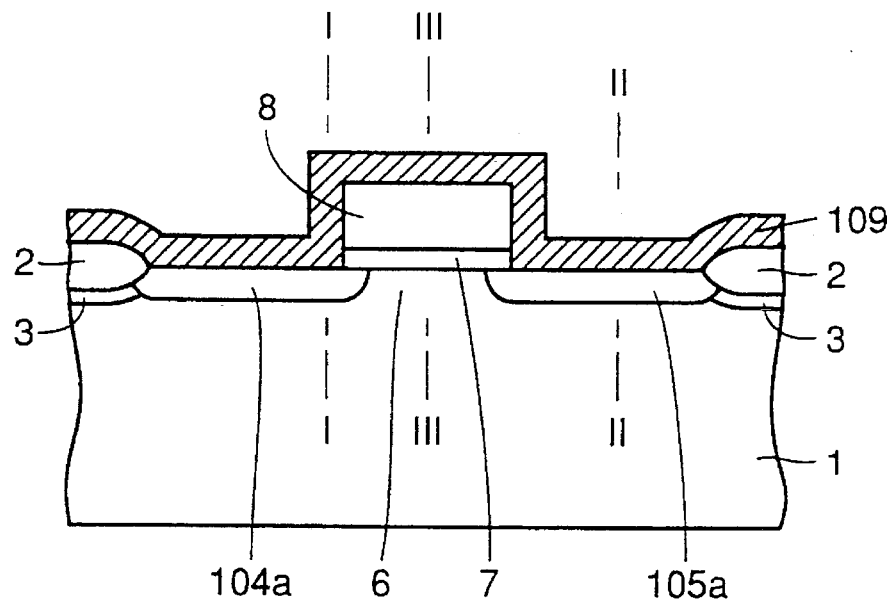
Figure 23:
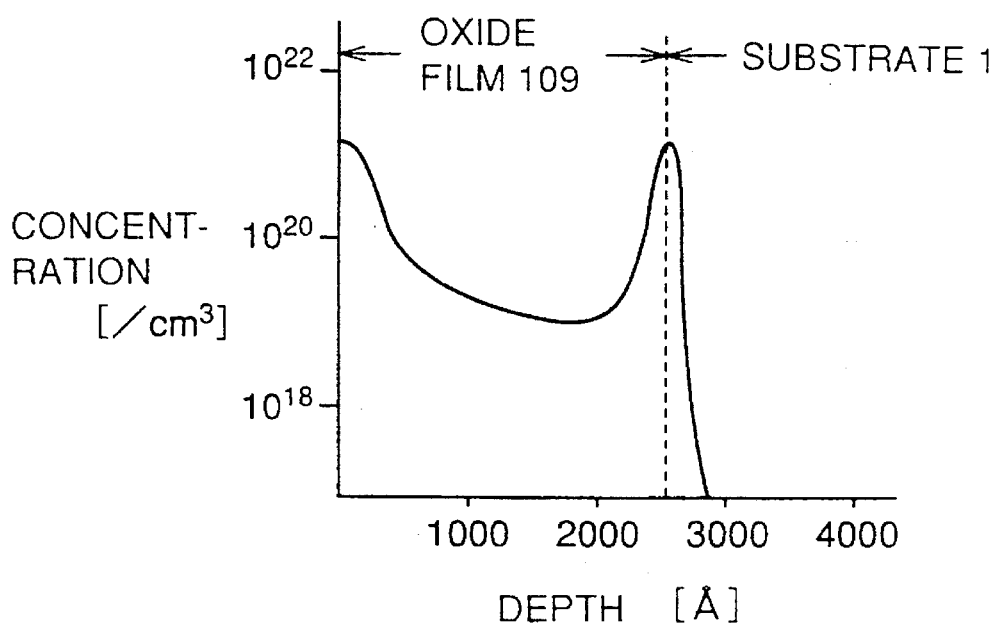
FIG. 23 is a graph showing nitrogen concentration distribution along the line I—I of the step shown in FIG. 22.
Figure 24:
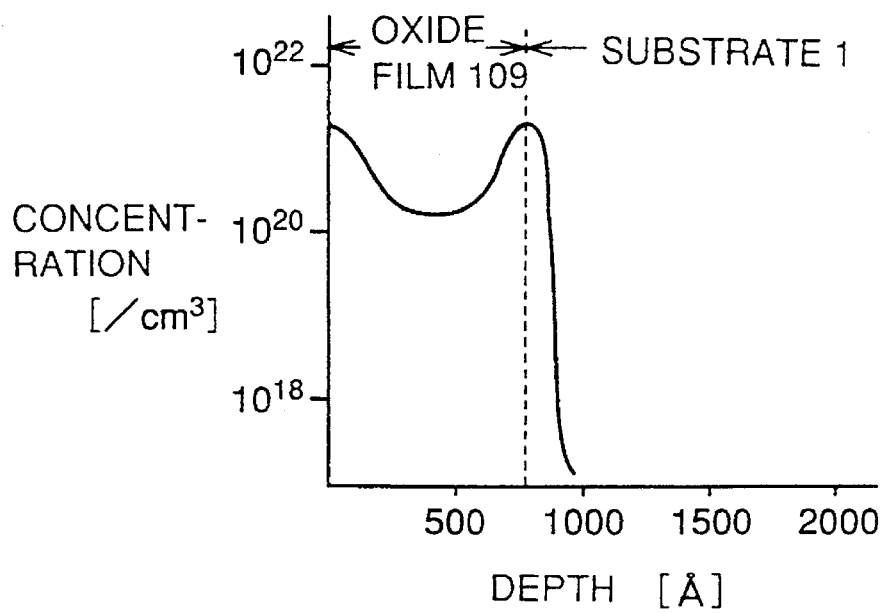
FIG. 24 is a graph showing nitrogen concentration distribution along the line II—II of the step shown in FIG. 22.
Figure 25:
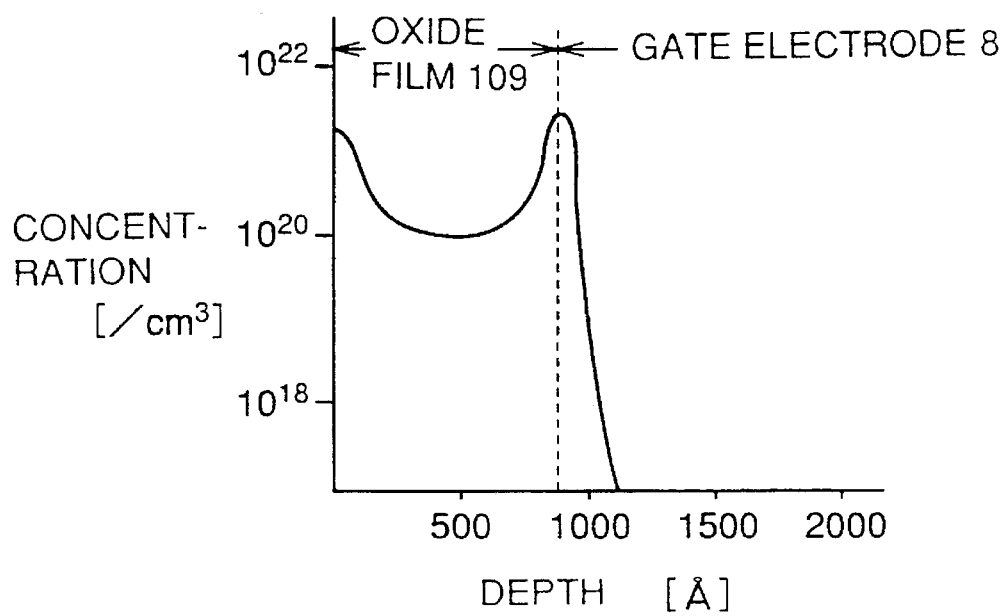
FIG. 25 is a graph showing nitrogen concentration distribution along the line III—III of the step shown in FIG. 22.

Then, nitrogen ions implanted into polysilicon layer 14 are diffused into oxide film 109 by conducting heat treatment at 850° C. for approximately 20 minutes. Then, by etching away the entire polysilicon layer 14, the configuration shown in FIG. 22 is obtained. The nitrogen concentration distributions in oxide film 109 at the time are shown in FIGS. 23 to 25. More specifically, the nitrogen concentration distribution in the section along the line I—I shown in FIG. 22 is shown in FIG. 23, the nitrogen concentration distribution in the section along the line II—II shown in FIG. 22 is shown in FIG. 24, and the nitrogen concentration distribution in the section along the line III—III shown in FIG. 22 is shown in FIG. 25. Referring to FIGS. 23 to 25, the nitrogen concentration peaks at the interface between oxide film 109 and the main surface of semiconductor substrate 1, at the interface between oxide film 109 and gate electrode 8, and at the interface between oxide film 109 and polysilicon layer 14. As a result, when sidewall oxide film 9 as shown in FIG. 26 is formed, the nitrogen concentration peaks at the interface between sidewall oxide film 9 and the main surface of semiconductor substrate 1, and also in the upper surface of sidewall oxide film 9.

Figure 26:
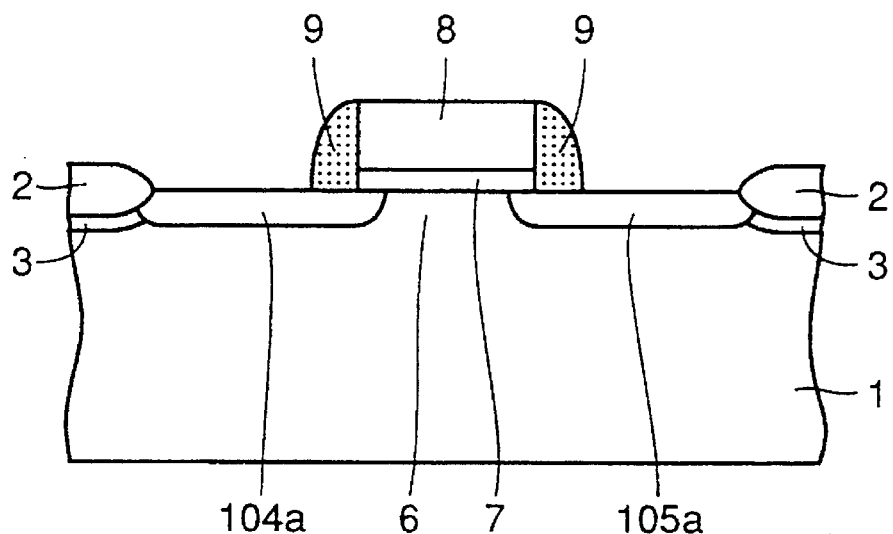
Figure 27:
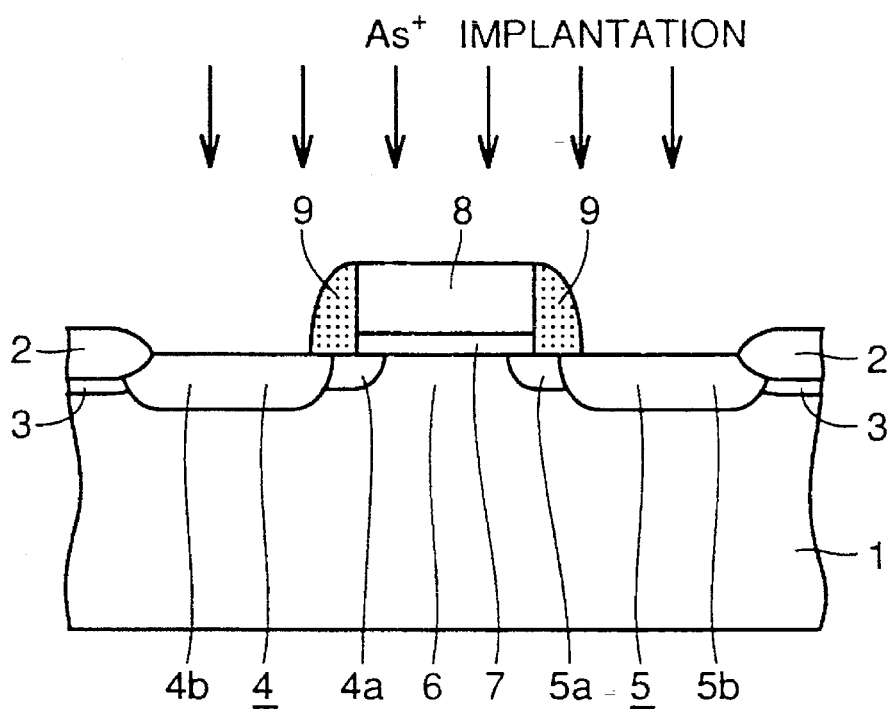

After forming such sidewall oxide film 9 as shown in FIG. 26, with gate electrode 8 and sidewall oxide film 9 used as part of a mask, N type impurities (for example, arsenic) are implanted into the main surface of semiconductor substrate 1 under the conditions of 50 keV and $4\times10^{15}$ atoms/cm$^2$, as shown in FIG. 27. As a result, high impurity concentration diffusion regions 104b and 105b are formed.

Then, by electrically activating the impurities by conducting heat treatment at 850° C. for approximately 20 minutes, the pair of source/drain regions 4 and 5 of low concentration diffusion regions 4a and 5a and high impurity concentration diffusion regions 4b and 5b are formed.

Then, as shown in FIG. 15, after forming interlayer insulating film 10 on the entire main surface of semiconductor substrate 1, contact holes 10a and 10b are formed in interlayer insulating film 10. Interconnection layer 11 is formed so as to be electrically connected to source/drain region 4 through contact hole 10a, and interconnection layer 12 is formed so as to be electrically connected to source/drain region 5 through contact hole 10b. The semiconductor device of the third embodiment is thus completed.

Figure 28:
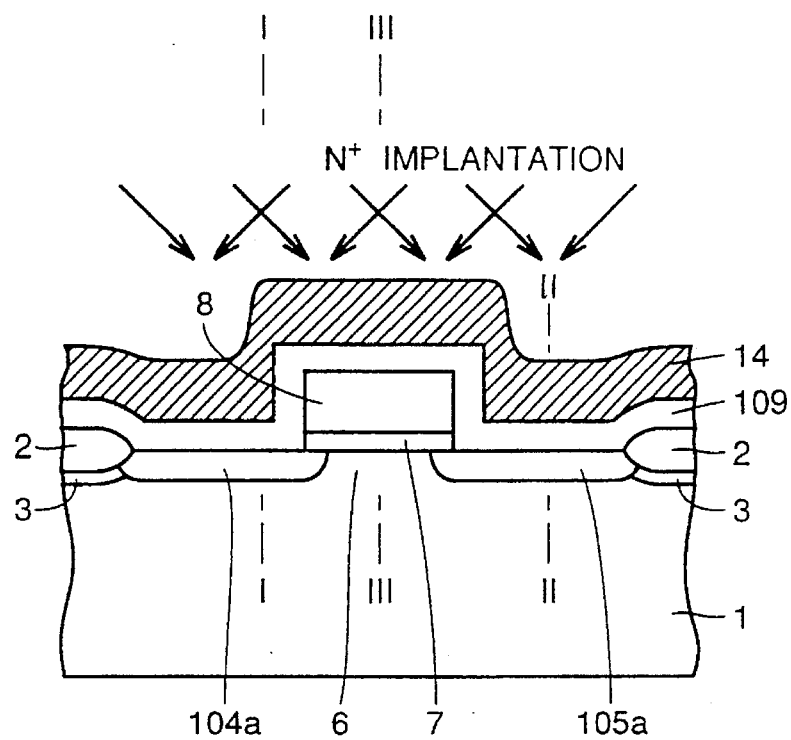
FIG. 28 is a sectional view for explaining the manufacturing process of a semiconductor device according to a fourth embodiment of the present invention.
Figure 29:
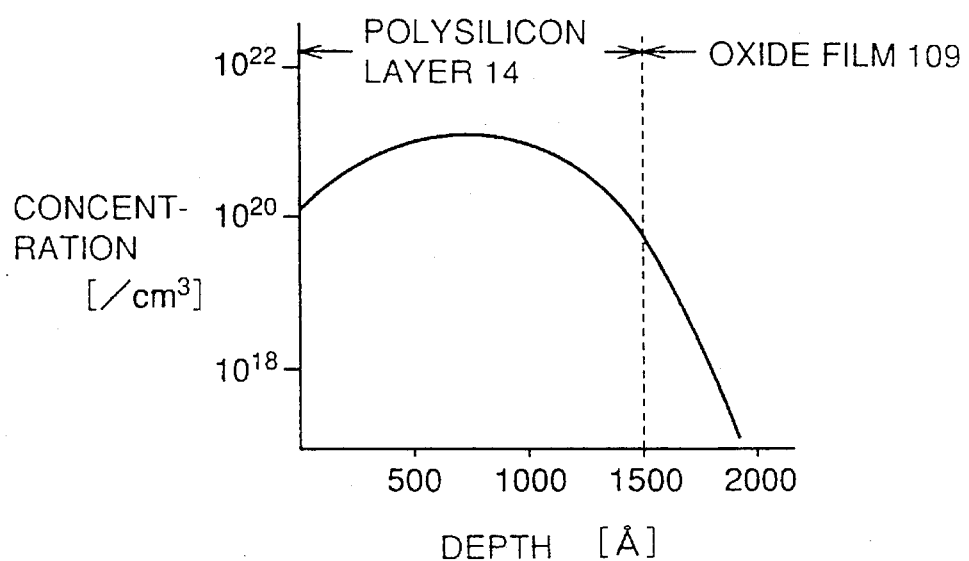
FIG. 29 is a graph showing nitrogen concentration distribution along the line I—I of the step shown in FIG. 28.

Referring to FIGS. 28 and 29, the fourth embodiment of the present invention will now be described. The fourth embodiment is different from the above described third embodiment in a method of implanting nitrogen into sidewall oxide film 9. More specifically, in the fourth embodiment, a rotational oblique ion implantation method is employed in implanting nitrogen ions into polysilicon layer 14, as shown in FIG. 28. A method of manufacturing the semiconductor device of the fourth embodiment will be described hereinafter in detail.

With the similar process to the manufacturing process of the first embodiment shown in FIGS. 3 to 5, gate electrode 8 and the pair of low impurity concentration diffusion regions 104a and 105a are formed. Then, with the similar process to the manufacturing process of the third embodiment shown in FIG. 18, oxide film 109 having a thickness of approximately 200 Å is formed on the surface of gate electrode 8 and on the pair of low impurity concentration diffusion region 104a and 105a with a CVD method. Polysilicon layer 14 having a thickness of approximately 1000 Å is formed on the entire surface of oxide film 109 with a CVD method.

Then, as shown in FIG. 28, nitrogen ions (N$^+$) are implanted into polysilicon layer 14 through the surface thereof with a 45° rotational oblique ion implantation method under the conditions of 40 keV and $5.6\times10^{15}$ atoms/cm$^2$ so that the center of projection range is positioned approximately at the center in polysilicon layer 14. The nitrogen concentration distribution in the section along the line I—I in this step is shown in FIG. 29. Note that the nitrogen concentration distributions in the sections along the lines II—II and III—III shown in FIG. 28 are similar to the nitrogen concentration distributions of the third embodiment shown in FIG. 21.

Comparison is now made between the nitrogen concentration distribution of the fourth embodiment shown in FIG. 29 and that of the third embodiment shown in FIG. 20. It is found that, in the fourth embodiment, the nitrogen concentration in the vicinity of the interface between polysilicon layer 14 and oxide film 109 is higher than in the third embodiment. Then, the semiconductor device of the fourth embodiment is completed with the similar process to that of the third embodiment. In the semiconductor device of the fourth embodiment thus formed, the following effect is obtained in addition to the similar effects to those of the above described third embodiment. More specifically, by implanting nitrogen ions into polysilicon layer 14 with a rotational oblique ion implantation method, the nitrogen concentration in oxide film 109 close to the end portion of gate insulating film 7 is higher than the case of the third embodiment. As a result, the nitrogen concentration peak at the interface between sidewall oxide film 9 and the main surface of semiconductor substrate 1 is also higher than the case of the third embodiment, resulting in further improvement of the hot carrier resistance than the case of the third embodiment.

Figure 30:
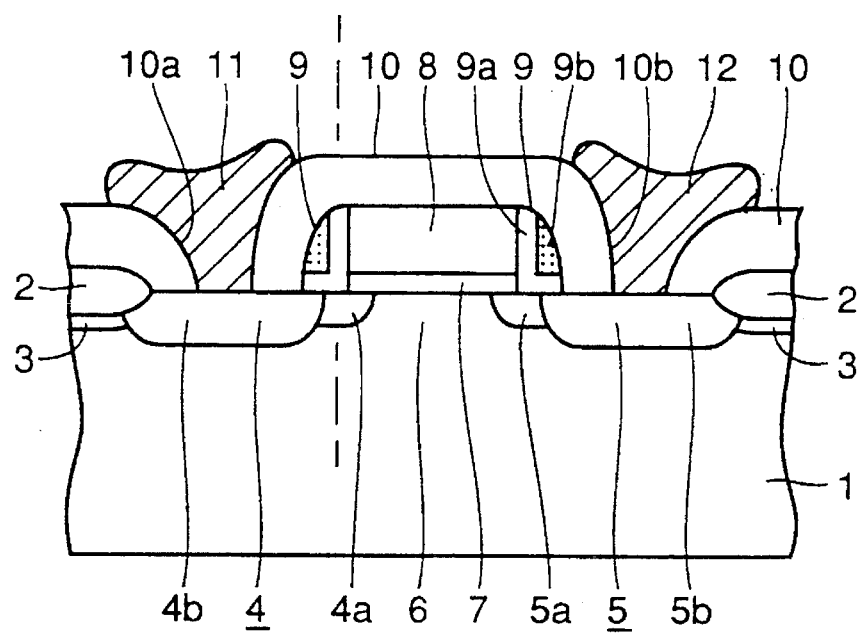
FIG. 30 is a sectional view showing a semiconductor device according to a fifth embodiment of the present invention.
Figure 31:
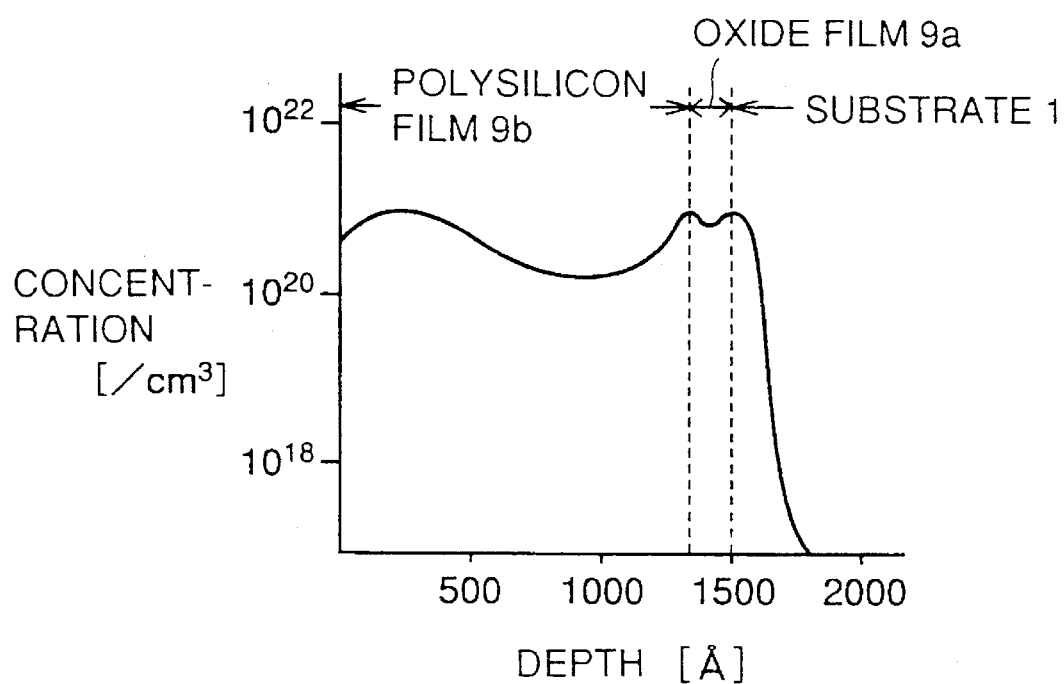
FIG. 31 is a graph showing nitrogen concentration distribution along the line I—I of the semiconductor device shown in FIG. 30.

Referring to FIGS. 30 to 39, the fifth embodiment of the present invention will now be described. The fifth embodiment is different from the first embodiment in the structure of sidewall oxide film 9. Other than that, the fifth embodiment is similar to the first embodiment. Referring to FIGS. 30, in the fifth embodiment, sidewall 9 is formed of an oxide film 9a and a polysilicon film 9b. Oxide film 9a has a perpendicular portion in contact with the side surface of gate electrode 8 and the side surface of gate insulating film 7, and a bottom portion in contact with the main surface of semiconductor substrate 1. Oxide film 9a has an approximately L-letter shaped longitudinal section. Polysilicon film 9b is formed in contact with the perpendicular portion and the bottom portion of oxide film 9a, and has nitrogen introduced therein. The nitrogen concentration distribution in the section along the line I—I shown in FIG. 30 peaks at the interface between polysilicon film 9b and oxide film 9a, and also in the vicinity of the surface of polysilicon film 9b, as shown in FIG. 31. There is also a peak at the interface between oxide film 9a and the main surface of semiconductor substrate 1.

It should be noted that the peak nitrogen concentration positioned at the interface between polysilicon film 9b and oxide film 9a and the peak nitrogen concentration positioned at the interface between oxide film 9a and the main surface of semiconductor substrate 1 are preferably set within the range of $1\times10^{19}$ atoms/cm$^3$~$1\times10^{21}$ atoms/cm$^3$, similar to the case of the first embodiment.

Referring to FIGS. 32 to 39, a method of manufacturing the semiconductor device of the fifth embodiment will now be described.

Figure 32:
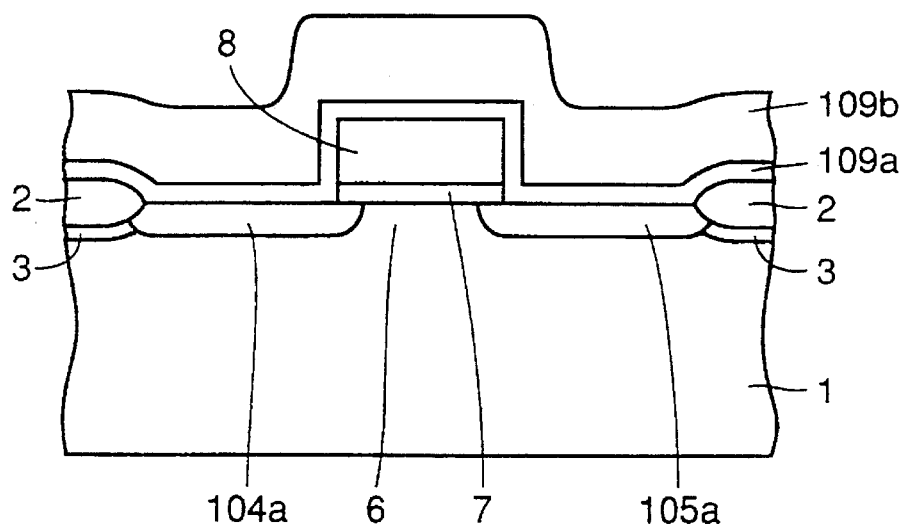
FIGS. 32, 33, and 37–39 are sectional views for device of the fifth embodiment shown in FIG. 30.

With the similar process to the manufacturing process of the first embodiment shown in FIGS. 3 to 5, gate electrode 8 and the pair of low impurity concentration diffusion regions 104a and 105a are formed. Then, as shown in FIG. 32, an oxide film 109a having a thickness of approximately 200 Å is formed on the surface of gate electrode 8 and on the pair of low impurity concentration diffusion regions 104a and 105a with a CVD method. A polysilicon layer 109b having a thickness of approximately 1000 Å is formed on the entire surface of oxide film 109a with a CVD method.

Figure 33:
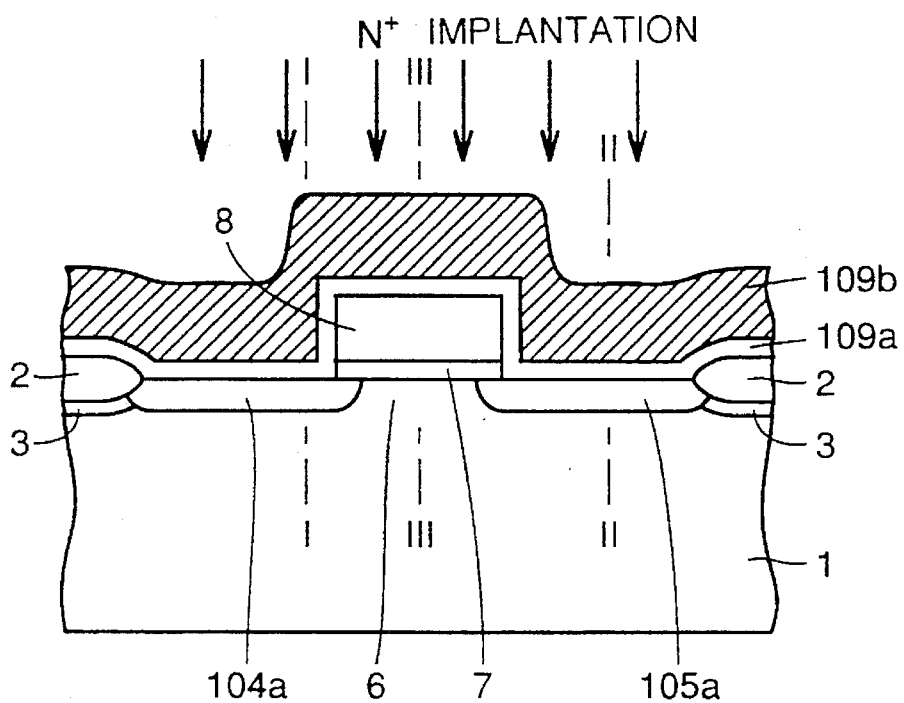
Figure 34:
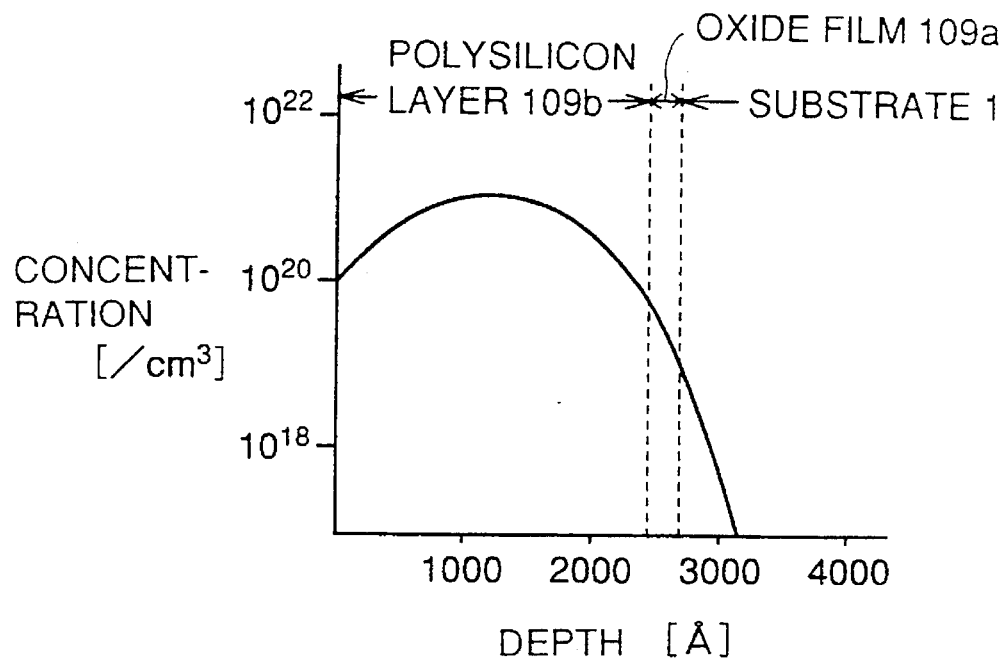
FIG. 34 is a graph showing nitrogen concentration distribution along the line I—I of the step shown in FIG. 33.
Figure 35:
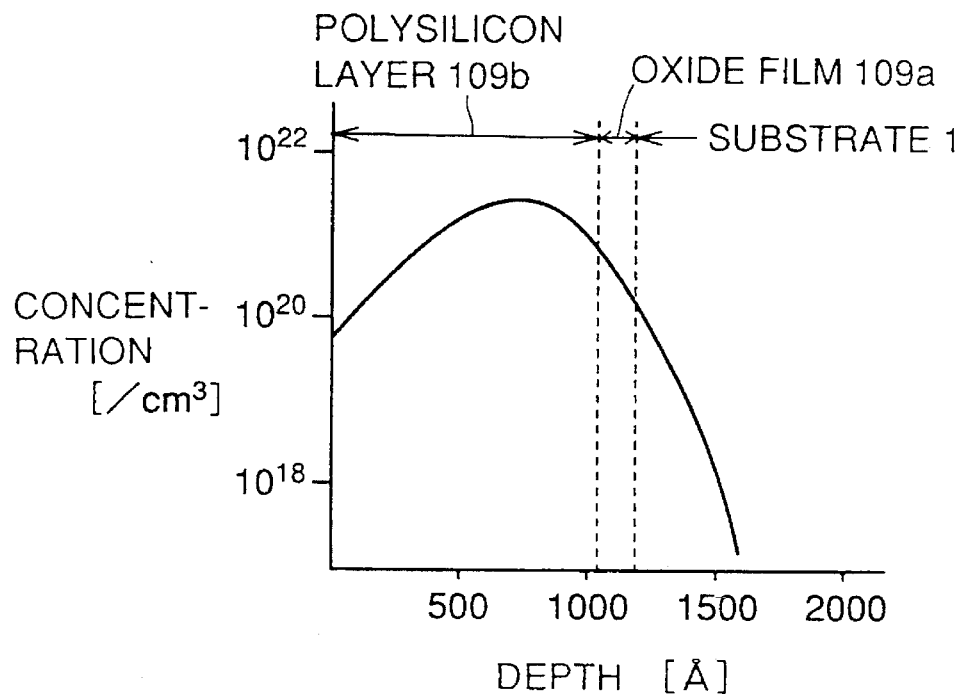
FIG. 35 is a graph showing nitrogen concentration distribution along the line II—II of the step shown in FIG. 33.
Figure 36:
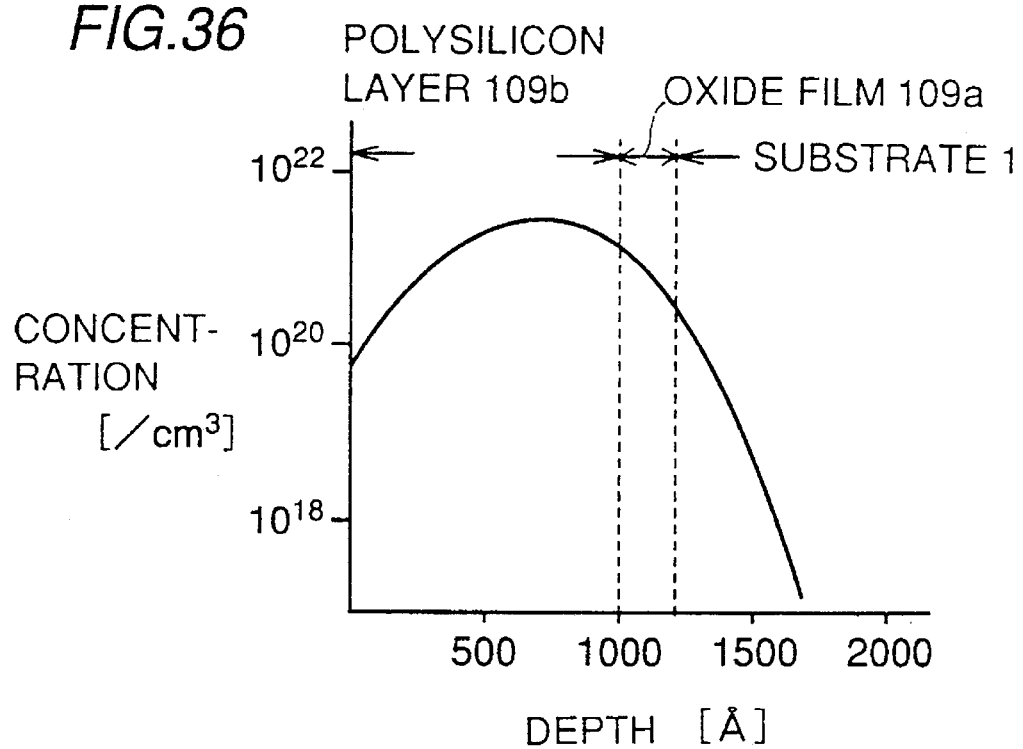
FIG. 36 is a graph showing nitrogen concentration distribution along the line III—III of the step shown in FIG. 33.
Figure 37:
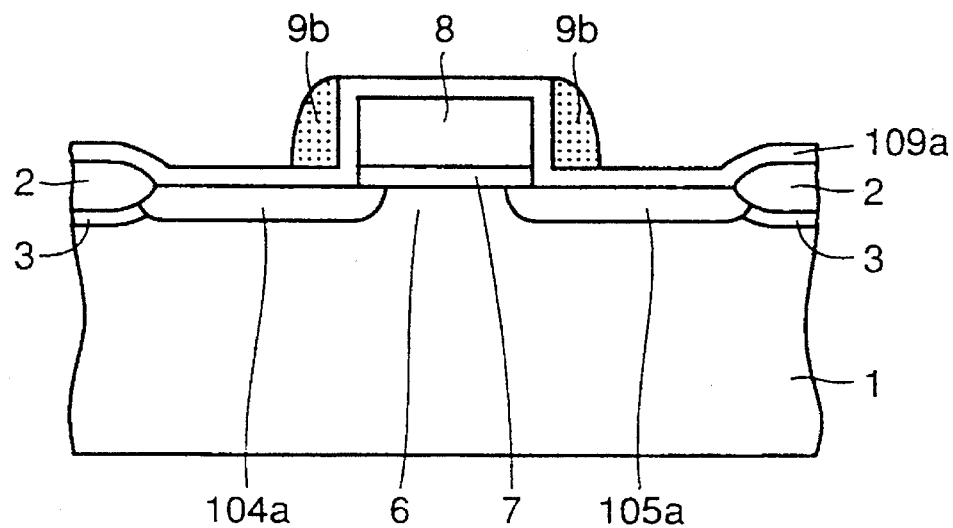

After that, as shown in FIG. 33, nitrogen ions (N$^+$) are implanted into polysilicon layer 109b through the surface thereof under the conditions of 30 keV and $4\times10^{15}$ atoms/cm$^2$ so that the center of projection range is positioned approximately at the center in polysilicon layer 109b. The nitrogen concentration distributions in polysilicon layer 109b and oxide film 109a at the time are shown in FIGS. 34 to 36. More specifically, the nitrogen concentration distributions in the sections along the lines I—I, II—II, and III—III shown in FIG. 33 are shown in FIGS. 34, 35, and 36, respectively. The peak shown in FIG. 34 results in the peak positioned on the surface side of polysilicon film 9b shown in FIG. 31. After the step shown in FIG. 33, by implementing anisotropic reactive ion etching on polysilicon layer 109b, polysilicon film 9b in contact with the bottom portion and the side surface of oxide film 109a shown in FIG. 37 is formed.

Figure 38:
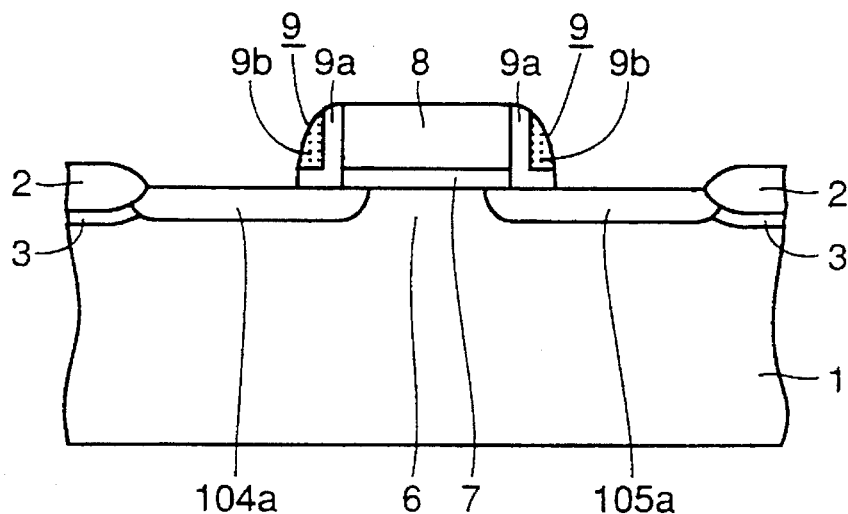

Further, as shown in FIG. 38, by implementing anisotropic reactive ion etching on oxide film 109a into which nitrogen is implanted, oxide film 9a is formed having a perpendicular portion in contact with the side surface of gate electrode 8 and the side surface of gate insulating film 7, and a bottom portion in contact with the pair of low impurity concentration diffusion regions 104a and 105a. As a result, sidewall 9 of oxide film 9a and polysilicon film 9b is formed.

Figure 39:
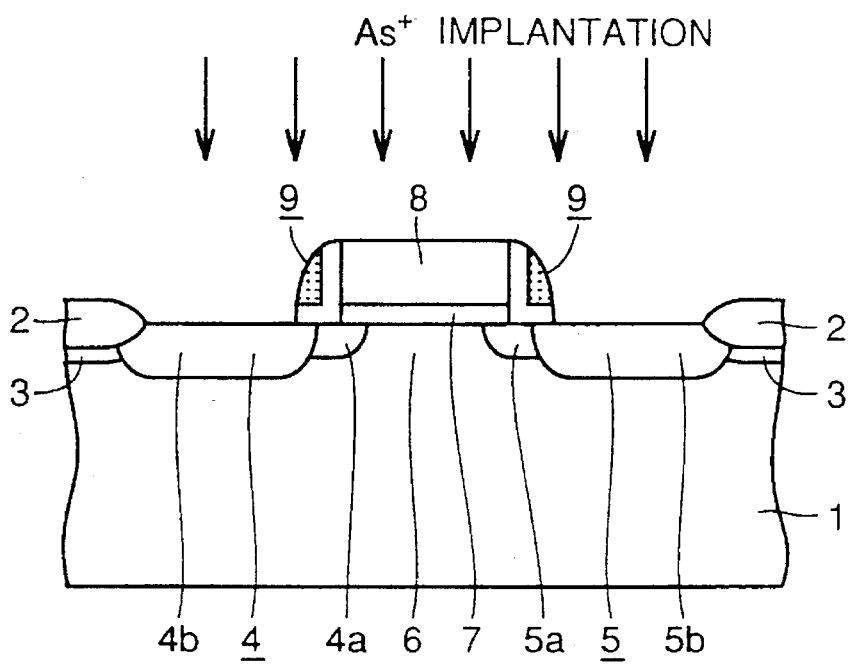

Then, as shown in FIG. 39, with gate electrode 8 and sidewall 9 used as part of a mask, N type impurity (for example, arsenic) ions are implanted into the main surface of semiconductor substrate 1 under the conditions of 50 keV and $4\times10^{15}$ atoms/cm$^2$. As a result, high impurity concentration diffusion regions 104b and 105b are formed. Then, by electrically activating the impurity by conducting heat treatment at 850° C. for approximately 20 minutes, the pair of source/drain regions 4 and 5 of low impurity concentration diffusion regions 4a and 5a, and high impurity concentration diffusion regions 4b and 5b are formed.

This heat treatment diffuses nitrogen in sidewall 9, resulting in segregation of nitrogen at the interface between polysilicon film 9b and oxide film 9a, and at the interface between oxide film 9a and the main surface of semiconductor substrate 1. As a result, the nitrogen concentration distribution as shown in FIG. 31 is obtained.

Then, as shown in FIG. 30, interlayer insulating film 10 is formed on the entire main surface of semiconductor substrate 1. Contact holes 10a and 10b are formed in interlayer insulating film 10. Interconnection layer 11 is formed so as to be electrically connected to source/drain region 4 through contact hole 10a, and interconnection layer 12 is formed so as to be electrically connected to source/drain region 5 through contact hole 10b. The semiconductor device of the fifth embodiment is thus completed.

In the semiconductor device of the fifth embodiment, the following effect can be further obtained in addition to the effects obtained by the above described first embodiment. More specifically, by configuring sidewall 9 of oxide film 9a and polysilicon film 9b, misalignment of a mask in forming contact holes 10a and 10b in interlayer insulating film 10, even if it should occur, does not cause polysilicon film 9b to be etched. As a result, the semiconductor device of the fifth embodiment has an advantage that interconnection layers 11 and 12 and gate electrode 8 can be electrically insulated reliably by sidewall 9.

Then, referring to FIGS. 40 and 41, the sixth embodiment of the present invention will be described. The sixth embodiment is different from the fifth embodiment only in that nitrogen ions are implanted into polysilicon layer 109b with a rotational oblique ion implantation method.

The manufacturing process of a semiconductor device of the sixth embodiment will be described hereinafter. With the similar process to that of the first embodiment shown in FIGS. 3 to 5, gate electrode 8 and the pair of low impurity concentration diffusion regions 104a and 105a are formed. Then, with the similar manufacturing process to that of the fifth embodiment shown in FIG. 32, oxide film 109a having a thickness of approximately 200 Å is formed on the surface of gate electrode 8 and on the pair of low impurity concentration diffusion regions 104a and 105a with a CVD method. Then, polysilicon layer 109b having a thickness of approximately 1000 Å is formed on the entire surface of oxide film 109a with a CVD method.

Figure 40:
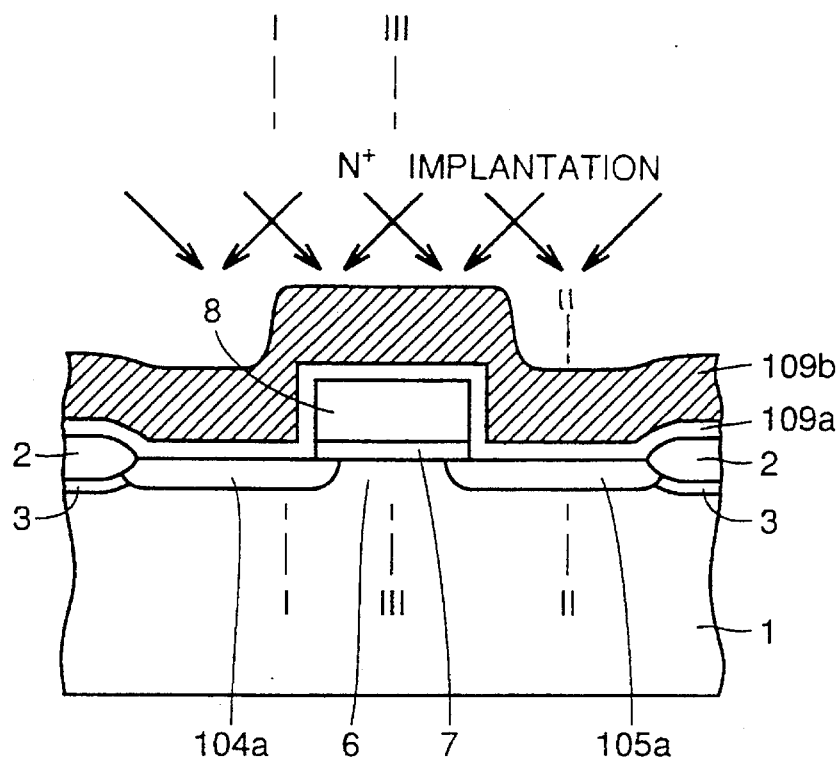
FIG. 40 is a sectional view for explaining the manufacturing process of a semiconductor device according to a sixth embodiment of the present invention.

Then, as shown in FIG. 40, nitrogen ions (N$^+$) are implanted into polysilicon layer 109b through the surface thereof under the conditions of 40 keV and $5.6\times10^{15}$ atoms/cm$^2$ so that the center of projection range is positioned approximately at the center in polysilicon layer 109b. The nitrogen concentration distribution in the section along the line I—I in polysilicon layer 109b at the time is shown in FIG. 41. Note that the nitrogen concentration distributions in the sections along the lines II—II and III—III shown in FIG. 40 are the same as those of the fifth embodiment shown in FIGS. 35 and 36.

Figure 41:
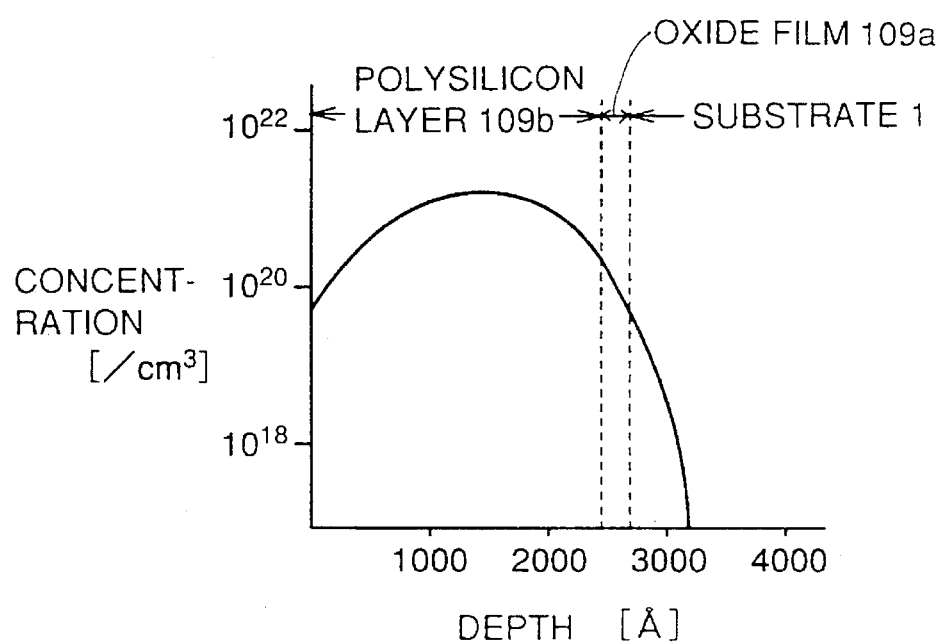
FIG. 41 is a graph showing nitrogen concentration distribution along the line I—I of the step shown in FIG. 40.

Comparison of FIG. 41 with FIG. 34 shows that, in the sixth embodiment, the nitrogen concentration is higher in the vicinity of the interface between polysilicon layer 109b and oxide film 109a in the section along the line I—I than in the fifth embodiment.

After the step shown in FIG. 40, the semiconductor device of the sixth embodiment is completed through the same steps as those of the above described fifth embodiment. In the sixth embodiment, the following effect is expected in addition to the similar effects to those of the fifth embodiment. More specifically, by implanting nitrogen into polysilicon layer 109b with a rotational oblique ion implantation method, the nitrogen concentration in oxide film 9a close to the end portion of gate insulating film 7 can be set higher than the case of the fifth embodiment. This makes the nitrogen concentration peak at the interface between sidewall 9 and the main surface of semiconductor substrate 1 higher than the case of the fifth embodiment, resulting in further improvement of the hot carrier resistance.

Referring to FIGS. 42 to 49, the seventh embodiment of the present invention will be described. In the seventh embodiment, nitrogen is introduced not only in sidewall oxide film 9, but also in the pair of source/drain regions 4 and 5, gate insulating film 7, and gate electrode 8. Other than that, the seventh embodiment is similar to the first embodiment.

Figure 42:
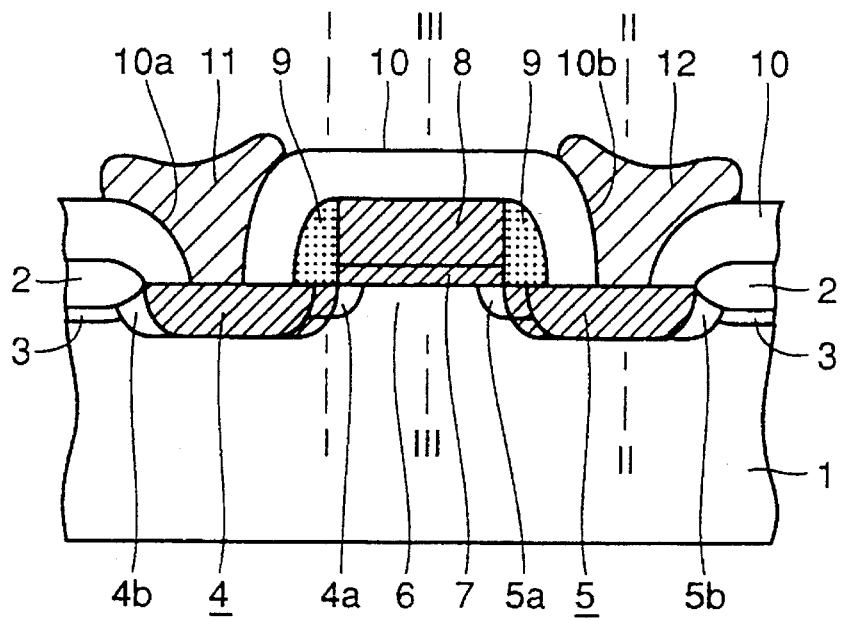
FIG. 42 is a sectional view showing a semiconductor device according to a seventh embodiment of the present invention.
Figure 43:
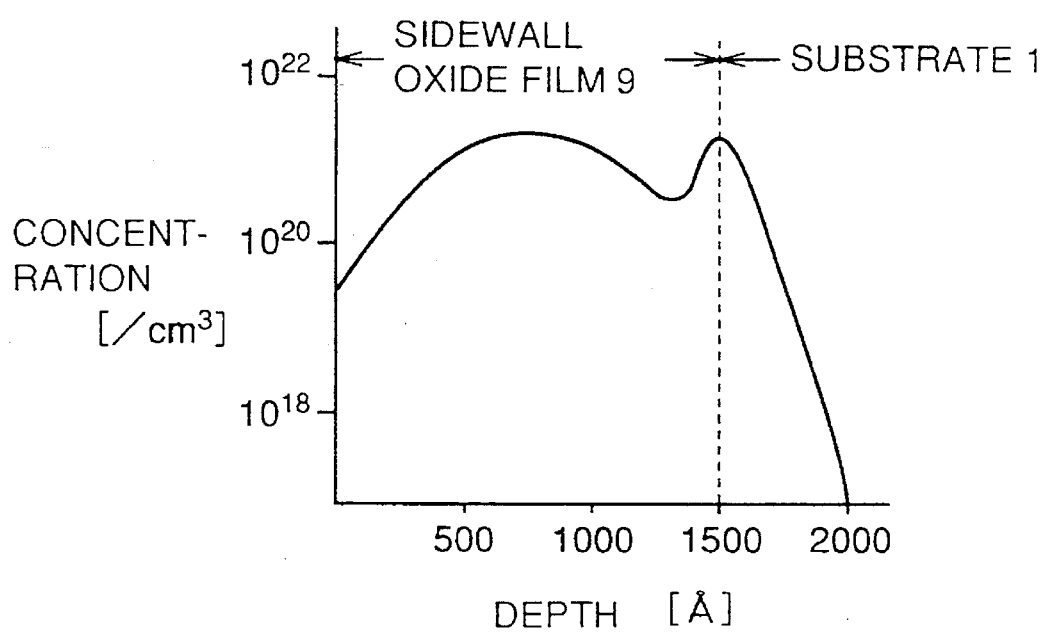
FIG. 43 is a graph showing nitrogen concentration distribution along the line I—I of the semiconductor device shown in FIG. 42.
Figure 44:
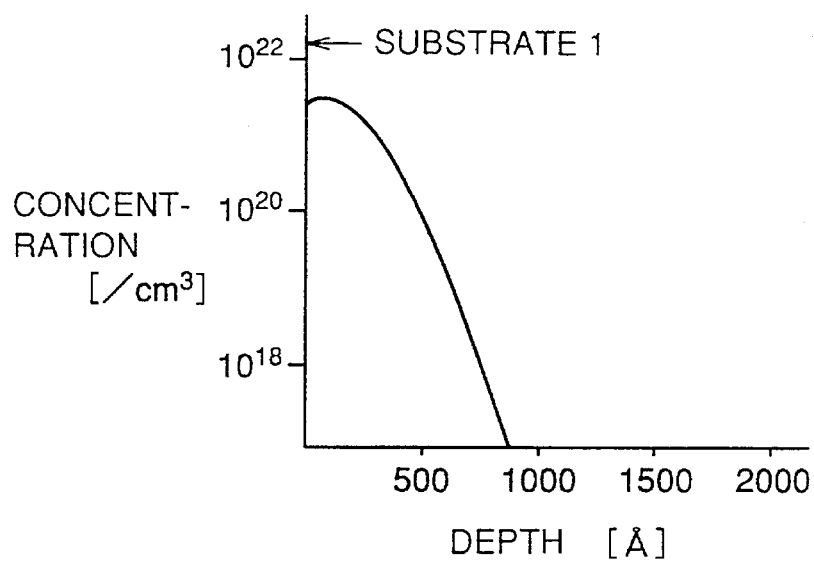
FIG. 44 is a graph showing nitrogen concentration distribution along the line II—II of the semiconductor device shown in FIG. 42.
Figure 45:
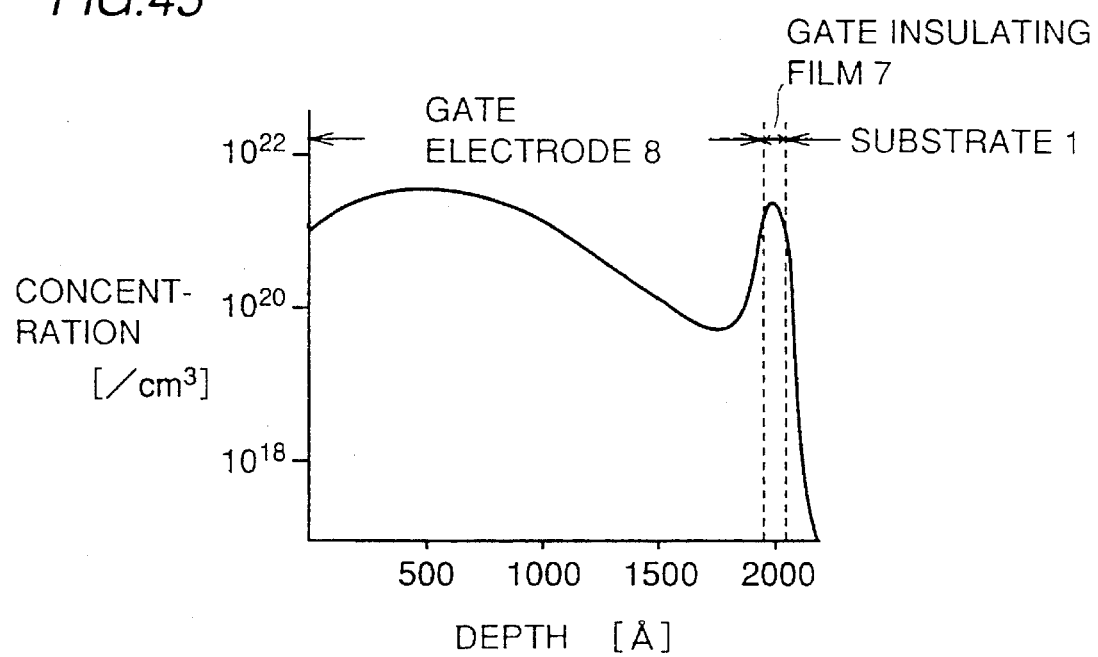
FIG. 45 is a graph showing nitrogen concentration distribution along the line III—III of the semiconductor device of the seventh embodiment shown in FIG. 42.

The nitrogen concentration distributions in the I—I section, the II—II section, and the III—III section shown in FIG. 42 are shown in FIGS. 43, 44, and 45, respectively. Referring to FIG. 44, in the nitrogen concentration distribution in the II—II section, there is a peak in the vicinity of the main surface of semiconductor substrate 1, and the nitrogen concentration is gradually decreased as the depth from the main surface of semiconductor substrate 1 increases. The nitrogen concentration in the III—III section peaks in gate insulating film 7, and also in the vicinity of the upper surface of gate electrode 8. Further, as shown in FIG. 43, in the nitrogen concentration distribution in the I—I section, there is a peak at the interface between semiconductor substrate 1 and sidewall oxide film 9, and there is also a peak at a position upper than the former peak.

The manufacturing process of the semiconductor device of the seventh embodiment will now be described with reference to FIG. 46. With the similar process to the manufacturing process of the first embodiment shown in FIGS. 3 to 6, gate electrode 8 and the pair of low impurity concentration diffusion regions 104a and 105a are formed. Oxide film 9 having a thickness of approximately 1000 Å is formed on the surface of gate electrode 8 and on the pair of low impurity concentration diffusion regions 104a and 105a with a CVD method.

Figure 46:
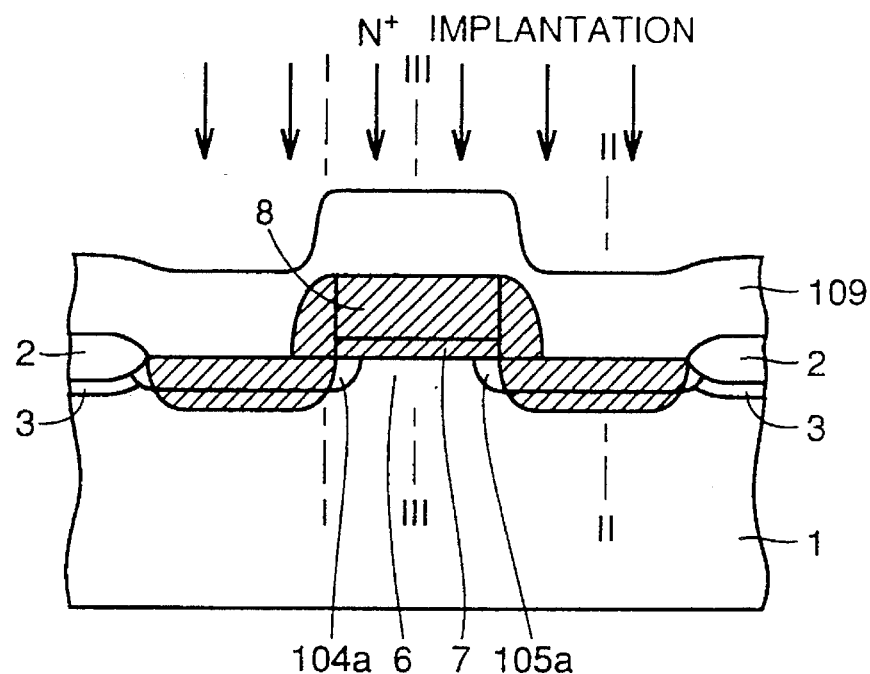
FIG. 46 is a sectional view for explaining the manufacturing process of the semiconductor device of the seventh embodiment shown in FIG. 42.
Figure 47:
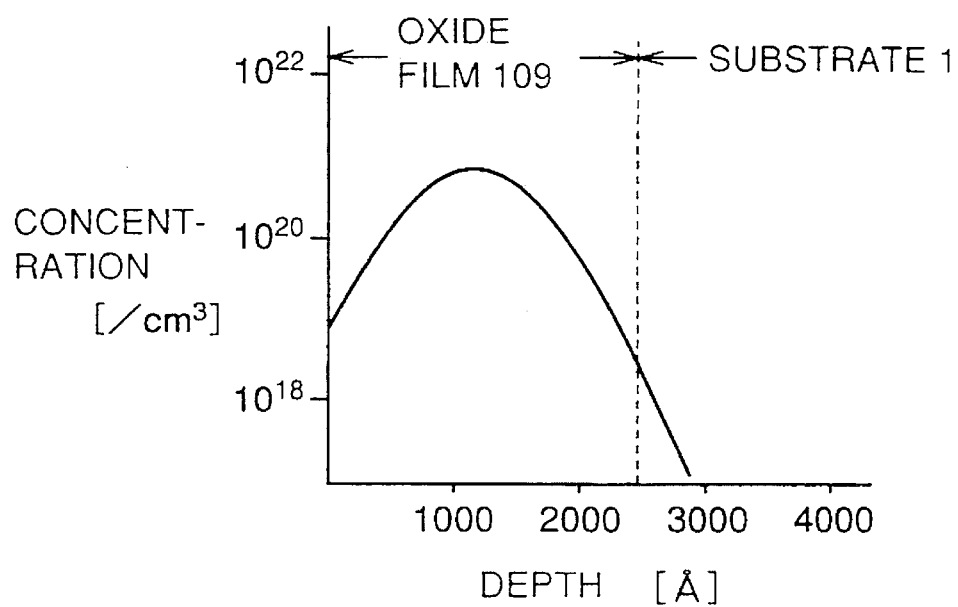
FIG. 47 is a graph showing nitrogen concentration distribution along the line I—I of the step shown in FIG. 46.
Figure 48:
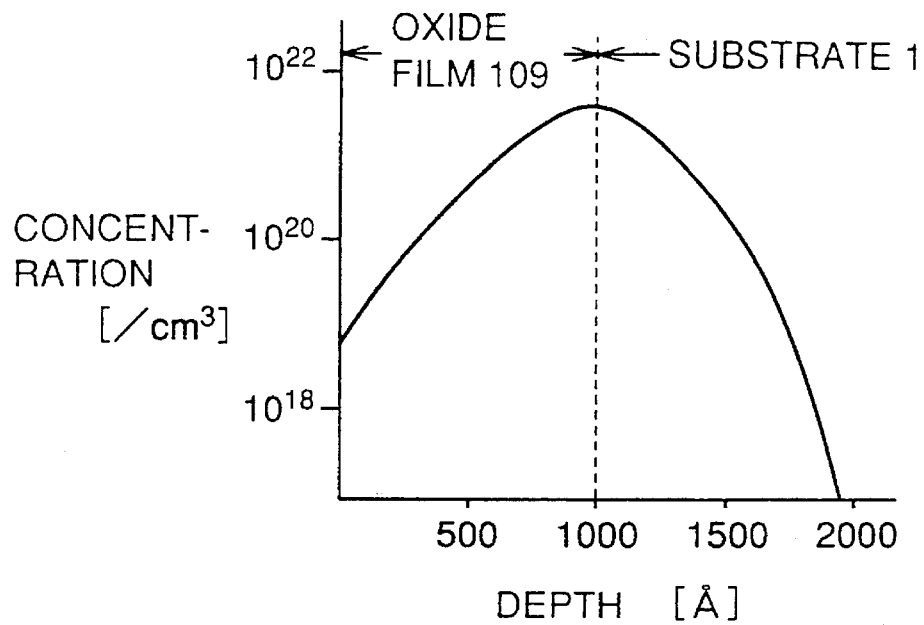
FIG. 48 is a graph showing nitrogen concentration distribution in a section along the line II—II of the step shown in FIG. 46.
Figure 49:
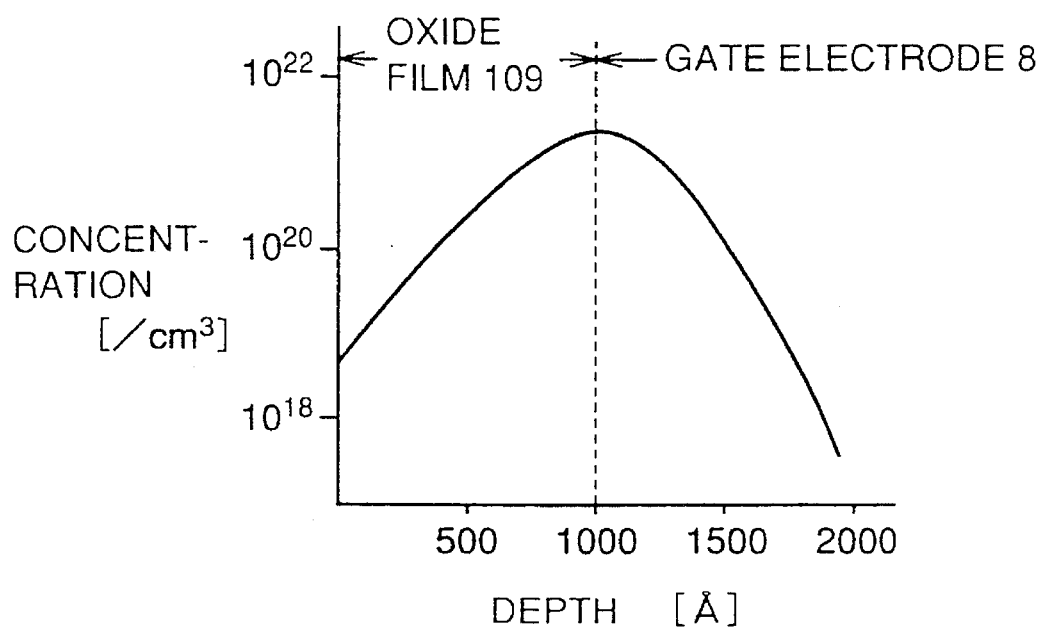
FIG. 49 is a graph showing nitrogen concentration distribution in a section along the line III—III of the step shown in FIG. 46.

Then, as shown in FIG. 46, nitrogen ions ($N^+$) are implanted into oxide film 9, gate electrode 8, and the pair of low impurity concentration diffusion regions 104a and 105a through the surface of oxide film 109 under the conditions of 100 keV and $4 \times 10^{15}$ atoms/cm$^2$ so that the center of projection range is positioned in oxide film 109, gate electrode 8, and the pair of low impurity concentration diffusion regions 104a and 105a. The nitrogen concentration distributions in the I—I section, the II—II section, and the III—III section in the step shown in FIG. 46 are shown in FIGS. 47, 48, and 49, respectively. The peak shown in FIG. 47 results in the peak positioned on the side of sidewall oxide film 9 shown in FIG. 43, and the peak shown in FIG. 49 results in the peak positioned on the surface side of gate electrode 8 shown in FIG. 45.

When the standard deflection of the projection range Rp of nitrogen is ΔRp, the projection range Rp of nitrogen is so set that it is positioned upper than a position which is distant from the interface between gate electrode 8 and gate insulating film 7 by 5×ΔRp, and that it is positioned upper than the projection range of arsenic for forming low impurity concentration diffusion regions 104a and 105a. By setting the projection range Rp as described above, gate insulating film 7 can be prevented from being damaged from implantation of nitrogen. Further, by setting the projection range Rp as described above, defects caused by implantation of nitrogen are generated at a junction surface between low impurity concentration diffusion regions 104a and 105a and semiconductor substrate 1. Therefore, generation of junction leakage current can be effectively prevented at the time of operation of the MOS transistor.

After the step shown in FIG. 46, with the similar process to the manufacturing process of the first embodiment shown in FIGS. 11 and 12, anisotropic reactive ion etching is implemented on oxide film 109 so that sidewall oxide film 9 is formed. With gate electrode 8 and sidewall oxide film 9 used as part of a mask, arsenic ions are implanted into the main surface of semiconductor substrate 1 under the conditions of 50 keV and $4 \times 10^{15}$ atoms/cm$^2$ so that high impurity concentration diffusion regions 104b and 105b are formed. By electrically activating arsenic ions by conducting heat treatment at 850° C. for approximately 20 minutes, the pair of source/drain regions 4 and 5 of low impurity concentration diffusion regions 4a and 5a, and high impurity concentration diffusion regions 4b and 5b are formed.

This heat treatment diffuses nitrogen in sidewall oxide film 9, causing nitrogen to segregate at the interface between sidewall oxide film 9 and the main surface of semiconductor substrate 1. As a result, the nitrogen concentration distribution having a peak at the interface between sidewall oxide film 9 and the main surface of semiconductor substrate 1 as shown in FIG. 43 is obtained. Further, this heat treatment diffuses nitrogen in gate electrode 8 towards gate insulating film 7, causing nitrogen to segregate in gate insulating film 7. As a result, the nitrogen concentration distribution having a peak in gate insulating film 7 as shown in FIG. 45 is obtained.

After the step shown in FIG. 46, interlayer insulating film 10 is formed on the entire main surface of semiconductor substrate 1, as shown in FIG. 42. Contact holes 10a and 10b are formed in interlayer insulating film 10. Interconnection layer 11 is formed so as to be electrically connected to source/drain region 4 through contact hole 10a, and interconnection layer 12 is formed so as to be electrically connected to source/drain region 5 through contact hole 10b. As a result, the semiconductor device of the seventh embodiment is completed. Also by the semiconductor device of the seventh embodiment structured as described above, the following effect can be expected in addition to the similar effects to those of the above described first embodiment. More specifically, because of nitrogen also precipitated in gate insulating film 7, generation of an interface state in gate insulating film 7 can be better suppressed, resulting in more improvement of the hot carrier resistance. Further, nitrogen also introduced in the pair of source/drain regions 4 and 5 contributes to suppression of diffusion of arsenic, resulting in suppression of diffusion of arsenic towards channel region 6. The effective gate length can be increased, and an N channel type MOS transistor can be obtained in which a punch-through phenomenon by the short channel effect is less likely to occur. This is caused by the fact that the diffusion mechanism of nitrogen is the vacancy diffusion similar to that of N type impurity (arsenic), and that the diffusion coefficient of nitrogen is larger than that of N type impurity. Therefore, when nitrogen and N type impurity are mutually diffused, nitrogen first occupies the vacancy serving as a diffusion path. Accordingly, diffusion of N type impurity is suppressed.

Figure 50:
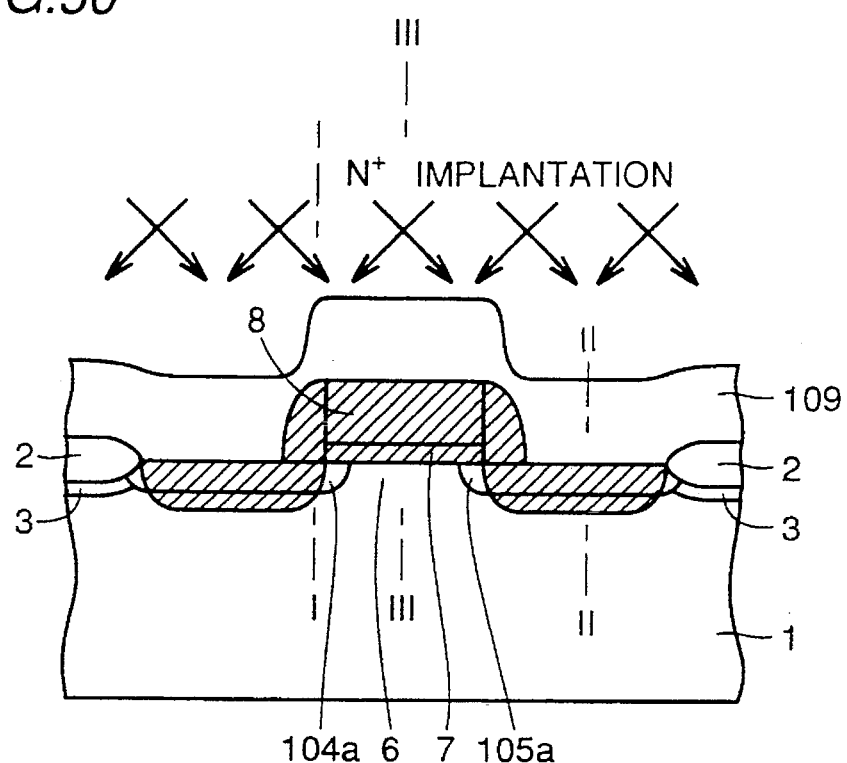
FIG. 50 is a sectional view for explaining the manufacturing process of a semiconductor device according to an eighth embodiment of the present invention.
Figure 51:
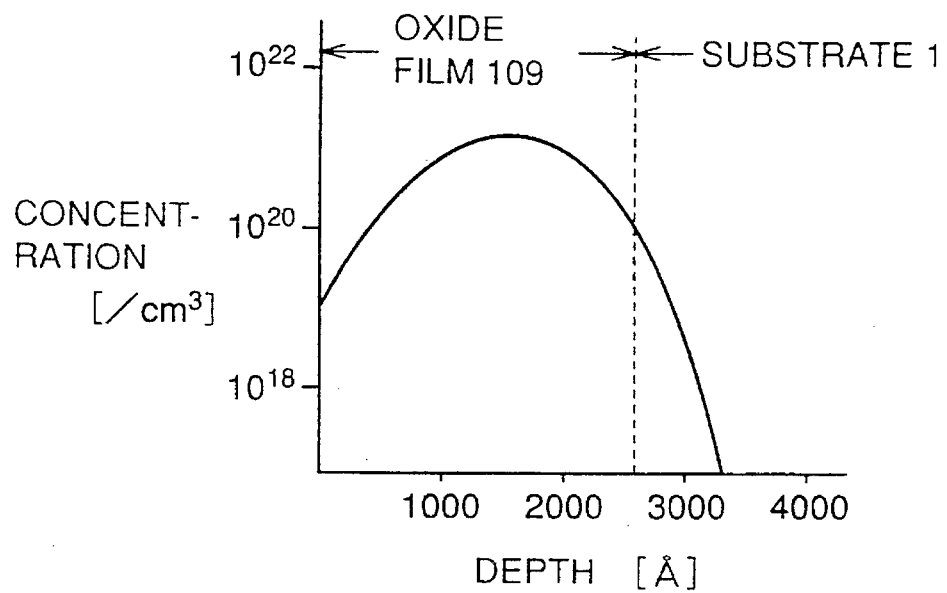
FIG. 51 is a graph showing nitrogen concentration distribution in a section along the line I—I of the step shown in FIG. 50.

Referring to FIGS. 50 and 51, the eighth embodiment of the present invention will now be described. In the eighth embodiment, implantation of nitrogen into oxide film 109 of the above described seventh embodiment is carried out with a rotational oblique ion implantation method. Other than that, the eighth embodiment is similar to the seventh embodiment. Rotational oblique ion implantation in the eighth embodiment is carried out as follows. More specifically, taking the similar conditions as those of the seventh embodiment into consideration, nitrogen ions ($N^+$) are implanted into oxide film 109, gate electrode 8, and the pair of low impurity concentration diffusion regions 104a and 105a through the surface of oxide film 109 under the conditions of 140 keV and $5.6 \times 10^{15}$ atom/cm$^2$, as shown in FIG. 50. The nitrogen concentration distribution along the I—I section shown in FIG. 50 at the time is shown in FIG. 51. It should be noted that the nitrogen concentration distributions along the II—II section and the III—III section shown in FIG. 50 are similar to those of the seventh embodiment shown in FIGS. 44 and 45, respectively. Comparison of FIG. 51 of the eighth embodiment and FIG. 47 of the seventh embodiment shows that the nitrogen concentration in the vicinity of the interface between oxide film 109 and the main surface of semiconductor substrate 1 is higher in the eighth embodiment than in the seventh embodiment.

After the nitrogen implantation step shown in FIG. 50, a semiconductor device (not shown) of the eighth embodiment is completed with a process similar to that of the above described seventh embodiment. In the eighth embodiment structured as described above, the following effect can be obtained in addition to the similar effects as those of the seventh embodiment. More specifically, the nitrogen concentration in a portion of sidewall 9 close to the end portion of gate insulating film 7 becomes higher than that of the seventh embodiment, because nitrogen is implanted with a rotational oblique ion implantation method. As a result, the nitrogen concentration at the interface between sidewall oxide film 9 and the main surface of semiconductor substrate 1 is also higher than the case of the seventh embodiment, thereby further increasing the hot carrier resistance than the case of the seventh embodiment.

Figure 52:
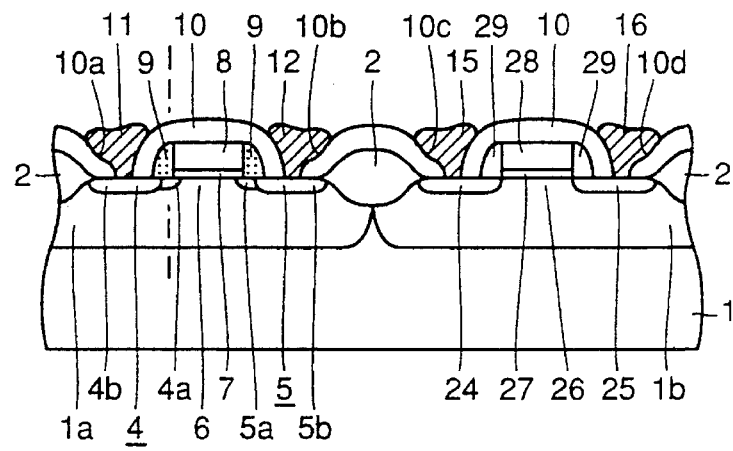
Fig. 52 is a sectional view showing a semiconductor device according to a ninth embodiment of the present invention.

The ninth embodiment of the present invention will be described with reference to FIGS. 52 to 60. Referring to FIG. 52, in a semiconductor device of the ninth embodiment, an N channel type MOS transistor and a P channel type MOS transistor are formed adjacent to each other on the main surface of semiconductor substrate 1. In detail, on the main surface of semiconductor substrate 1 of a P type silicon substrate, a P well region 1a and an N well region 1b are formed adjacent to each other. Element isolation oxide film 2 is formed so as to surround an N channel type MOS transistor forming region and a P channel type MOS transistor forming region. The pair of first source/drain regions 4 and 5 are formed sandwiching first channel region 6 on the main surface of P well region 1a. First source/drain region 4 is configured of low impurity concentration diffusion region 4a and high impurity concentration diffusion region 4b. First source/drain region 5 is configured of low impurity concentration diffusion region 5a and high impurity concentration diffusion region 5b. First gate electrode 8 is formed on first channel region 6 with first gate insulating film 7 interposed therebetween. First sidewall oxide film 9 in which nitrogen is introduced is formed on the side surface of first gate electrode 8. The nitrogen concentration distribution along the I—I section of first sidewall oxide film 9 is the same as the nitrogen concentration distribution of the first embodiment shown in FIG. 2. It should be noted that the N channel type MOS transistor is configured of the pair of source/drain regions 4 and 5, first gate electrode 8, and first sidewall oxide film 9.

The peak nitrogen concentration positioned at the interface between first sidewall oxide film 9 and the main surface of semiconductor substrate 1 is preferably set within the range of $1 \times 10^{19}$ atoms/cm$^3 \sim 1 \times 10^{21}$ atoms/cm$^3$. If the peak nitrogen concentration is set lower than $1 \times 10^{19}$ atoms/cm$^3$, an interface state at the interface between first sidewall oxide film 9 and the main surface of semiconductor substrate 1 is not well suppressed. If the peak nitrogen concentration is set higher than $1 \times 10^{21}$ atoms/cm$^3$, degradation of transistor characteristics occurs such as degradation of the mobility of channel electrons and increase in resistance of source/drain regions 4 and 5 caused by decrease of the activation rate of impurity in source/drain regions 4 and 5. This is a reason why the peak nitrogen concentration is desirably set within the above described range.

A pair of second source/drain regions 24 and 25 are formed sandwiching a second channel region 26 on the main surface of N well region 1b. A second gate electrode 28 is formed on second channel region 26 with a second gate insulating film 27 interposed therebetween. A second sidewall oxide film 29 is formed in contact with the side surface of second gate electrode 28 and the side surface of second gate insulating film 27. The P channel type MOS transistor is configured of the pair of second source/drain regions 24 and 25, second gate electrode 28, and second sidewall oxide film 29.

Interlayer insulating film 10 is formed so as to cover element isolation oxide film 2, the pair of first source/drain regions 4 and 5, first gate electrode 8, first sidewall oxide film 9, the pair of second source/drain regions 24 and 25, second gate electrode 28, and second sidewall oxide film 29. Contact holes 10a and 10b, and 10c and 10d are formed in regions of interlayer insulating film 10 positioned on first source/drain regions 4 and 5, and second source/drain regions 24 and 25, respectively. Interconnection layer 11 is formed so as to be electrically connected to first source/drain region 4 through contact hole 10a, and interconnection layer 12 is formed so as to be electrically connected to first source/drain region 5 through contact hole 10b. Further, an interconnection layer 15 is formed so as to be electrically connected to second source/drain region 24 through contact hole 10c, and an interconnection layer 16 is formed so as to be electrically connected to second source/drain region 25. Interconnection layers 11, 12, 15, and 16 are formed of a conductive material such as aluminum and polysilicon.

Referring to FIGS. 53 to 60, description will be given of a method of manufacturing the semiconductor device of the ninth embodiment.

Figure 53:
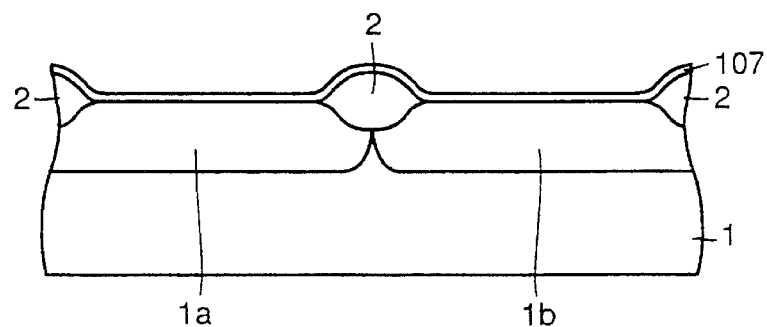
FIGS. 53–60 are sectional views for explaining the manufacturing process of the semiconductor device of the ninth embodiment shown in FIG. 52.

First, referring to FIG. 53, on the main surface of semiconductor substrate 1, P well region 1a is formed including an N channel type MOS transistor forming region, and N well region 1b is formed including a P channel type MOS transistor forming region. Further, element isolation oxide film 2 is formed with an ordinary technique so as to surround the N channel type MOS transistor forming region and the P channel type MOS transistor forming region. Then, an oxide film 107 having a thickness of approximately 100 Å formed into first gate insulating film 7 and second gate insulating film 27 is formed on the entire main surface of semiconductor substrate 1.

Figure 54:
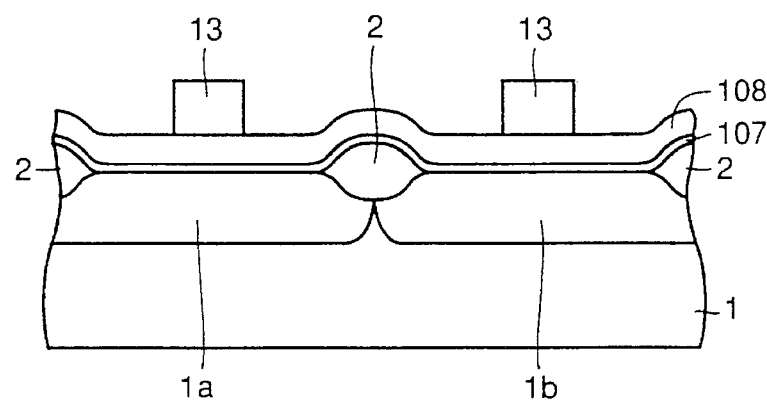

Then, as shown in FIG. 54, a polysilicon layer 108 formed into first gate electrode 8 and second gate electrode 28 is formed to have a thickness of approximately 1000 Å, for example, on the entire upper surface of oxide film 107. Resist pattern 13 of photoresist is formed in a predetermined region on polysilicon layer 18. With resist pattern 13 used as a mask, polysilicon layer 108 and oxide film 107 are anisotropically etched, in order to form first gate electrode 8, second gate electrode 28, first gate insulating film 7, and second gate insulating film 27. After that, resist pattern 13 is removed.

Figure 55:
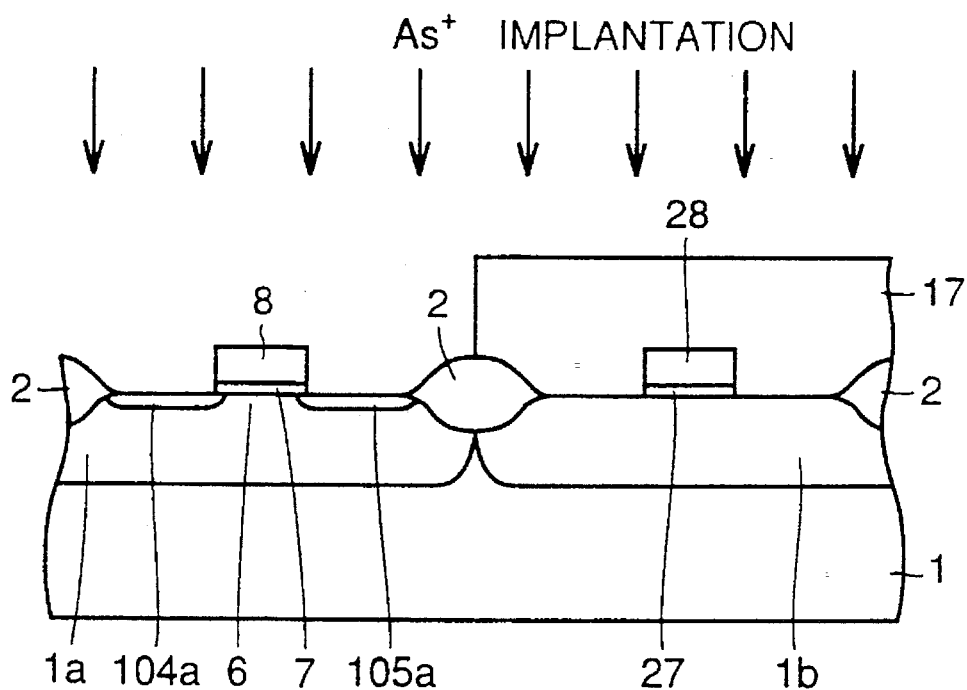

Then, as shown in FIG. 55, resist 17 is applied onto the P channel type MOS transistor forming region. With resist 17 and first gate electrode 8 used as part of a mask, N type impurity (arsenic) ions are implanted into the main surface of P well region 1a under the conditions of 50 keV and $5 \times 10^{13}$ atoms/cm$^2$. As a result, the pair of low impurity concentration diffusion regions 104a and 105a are formed. Then, resist 17 is removed.

Figure 56:
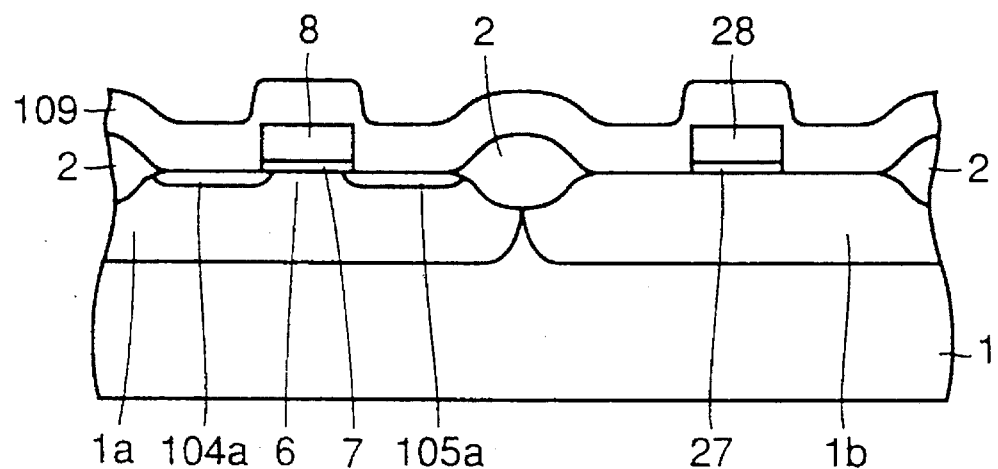

As shown in FIG. 56, oxide film 109 having a thickness of approximately 1000 Å is formed so as to cover the entire surface.

Figure 57:
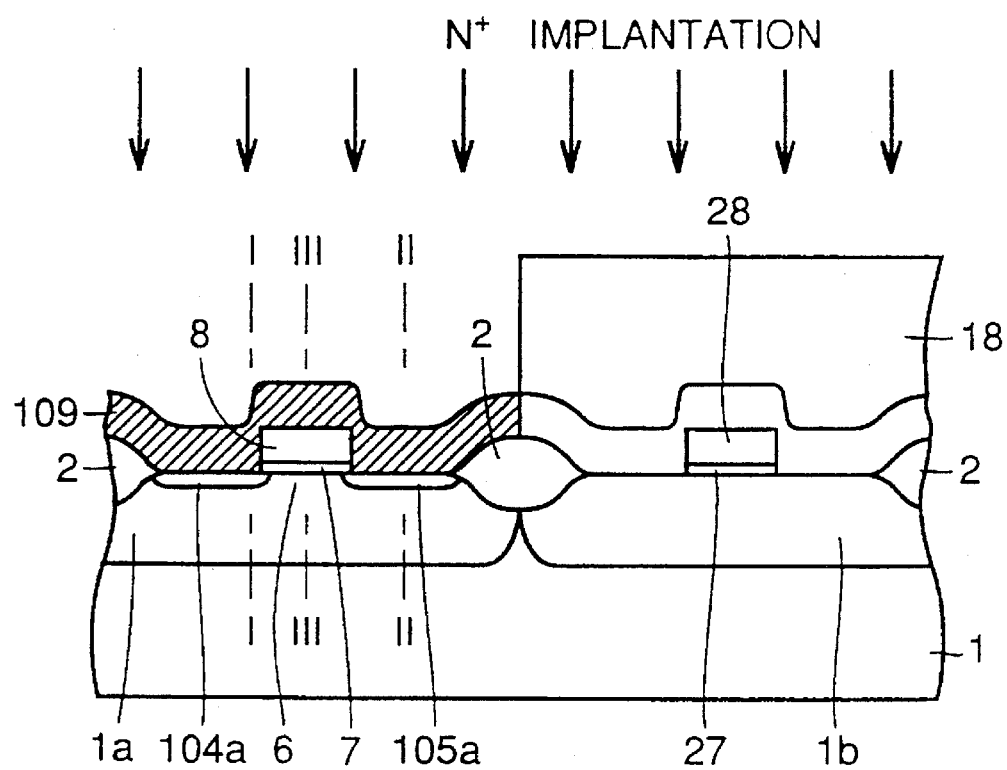
Figure 58:
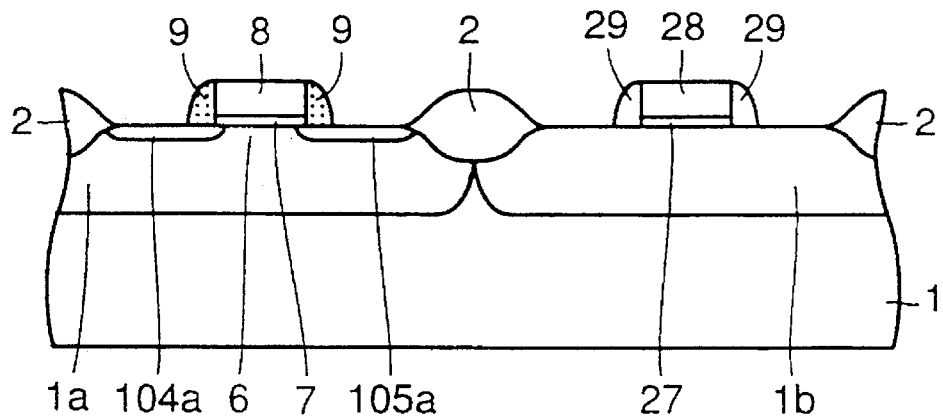

Then, as shown in FIG. 57, oxide film 109 on the P channel type MOS transistor forming region is covered with resist 18. With resist 18 used as a mask, nitrogen ions (N$^+$) are implanted into oxide film 109 under the conditions of 30 keV and $4 \times 10^{15}$ atoms/cm$^2$ so that the center of projection range is positioned approximately at the center in oxide film 109. The nitrogen concentration distributions in oxide film 109 on the N channel type MOS transistor forming region at this time are the same as those of the first embodiment shown in FIGS. 8 to 10. Then, resist 18 is removed. Then, anisotropic reactive ion etching is implemented on oxide film 109, so that first sidewall oxide film 9 in which nitrogen is introduced and second sidewall oxide film 29 in which nitrogen is not implanted are formed, as shown in FIG. 58.

Figure 59:
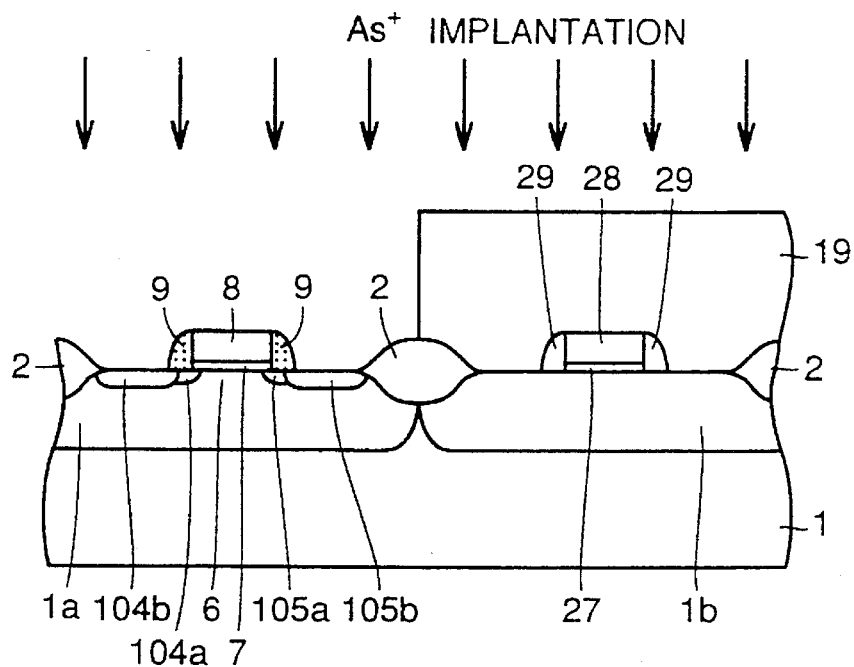

As shown in FIG. 59, resist 19 is applied onto the P channel type MOS transistor forming region. With resist 19, first gate electrode 8, and first sidewall oxide film 9 used as part of a mask, N type impurity (for example, arsenic) ions are implanted into the main surface of semiconductor substrate 1 under the conditions of 50 keV and $4 \times 10^{15}$ atoms/cm$^2$. As a result, high impurity concentration diffusion regions 104b and 105b are formed. After that, resist 19 is removed.

Figure 60:
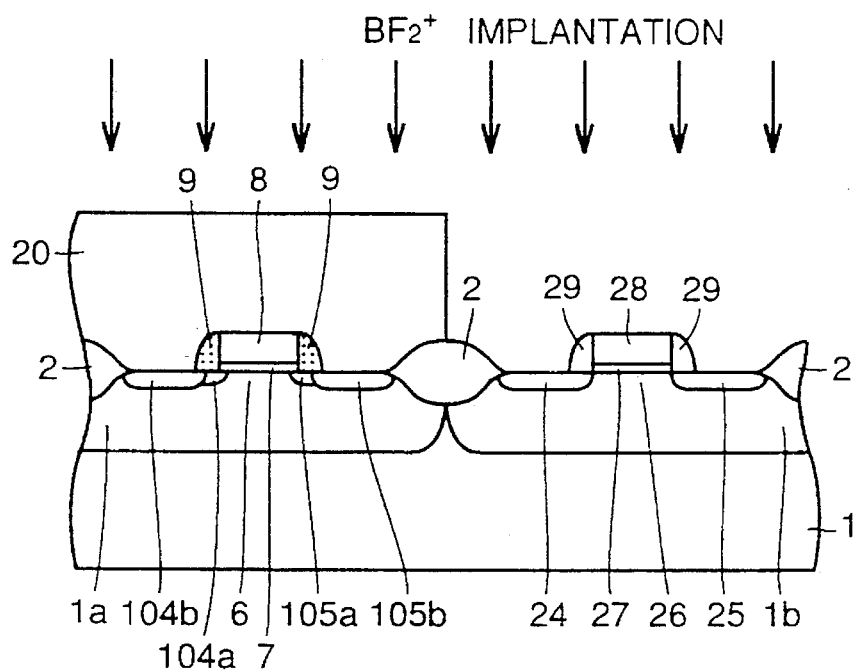

Then, as shown in FIG. 60, the N channel type MOS transistor forming region is covered with resist 20. With resist 20, second gate electrode 28, and second sidewall oxide film 29 used as part of a mask, P type impurity (BF$_2^+$) ions are implanted into the main surface of semiconductor substrate 1 under the conditions of 20 keV and $4 \times 10^{15}$ atoms/cm$^2$. As a result, second source/drain regions 24 and 25 are formed.

By electrically activating arsenic ions and BF$_2$ ions by heat treatment at 850° C. for 20 minutes, the pair of first source/drain regions 4 and 5 of low impurity concentration diffusion regions 4a and 5a and high impurity concentration diffusion regions 4b and 5b are formed, and second source/drain regions 24 and 25 are formed.

This heat treatment diffuses nitrogen in first sidewall oxide film 9, causing nitrogen to segregate at the interface between first sidewall oxide film 9 and the main surface of semiconductor substrate 1. As a result, the nitrogen concentration distribution having a peak at the interface between first sidewall oxide film 9 and the main surface of semiconductor substrate 1 is obtained, similar to the nitrogen concentration distribution of the first embodiment shown in FIG. 2.

As described above, the N channel type MOS transistor having the pair of source/drain regions 4 and 5, first gate insulating film 7, first gate electrode 8, and first sidewall oxide film 9 into which nitrogen is implanted is obtained, and the P channel type MOS transistor having the pair of second source/drain regions 24 and 25, second gate insulating film 27, second gate electrode 28, and second sidewall oxide film 29 is obtained.

After forming interlayer insulating film 10 as shown in FIG. 52, contact holes 10a to 10d are formed in interlayer insulating film 10. Interconnection layer 11 electrically connected to first source/drain region 4 through contact hole 10a, interconnection layer 12 electrically connected to first source/drain region 5 through contact hole 10b, interconnection layer 15 electrically connected to second source/drain region 24 through contact hole 10c, and interconnection layer 16 electrically connected to second source/drain region 25 through contact hole 10d are formed. The semiconductor device of the ninth embodiment is thus completed.

In the semiconductor device of the ninth embodiment, the nitrogen concentration distribution has a peak at the interface between first sidewall oxide film 9 and the main surface of semiconductor substrate 1. Therefore, the ninth embodiment has the similar effects to those of the above described first embodiment.

Figure 61:
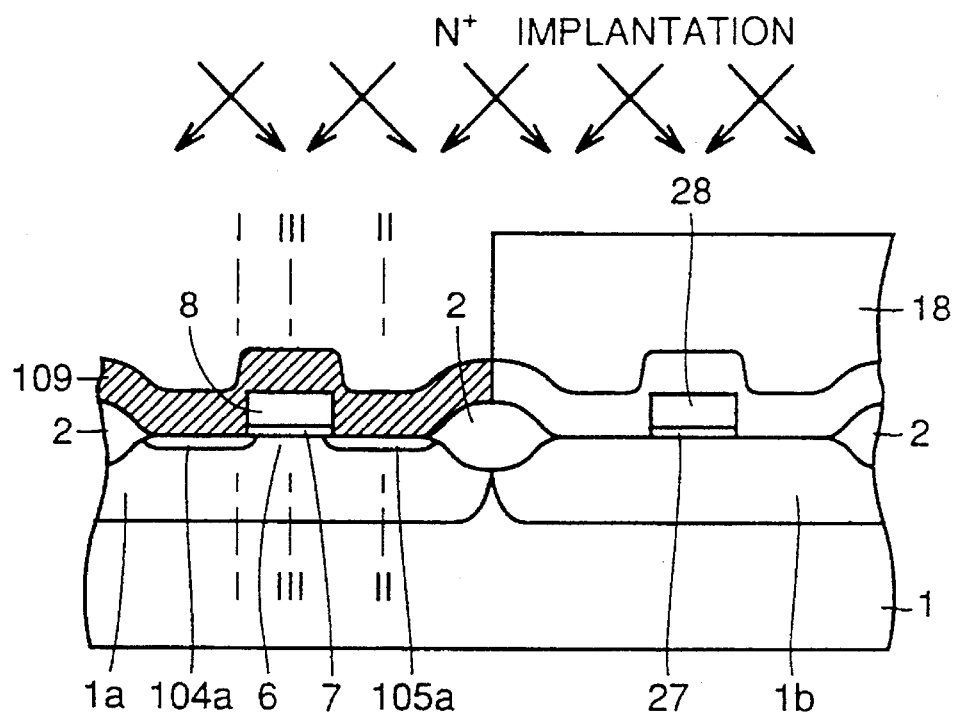
FIG. 61 is a sectional view for explaining the manufacturing process of a semiconductor device according to a tenth embodiment of the present invention.

Referring to FIG. 61, the tenth embodiment of the present invention will be described. The tenth embodiment is different from the ninth embodiment in a method of implanting nitrogen into first sidewall oxide film 9. Other than that, the tenth embodiment is similar to the ninth embodiment. More specifically, in the tenth embodiment, a rotational oblique ion implantation method is employed in implanting nitrogen into oxide film 109, as shown in FIG. 61. In a method of manufacturing a semiconductor device of the tenth embodiment, after the similar process to the manufacturing process of the ninth embodiment shown in FIGS. 53 to 56, rotational oblique ion implantation shown in FIG. 61 is carried out. In this ion implantation, nitrogen ions (N$^+$) are implanted into oxide film 109 through the surface thereof with a 45° rotational oblique ion implantation method under the conditions of 40 keV and $5.6 \times 10^{15}$ atoms/cm$^2$ so that the center of projection range is positioned approximately at the center in oxide film 109. The nitrogen concentration distributions in the I—I section, the II—II section, and the III—III section after the ion implantation of FIG. 61 are similar to those of the above described second embodiment. More specifically, with the rotational oblique ion implantation method of the tenth embodiment, the nitrogen concentration in the vicinity of the interface between oxide film 109 and the main surface of semiconductor substrate 1 in the I—I section can be made higher.

After the step shown in FIG. 61, the semiconductor device of the tenth embodiment is obtained with the similar process to that of the ninth embodiment shown in FIGS. 58 to 60. In the semiconductor device of the tenth embodiment structured as described above, the following effect can be obtained in addition to the effects of the above described ninth embodiment. More specifically, by using the rotational oblique ion implantation method, the nitrogen concentration in a portion of oxide film 109 close to the end portion of first gate insulating film 7 can be made higher, as described above. As a result, the concentration peak generated by segregation of nitrogen at the interface between first sidewall oxide film 9 and the main surface of semiconductor substrate 1 caused by subsequent heat treatment is also made higher than the case of the ninth embodiment, thereby further increasing the hot carrier resistance than the case of the ninth embodiment.

Figure 62:
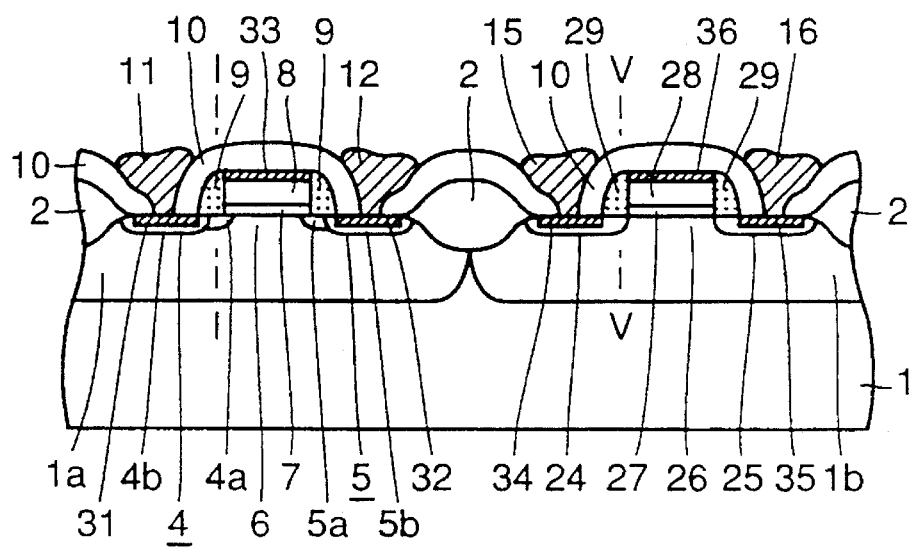
FIG. 62 is a sectional view showing a semiconductor device according to an eleventh embodiment of the present invention.

Referring to FIGS. 62 to 65, the eleventh embodiment of the present invention will be described. Referring to FIG. 62, in the eleventh embodiment, nitrogen is introduced also in second sidewall oxide film 29 configuring a P channel type MOS transistor, unlike the case of the ninth embodiment shown in FIG. 52. Further, in the eleventh embodiment, high melting point metal silicide layers 31 to 36 are formed in the surfaces of first source/drain regions 4 and 5, the surface of first gate electrode 8, the surfaces of second source/drain regions 24 and 25, and the surface of second gate electrode 28, respectively, unlike the case of the ninth embodiment. High melting point metal silicide layers 31 to 36 are formed of cobalt silicide ($CoSi_2$) or titanium silicide ($TiSi_2$).

Figure 63:
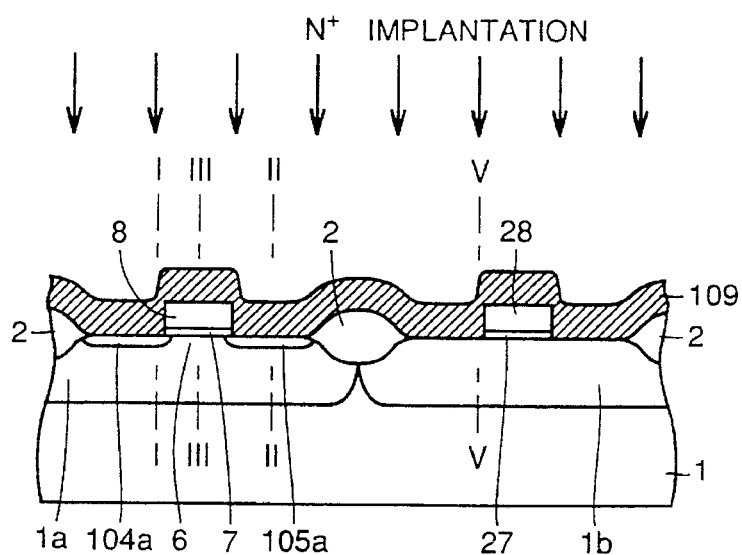
FIGS. 63–65 are sectional views for explaining the manufacturing process of the semiconductor device according to the eleventh embodiment shown in FIG. 62.
Figure 64:
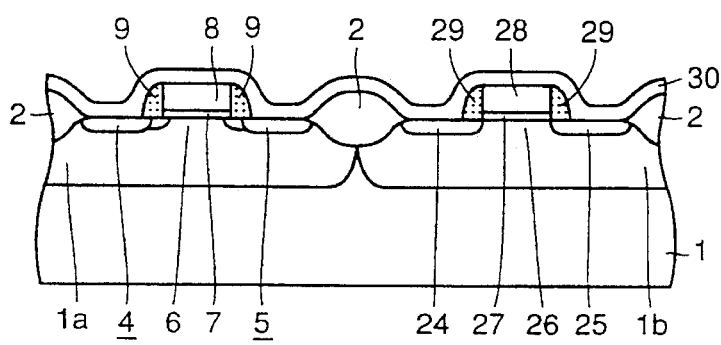
Figure 65:
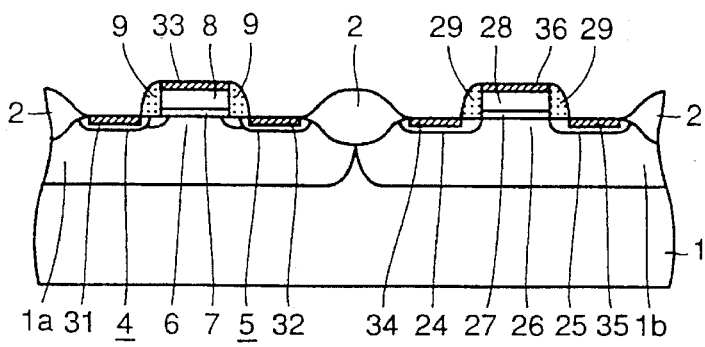

Referring to FIGS. 63 to 65, a method of manufacturing a semiconductor device of the eleventh embodiment will be described.

With the similar manufacturing process to that of the ninth embodiment shown in FIGS. 53 to 56, oxide film 109 is finally formed.

Then, as shown in FIG. 63, nitrogen ions ($N^+$) are implanted into oxide film 109 through the surface thereof under the conditions of 30 keV and $4\times10^{15}$ atoms/cm$^2$ so that the center of projection range is positioned approximately at the center in oxide film 109. The nitrogen concentration distributions in the I—I section, the II—II section, and the III—III section in oxide film 109 at the time are the same as those of the first embodiment (ninth embodiment) shown in FIGS. 8, 9, and 10. Further, the nitrogen concentration distribution in the V—V section is the same as that in the I—I section.

After that, second source/drain regions 24 and 25 are finally formed with the similar process to that of the ninth embodiment shown in FIGS. 58 to 60. Heat treatment conducted for forming first source/drain regions 4 and 5 and second source/drain regions 24 and 25 causes nitrogen in first sidewall oxide film 9 and second sidewall oxide film 29 to diffuse. As a result, nitrogen segregates at the interface between first sidewall oxide film 9 and the main surface of semiconductor substrate 1, and at the interface between second sidewall oxide film 29 and the main surface of semiconductor substrate 1, resulting in the nitrogen concentration distribution having peaks at these interfaces, as shown in FIG. 2.

Then, as shown in FIG. 64, a high melting point metal of cobalt or titanium is formed with a thickness of approximately 500 Å on the entire main surface of semiconductor substrate 1 with a sputtering method. Then, by carrying out lamp annealing under the condition of approximately 500° C., silicon in the surfaces of first source/drain regions 4 and 5, the upper surface of first gate electrode 8, and the surfaces of second source/drain regions 24 and 25 is reacted with the high melting point metal of cobalt or titanium. As a result, a high melting point silicide layer of cobalt silicide or titanium silicide is formed. After that, unreactive high melting point metal is selectively etched away. Then, lamp annealing is again carried out under the temperature condition of approximately 750° C. As a result, high melting point metal silicide layers 31 to 36 are reduced in resistance.

Then, as shown in FIG. 62, interlayer insulating film 10 is formed on the entire main surface of semiconductor substrate 1. Contact holes 10a to 10d are formed in interlayer insulating film 10. Interconnection layer 11 is formed so as to be electrically connected to high melting point metal silicide layer 31 through contact hole 10a, and interconnection layer 12 is formed so as to be electrically connected to high melting point metal silicide layer 32 through contact hole 10b. Further, interconnection layer 15 is formed so as to be electrically connected to high melting point metal silicide layer 34 through contact hole 10c, and interconnection layer 16 is formed so as to be electrically connected to high melting point metal silicide layer 35 through contact hole 10d. High melting point metal silicide layers 31, 32, 34, and 35 are formed for electrical connection between interconnection layers 11, 12, 15, and 16, and first and second source/drain regions 4, 5, 24, and 25 with low resistance. Further, high melting point metal silicide layers 31, 32, 34, and 35 function as barrier layers against diffusion from interconnection layers 11, 12, 15, and 16.

In the semiconductor device of the eleventh embodiment structured as described above, the following advantage is obtained in addition to the similar effects to those of the ninth embodiment.

More specifically, nitrogen is introduced in first sidewall oxide film 9 and second sidewall oxide film 29. Therefore, in reacting high melting point metal with silicon by lamp annealing to form high melting point metal silicide, growth of the metal silicide layers on first sidewall oxide film 9 and second sidewall oxide film 29 in the lateral direction can be suppressed. Accordingly, formation of the high melting point metal silicide layers on first sidewall oxide film 9 and second sidewall oxide film 29 can be suppressed. As a result, formation of such a high melting point metal silicide layer as short-circuits first source/drain regions 4 and 5 and first gate electrode 8 and such a high melting point metal silicide layer as short-circuits second source/drain regions 24 and 25 and second gate electrode 28 can be prevented.

Figure 66:
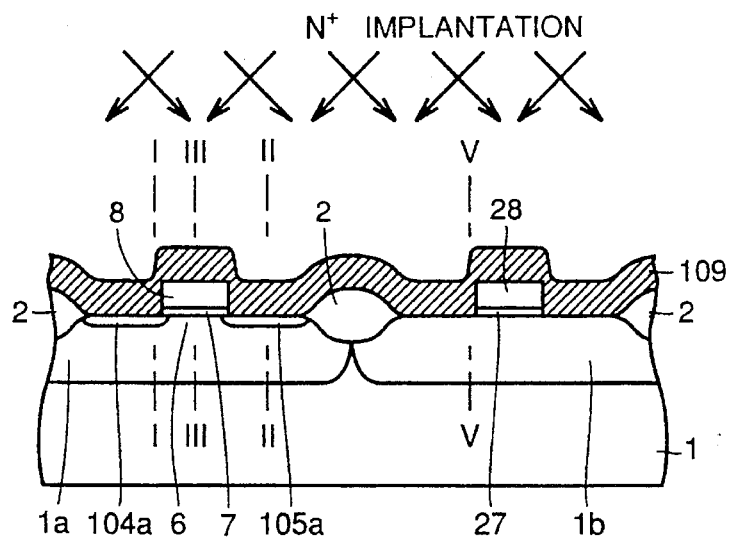
FIG. 66 is a sectional view for explaining the manufacturing process of a semiconductor device according to a twelfth embodiment of the present invention.
Figure 67:
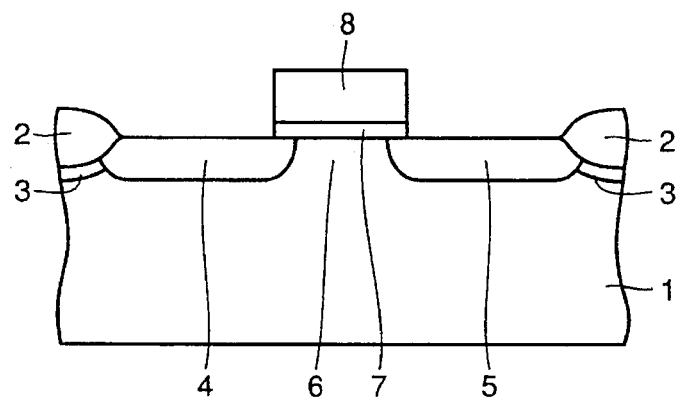
FIG. 67 is a sectional view showing a conventional N channel type MOS transistor.
Figure 68:
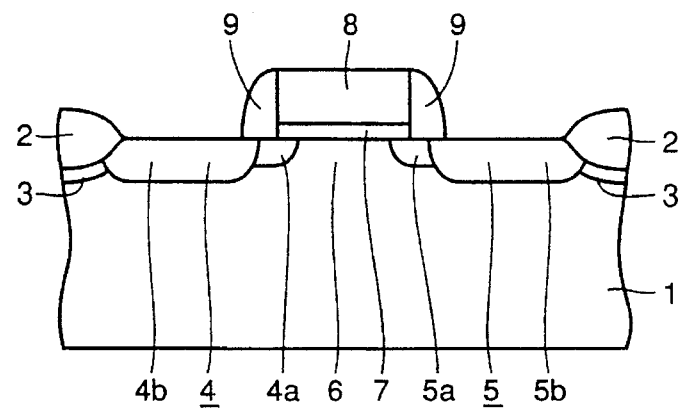
FIG. 68 is a sectional view showing another conventional N channel type MOS transistor.

Referring to FIG. 66, the twelfth embodiment of the present invention will now be described. The twelfth embodiment is different from the eleventh embodiment only in a method of implanting ions into oxide film 109. Other than that, the twelfth embodiment is similar to the eleventh embodiment. More specifically, in the twelfth embodiment, in the manufacturing process of the eleventh embodiment shown in FIG. 63, nitrogen ions are implanted with a rotational oblique ion implantation method, as shown in FIG. 66. More specifically, nitrogen ions ($N^+$) are implanted into oxide film 109 through the surface thereof with a 45° rotational oblique ion implantation method under the conditions of 40 keV and $5.6\times10^{15}$ atoms/cm$^2$ so that the center of projection range is positioned approximately at the center in oxide film 109. The nitrogen concentration distributions in the I—I section and the V—V section shown in FIG. 66 are the same as that of the second embodiment shown in FIG. 14. It should be noted that the nitrogen concentration distributions in the II—II section and the III—III section shown in FIG. 66 are the same as in the case of the eleventh embodiment. In the twelfth embodiment, the nitrogen concentration in the I—I section in the vicinity of the interface between polysilicon layer 14 and oxide film 109 can be made higher than that of the above described eleventh embodiment. Other than that, the similar process to the manufacturing process of the eleventh embodiment is used. With such a process, a semiconductor device of the twelfth embodiment is completed.

In the twelfth embodiment structured as described above, by using the rotational oblique ion implantation method as described above, the nitrogen concentration in a portion of oxide film 109 close to the end portion of first gate insulating film 7 can be made higher. Accordingly, the nitrogen concentration peak at the interface between first sidewall oxide film 9 and the main surface of semiconductor substrate 1 can be also made higher than that of the eleventh embodiment. As a result, the hot carrier resistance can be improved more than the case of the eleventh embodiment.

In addition, the nitrogen concentration in the portion of oxide film 109 close to the end portion of first gate insulating film 7, and the nitrogen concentration in a portion of oxide film 109 close to the end portion of second gate insulating film 27 can be made higher than the case of the eleventh embodiment. Therefore, the nitrogen concentration peaks at the interface between first sidewall oxide film 9 and the main surface of semiconductor substrate 1 and at the interface between second sidewall oxide film 29 and the main surface of semiconductor substrate 1 also become higher than those of the eleventh embodiment. As a result, in forming high melting point metal silicide layers, growth of the high melting point metal silicide layers in the lateral direction on the surfaces of first sidewall oxide film 9 and second sidewall oxide film 29 extending from first source/drain regions 4 and 5 and second source/drain regions 24 and 25 can be further suppressed.

Although the pair of source/drain regions 4 and 5 configuring an N channel type MOS transistor are formed by implantation of arsenic ions in the above described first to twelfth embodiments, these regions may be formed by implantation of phosphorus (P) ions. Further, low impurity concentration diffusion regions 104a and 105a, and high impurity concentration diffusion regions 104b and 105b may be formed by implantation of arsenic ions and implantation of phosphorus ions, respectively. Further, as a method of implanting these ions, either a perpendicular ion implantation method or a rotational oblique ion implantation method may be used.

Further, although the pair of second source/drain regions 24 and 25 configuring a P channel type MOS transistor are formed by implanting boron fluoride ($BF_2^+$) ions in the ninth to the eleventh embodiments, these regions may be formed by implanting boron (B) ions. Further, although the pair of second source/drain regions 24 and 25 are formed after formation of second sidewall oxide film 29, these regions 24 and 25 may be formed before formation of second sidewall oxide film 29.

Further, in the eleventh and twelfth embodiments, first sidewall oxide film 9 and second sidewall oxide film 29 having desired nitrogen concentration distributions are formed by conducting heat treatment after implantation of nitrogen ions into oxide film 109. However, the present invention is not limited thereto. Alternatively, as shown in the third embodiment, after formation of polysilicon layer 14 on oxide film 109, nitrogen ions may be implanted into polysilicon layer 14, and first sidewall oxide film 9 and second sidewall oxide film 29 having desired nitrogen concentration distributions may be formed by conducting heat treatment. In this case, the nitrogen concentration distribution peaks in the surfaces of first and second sidewall oxide films 9 and 29. Therefore, growth of high melting point metal silicide layers in the lateral direction onto the surfaces of first and second sidewall oxide films 9 and 29 can be further suppressed in formation of high melting point metal silicide layers.

In the eleventh and twelfth embodiments, in addition to introduction of nitrogen in first and second sidewall oxide films 9 and 29, arsenic ions, boron ions, and phosphorus ions may be further implanted. In this case, arsenic ions, boron ions, and phosphorus ions may be implanted before or after implantation of nitrogen ions into oxide film 109 for formation of first and second sidewall oxide films 9 and 29. As described above, by implanting not only nitrogen but also arsenic, boron, and phosphorus into first and second sidewall oxide films 9 and 29, growth of high melting point metal silicide layers in the lateral direction onto the surfaces of first and second sidewall oxide films 9 and 29 can be further suppressed in formation of high melting point metal silicide layers.

As described above, in one aspect of the present invention, by configuring a semiconductor device so that the nitrogen concentration distribution in the section of a sidewall oxide film in the direction perpendicular to the main surface of a semiconductor substrate peaks at the interface between the sidewall oxide film and the main surface of the semiconductor substrate, an interface state at the interface between the sidewall oxide film and the semiconductor substrate can be suppressed even if the semiconductor device is miniaturized. As a result, the probability at which generated hot carriers are trapped in the interface state can be decreased, resulting in improvement of the hot carrier resistance. More specifically, by hot carriers being caught in a gate insulating film, degradation of transistor characteristics in accordance with time such as change in the threshold voltage of an MOS transistor and reduction of drain current, that is, so-called hot carrier degradation can be prevented.

In a semiconductor device according to another aspect of the present invention, a sidewall includes an oxide film having a perpendicular portion in contact with the side surface of a gate electrode and the side surface of a gate insulating film and a bottom portion in contact with the main surface of a semiconductor substrate, and having an approximately L-letter shaped longitudinal section, and a polysilicon layer, in which nitrogen is introduced, formed in contact with the perpendicular portion and the bottom portion of the oxide film. Therefore, by nitrogen introduced in the sidewall, an interface state at the interface between the sidewall and the semiconductor substrate can be suppressed even if the semiconductor device is miniaturized. As a result, the probability at which generated hot carriers are trapped in the interface state is decreased, resulting in suppression of hot carrier degradation.

In a semiconductor device according to still another aspect of the present invention, by introducing nitrogen in a sidewall oxide film, as well as in a gate electrode, nitrogen introduced in the gate electrode can suppress diffusion of impurity introduced in the gate electrode for reducing resistance. Further, nitrogen introduced in the sidewall oxide film can suppress an interface state at the interface between the sidewall oxide film and a semiconductor substrate even when the device is miniaturized, resulting in suppression of hot carrier degradation.

In a semiconductor device according to a further aspect of the present invention, by introducing nitrogen in a sidewall oxide film of an N channel type MOS transistor and a sidewall oxide film of a P channel type MOS transistor, nitrogen introduced in the sidewall oxide film of the N channel type MOS transistor can suppress an interface state at the interface between the sidewall oxide film and a semiconductor substrate even when the device is miniaturized. Accordingly, the probability at which generated hot carriers are trapped in the interface state can be reduced, resulting in improvement of the hot carrier resistance in the N channel type MOS transistor. Further, nitrogen introduced in the sidewall oxide films of the N channel type MOS transistor and the P channel type MOS transistor can suppress, when a metal silicide layer is formed, growth of the metal silicide layer in the lateral direction towards the sidewall oxide films at the time of formation. As a result, it is possible to prevent short-circuiting between a gate electrode and source/drain regions.

In a method of manufacturing an MOS transistor according to a further aspect the present invention, the step of forming an oxide film on the surface of a gate electrode and on the exposed surface of a semiconductor substrate with a CVD method, the step of implanting nitrogen ions into the oxide film through the surface thereof, and the step of etching the oxide film into which nitrogen is implanted and forming a sidewall oxide film in contact with the side surface of the gate electrode, the side surface of a gate insulating film, and the main surface of the semiconductor substrate are carried out. As a result, nitrogen can be easily introduced in the sidewall oxide film so that the concentration distribution has a peak at the interface between the sidewall oxide film and the semiconductor substrate. Accordingly, an MOS transistor capable of suppressing hot carrier degradation can be obtained.

In a method of manufacturing an MOS transistor according to a further aspect of the present invention, the step of forming an oxide film on the surface of a gate electrode and the exposed surface of a semiconductor substrate with a CVD method, the step of forming a polysilicon layer on the surface of the oxide film, the step of implanting nitrogen ions into the polysilicon layer through the surface thereof, the step of diffusing nitrogen implanted into the polysilicon layer into the oxide film, and the step of removing the polysilicon layer, etching the oxide film into which nitrogen is implanted, and forming a sidewall oxide film in contact with the side surface of the gate electrode, the side surface of a gate insulating film, and the main surface of the semiconductor substrate are included. As a result, nitrogen can be easily introduced in the sidewall oxide film so that there is a concentration distribution peak at the interface between the sidewall oxide film and the semiconductor substrate. Accordingly, an MOS transistor improved in the hot carrier resistance can be formed easily.

In a method of manufacturing an MOS transistor according to a further aspect of the present invention, the step of forming an oxide film on the surface of a gate electrode and the exposed surface of a semiconductor substrate with a CVD method, the step of forming a polysilicon layer on the surface of the oxide film, the step of implanting nitrogen ions into the polysilicon layer through the surface thereof, and the step of etching the polysilicon layer into which nitrogen is implanted and the oxide film to form a sidewall having an approximately L-letter shaped oxide film and a polysilicon layer in which nitrogen is introduced in contact with a perpendicular portion and a bottom portion of the oxide film are included. As a result, nitrogen can be easily introduced in the sidewall so that there is a concentration peak at the interface between the sidewall and the semiconductor substrate. Accordingly, an MOS transistor capable of suppressing hot carrier degradation can be obtained.

In a method of manufacturing an MOS transistor according to a further aspect of the present invention, the step of forming an oxide film on the surface of a gate electrode and the exposed surface of a semiconductor substrate with a CVD method, the step of implanting nitrogen ions into an internal region of the oxide film, the gate electrode, and the main surface of the semiconductor substrate through the surface of the oxide film, and the step of etching the oxide film to form a sidewall oxide film in which nitrogen is introduced and in contact with the side surface of the gate electrode, the side surface of a gate insulating film, and the main surface of the semiconductor substrate are included. As a result, nitrogen can be easily introduced in the sidewall oxide film so that there is a concentration peak at the interface between the sidewall oxide film and the semiconductor substrate, and nitrogen can be also introduced in the gate electrode. Accordingly, diffusion of impurity introduced in the gate electrode for reducing resistance can be suppressed.

In a method of manufacturing an N channel type MOS transistor according to a further aspect of the present invention, the step of implanting N type impurities into the main surface of a semiconductor substrate with a gate electrode used as part of a mask to form low impurity concentration diffusion regions of a pair of source/drain regions, the step of forming an oxide film on the surface of the gate electrode and the low impurity concentration diffusion regions of the pair of source/drain regions with a CVD method, the step of implanting nitrogen ions into the oxide film through the surface thereof, the step of etching the oxide film into which nitrogen is implanted to form a sidewall oxide film in contact with the side surface of the gate electrode, the side surface of a gate insulating film, and the low impurity concentration diffusion regions of the pair of source/drain regions, and the step of implanting N type impurities into the main surface of the semiconductor substrate with the gate electrode and the sidewall oxide film used as part of a mask to form high impurity concentration diffusion regions of the pair of source/drain regions are included. As a result, nitrogen can be easily introduced in the sidewall oxide film so that there is a concentration peak at the interface between the sidewall oxide film and the semiconductor substrate. Accordingly, an MOS transistor capable of suppressing hot carrier degradation can be easily formed.

In a method of manufacturing an N channel type MOS transistor according to a further aspect of the present invention, the step of implanting N type impurities into the main surface of a semiconductor substrate with a gate electrode used as part of a mask to form low impurity concentration diffusion regions of a pair of source/drain regions, the step of forming an oxide film on the surface of the gate electrode and the low impurity concentration diffusion regions of the pair of source/drain regions with a CVD method, the step of forming a polysilicon layer on the surface of the oxide film, the step of implanting nitrogen ions into the polysilicon layer through the surface thereof, the step of diffusing nitrogen implanted into the polysilicon layer into the oxide film, the step of etching the oxide film into which nitrogen is implanted after removing the polysilicon layer to form a sidewall oxide film, and the step of implanting N type impurities into the main surface of the semiconductor substrate with the gate electrode and the sidewall oxide film used as part of a mask to form high impurity concentration diffusion regions are included. As a result, nitrogen can be easily introduced in the sidewall oxide film so that there is a concentration peak at the interface between the sidewall oxide film and the semiconductor substrate. Accordingly, an MOS transistor capable of suppressing hot carrier degradation can be obtained.

In a method of manufacturing an N channel type MOS transistor according to a further aspect of the present invention, the step of implanting N type impurities into the main surface of a semiconductor substrate with a gate electrode used as part of a mask to form low impurity concentration diffusion regions of a pair of source/drain regions, the step of forming an oxide film on the surface of the gate electrode and the low impurity concentration diffusion regions of the pair of source/drain regions with a CVD method, the step of forming a polysilicon layer on the surface of the oxide film, the step of implanting nitrogen ions into the polysilicon layer through the surface thereof, the step of etching the polysilicon layer into which nitrogen is implanted and the oxide film to form a sidewall including an approximately L-letter shaped oxide film and a polysilicon layer in which nitrogen is introduced and in contact with a perpendicular portion and a bottom portion of the oxide film, and the step of implanting N type impurities into the main surface of the semiconductor substrate with the gate electrode and the sidewall used as part of a mask to form high impurity concentration diffusion regions are included. As a result, nitrogen can be easily introduced in the sidewall so that there is a concentration peak at the interface between the sidewall and the semiconductor substrate.

In a method of manufacturing an N channel type MOS transistor according to a further aspect of the present invention, the step of implanting N type impurities into the main surface of a semiconductor substrate with a gate electrode used as part of a mask to form low impurity concentration diffusion regions, the step of forming an oxide film on the surface of the gate electrode and the low impurity concentration diffusion regions with a CVD method, the step of implanting nitrogen ions into at least an internal region of the oxide film in contact with the side surface of the gate electrode and the side surface of a gate insulating film, the gate electrode, and the low impurity concentration diffusion regions through the surface of the oxide film, the step of etching the oxide film to form a sidewall oxide film in which nitrogen is introduced and in contact with the side surface of the gate electrode, the side surface of the gate insulating film, and the low impurity concentration diffusion regions, and the step of implanting N type impurity ions into the main surface of the semiconductor substrate with the gate electrode and the sidewall oxide film used as part of a mask to form high impurity concentration diffusion regions are included. As a result, nitrogen can be easily introduced in the sidewall oxide film so that there is a concentration peak at the interface between the sidewall oxide film and the semiconductor substrate. Accordingly, diffusion of impurities introduced in the gate electrode for reducing resistance can be suppressed.

In a method of manufacturing a semiconductor device according to a further aspect of the present invention, the step of forming an oxide film on the surfaces of a first gate electrode of an N type MOS transistor and a second gate electrode of a P channel type MOS transistor and on the exposed surface of a semiconductor substrate with a CVD method, the step of covering the surface of the oxide film positioned on a P channel type MOS transistor forming region, and then implanting nitrogen ions through the surface of the oxide film positioned on an N channel type MOS transistor forming region, and the step of etching the oxide film positioned on the N channel type MOS transistor forming region into which nitrogen is implanted to form a sidewall oxide film of the N channel type MOS transistor in contact with the side surface of the first gate electrode, the side surface of a first gate insulating film, and the main face of the semiconductor substrate are included. As a result, nitrogen can be easily introduced in the sidewall oxide film so that there is a concentration peak at the interface between the sidewall oxide film and the semiconductor substrate. Accordingly, a semiconductor device having the N channel type MOS transistor capable of suppressing hot carrier degradation can be obtained.

In a method of manufacturing a semiconductor device according to a further aspect of the present invention, the step of forming an oxide film on the surface of a first gate electrode of an N channel type MOS transistor, the surface of a second gate electrode of a P channel type MOS transistor, and the exposed surface of a semiconductor substrate with a CVD method, the step of implanting nitrogen ions into the oxide film through the surface thereof, and the step of etching the oxide film into which nitrogen is implanted to form a first sidewall oxide film of the N channel type MOS transistor and a second sidewall oxide film of the P channel type MOS transistor are included. As a result, nitrogen can be easily introduced in the sidewall oxide film so that there is a concentration peak at the interface between the sidewall oxide film and the semiconductor substrate. Accordingly, a semiconductor device having the N channel type MOS transistor capable of suppressing hot carrier degradation can be manufactured.

In a method of manufacturing a semiconductor device according to a further aspect of the present invention, after forming an oxide film with a CVD method and implanting nitrogen ion into the oxide film positioned on an N channel type MOS transistor forming region, the oxide film into which nitrogen is implanted is etched to form a first sidewall oxide film of an N channel type MOS transistor and a second sidewall oxide film of a P channel type MOS transistor. As a result, nitrogen can be easily introduced in the first sidewall oxide film so that there is a concentration peak at the interface between the first sidewall oxide film of the N channel type MOS transistor and the semiconductor substrate. Accordingly, a semiconductor device having the N channel type MOS transistor capable of suppressing hot carrier degradation can be easily formed.

In a method of manufacturing a semiconductor device according to a further aspect of the present invention, after forming an oxide film with a CVD method and implanting nitrogen ions into the oxide film, the oxide film into which nitrogen is implanted is etched to form a first sidewall oxide film of an N channel type MOS transistor and a second sidewall oxide film of a P channel type MOS transistor. As a result, nitrogen can be easily introduced in the first and second sidewall oxide films so that there is a concentration peak at the interface between the first and second sidewall oxide films and the semiconductor substrate. Accordingly, a semiconductor device having the N channel type MOS transistor capable of suppressing hot carrier degradation can be obtained. In the above described method of manufacturing a semiconductor device, by including the step of forming a metal silicide layer in the surfaces of first and second gate electrodes and the surfaces of first and second source/drain regions, nitrogen introduced in the first sidewall oxide film can suppress growth of the metal silicide layer in the direction of the first sidewall oxide film at the time of formation of the metal silicide layer. As a result, a semiconductor device capable of preventing short-circuiting between the gate electrodes and the source/drain regions can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An MOS transistor, comprising:

a pair of source/drain regions formed on a main surface of a semiconductor substrate so as to sandwich a channel region;

a gate electrode formed on the main surface of said semiconductor substrate positioned between said pair of source/drain regions with a gate insulating film interposed therebetween; and a sidewall oxide film formed in contact with a side surface of said gate electrode, a side surface of said gate insulating film, and the main surface of said semiconductor substrate and having nitrogen introduced therein, so that a concentration distribution of said nitrogen in a section in the direction perpendicular to the main surface of said semiconductor substrate has a first concentration peak at an interface between said sidewall oxide film and the main surface of said semiconductor substrate, and a second concentration peak positioned closer to said sidewall oxide film than said first concentration peak positioned at the interface between said sidewall oxide film and the main surface of said semiconductor substrate.

2. The MOS transistor according to claim 1, wherein the concentration distribution of said nitrogen introduced in said sidewall oxide film in a section parallel to the main surface of said semiconductor substrate has a second peak at an interface between said sidewall oxide film and the side surface of said gate electrode.

3. An MOS transistor, comprising:

a pair of source/drain regions formed on a main surface of a semiconductor substrate so as to sandwich a channel region;

a gate electrode formed on the main surface of said semiconductor substrate positioned between said pair of source/drain regions with a gate insulating film interposed therebetween; and a sidewall having an oxide film having a perpendicular portion in contact with a side surface of said gate electrode and a side surface of said gate insulating film, and a bottom portion in contact with the main surface of said semiconductor substrate, with its longitudinal section approximately L-letter shaped, and a polysilicon film constituting a sidewall formed in contact with the perpendicular portion and the bottom portion of said oxide film and having nitrogen introduced therein, so that a first nitrogen concentration peak is positioned at an interface between the polysilicon film and said oxide film and a second nitrogen concentration peak is positioned closer to an upper portion of the polysilicon film than the first nitrogen concentration peak.

4. The MOS transistor according to claim 3, wherein nitrogen is also introduced in the oxide film of said sidewall.

5. An MOS transistor, comprising:

a pair of source/drain regions formed on a main surface of a semiconductor substrate so as to sandwich a channel region and having nitrogen in addition to impurities of a first conductivity type introduced therein;

a gate electrode formed on the main surface of said semiconductor substrate positioned between said pair of source/drain regions with a gate insulating film interposed therebetween and having nitrogen introduced therein; and a sidewall oxide film formed in contact with a side surface of said gate electrode, a side surface of said gate insulating film, and the main surface of said semiconductor substrate and having nitrogen introduced therein.

6. The MOS transistor according to claim 5, wherein a concentration distribution of said nitrogen introduced in the oxide film of said sidewall in a section perpendicular to the main surface of said semiconductor substrate has a peak at an interface between said sidewall oxide film and the main surface of said semiconductor substrate.

7. The MOS transistor according to claim 1, wherein said pair source/drain regions are formed of low impurity concentration diffusion regions in contact with said channel region at their end portions, and high impurity concentration diffusion regions positioned outside of said channel region and structured integrally with said low impurity concentration diffusion regions.

8. A semiconductor device including an N channel type MOS transistor and a P channel type MOS transistor, wherein said N channel type MOS transistor includes a pair of first N type source/drain regions formed on a main surface of a semiconductor substrate so as to sandwich a first channel region, a first gate electrode formed on the main surface of said semiconductor substrate positioned between said pair of first source/drain regions with a first gate insulating film interposed therebetween, and a first sidewall oxide film formed in contact with a side surface of said first gate electrode, a side surface of said first gate insulating film, and the main surface of said semiconductor substrate and having nitrogen introduced therein, and said P channel type MOS transistor includes a pair of second P type source/drain regions formed on the main surface of said semiconductor substrate so as to sandwich a second channel region, a second gate electrode formed on the main surface of said semiconductor substrate positioned between said pair of second source/drain regions with a second gate insulating film interposed therebetween, and a second sidewall oxide film formed in contact with a side surface of said second gate electrode, a side surface of said second gate insulating film, and the main surface of said semiconductor substrate and having nitrogen introduced therein.

9. The semiconductor device according to claim 8, wherein a concentration distribution of said nitrogen introduced in said first and second sidewall oxide films in a section perpendicular to the main surface of said semiconductor substrate has a peak at an interface between the main surface of said semiconductor substrate and said first and second sidewall oxide films.

10. The semiconductor device according to claim 8, wherein metal silicide layers are formed on said first gate electrode, said pair of first source/drain region, said second gate electrode, and said pair of second source/drain regions, respectively.

11. The semiconductor device according to claim 8, wherein said pair of first source/drain regions of the N channel type MOS transistor respectively includes low impurity concentration diffusion regions in contact with said first channel region at their end portions, and high impurity concentration diffusion regions positioned outside of said first channel region and structured integrally with said low impurity concentration diffusion regions.

12. The MOS transistor according to claim 1, wherein the first peak nitrogen concentration ranges from $1\times10^{19}$ atoms/cm$^3$~$1\times10^{21}$ atoms/cm$^3$.

13. The MOS transistor according to claim 6, wherein the peak nitrogen concentration ranges from $1\times10^{19}$ atoms/cm$^3$~$1\times10^{21}$ atoms/cm$^3$.

14. The semiconductor device according to claim 9, wherein the peak nitrogen concentration ranges from $1\times10^{19}$ atoms/cm$^3$~$1\times10^{21}$ atoms/cm$^3$.

* * * * *